(12) United States Patent
Yoon et al.

(10) Patent No.: US 12,256,636 B2
(45) Date of Patent: Mar. 18, 2025

(54) LIGHT-EMITTING DEVICE AND ELECTRONIC APPARATUS INCLUDING SAME

(71) Applicant: Samsung Display Co., Ltd., Gyeonggi-do (KR)

(72) Inventors: Heechang Yoon, Yongin-si (KR); Dongchan Kim, Yongin-si (KR); Yoonseok Ka, Yongin-si (KR); Jiyoung Moon, Yongin-si (KR); Haemyeong Lee, Yongin-si (KR); Yoonhyeung Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 399 days.

(21) Appl. No.: 17/544,866

(22) Filed: Dec. 7, 2021

(65) Prior Publication Data

US 2022/0344595 A1 Oct. 27, 2022

(30) Foreign Application Priority Data

Apr. 8, 2021 (KR) .................. 10-2021-0046096

(51) Int. Cl.
*H10K 85/60* (2023.01)
*H10K 10/46* (2023.01)
(Continued)

(52) U.S. Cl.
CPC ......... *H10K 85/6572* (2023.02); *H10K 10/46* (2023.02); *H10K 30/81* (2023.02); *H10K 85/622* (2023.02); *H10K 85/626* (2023.02); *H10K 85/633* (2023.02); *H10K 85/636* (2023.02); *H10K 85/654* (2023.02);
(Continued)

(58) Field of Classification Search
CPC ....... H10K 85/50; H10K 50/11; H10K 50/805
See application file for complete search history.

(56) References Cited

U.S. PATENT DOCUMENTS

| 7,838,327 B2 | 11/2010 | Lee et al. |
| 9,416,019 B2* | 8/2016 | Akay ................... C01C 1/0405 |
| 10,333,092 B2 | 6/2019 | Kim |

(Continued)

FOREIGN PATENT DOCUMENTS

| JP | 6099036 | 3/2017 |
| KR | 10-0813851 B1 | 3/2008 |

(Continued)

OTHER PUBLICATIONS

Li, Ying, et al. "Highly Stable and Spectrum-Selective Ultraviolet Photodetectors Based on Lead-Free Copper-Based Perovskites." Materials Horizons, vol. 7, No. 2, 2020, pp. 530-540.

(Continued)

*Primary Examiner* — Moazzam Hossain
(74) *Attorney, Agent, or Firm* — Womble Bond Dickinson (US) LLP

(57) ABSTRACT

A light-emitting device includes: a first electrode; a second electrode facing the first electrode; and an interlayer between the first electrode and the second electrode and including a first layer, wherein the first electrode has a work function value of about −5.5 eV to about −6.1 eV, and the interlayer includes a second layer doped with a non-lead-based perovskite compound.

19 Claims, 2 Drawing Sheets

(51) Int. Cl.
*H10K 30/80* (2023.01)
*H10K 30/81* (2023.01)
*H10K 50/155* (2023.01)
*H10K 50/17* (2023.01)
*H10K 50/81* (2023.01)
*H10K 50/82* (2023.01)

(52) U.S. Cl.
CPC ......... *H10K 30/865* (2023.02); *H10K 50/155* (2023.02); *H10K 50/17* (2023.02); *H10K 50/81* (2023.02); *H10K 50/82* (2023.02)

(56) References Cited

U.S. PATENT DOCUMENTS

| | | |
|---|---|---|
| 10,784,449 B2 | 9/2020 | Kim et al. |
| 2008/0246050 A1* | 10/2008 | Lee ............ H10K 50/828 438/45 |
| 2011/0024726 A1 | 2/2011 | Lee et al. |
| 2014/0332078 A1* | 11/2014 | Guo ............ H10K 85/50 438/94 |
| 2016/0190501 A1 | 6/2016 | Kim et al. |
| 2017/0077433 A1* | 3/2017 | Gotanda ............ H10K 71/00 |
| 2017/0222162 A1 | 8/2017 | Lee et al. |
| 2021/0313120 A1* | 10/2021 | Pazniak ............ H10K 71/12 |
| 2021/0320272 A1* | 10/2021 | Yu ............ H10K 50/156 |
| 2022/0194969 A1 | 6/2022 | Lee et al. |
| 2023/0225140 A1 | 7/2023 | Im et al. |
| 2023/0276700 A1* | 8/2023 | Kawano ............ H10K 50/00 257/40 |

FOREIGN PATENT DOCUMENTS

| | | |
|---|---|---|
| KR | 20170000053 | 1/2017 |
| KR | 10-2017-0090216 A | 8/2017 |
| KR | 20170116630 | 10/2017 |
| KR | 10-2020-0074897 | 6/2020 |
| KR | 10-2021-0017495 A | 2/2021 |

OTHER PUBLICATIONS

Jun, Taehwan, et al. "Lead-Free Highly Efficient Blue-Emitting CS3cu2i5 with 0D Electronic Structure." Advanced Materials, vol. 30, No. 43, 2018, p. 1804547.

Irfan, Irfan, et al. "Interplay of Cleaning and De-Doping in Oxygen Plasma Treated High Work Function Indium Tin Oxide (Ito)." Organic Electronics, vol. 13, No. 10, 2012, pp. 2028-2034.

Zhang, Zhi-Xiang, et al. "Sensitive Deep Ultraviolet Photodetector and Image Sensor Composed of Inorganic Lead-Free CS3CU2I5 Perovskite with Wide Bandgap." The Journal of Physical Chemistry Letters, vol. 10, No. 18, 2019, pp. 5343-5350.

Meng, Fanyuan, et al. "Combined Optimization of Emission Layer Morphology and Hole-Transport Layer for Enhanced Performance of Perovskite Light-Emitting Diodes." Journal of Materials Chemistry C, vol. 5, No. 25, 2017, pp. 6169-6175.

Liu, Nian, et al. "Light-Emitting Diodes Based on All-Inorganic Copper Halide Perovskite with Self-Trapped Excitons." Journal of Semiconductors, vol. 41, No. 5, 2020, p. 052204.

* cited by examiner

LIGHT-EMITTING DEVICE AND ELECTRONIC APPARATUS INCLUDING SAME

CROSS-REFERENCE TO RELATED APPLICATION

This application claims priority from and the benefit of Korean Patent Application No. 10-2021-0046096, filed on Apr. 8, 2021, which is hereby incorporated by reference for all purposes as if fully set forth herein.

BACKGROUND

Field

Embodiments of the invention relate generally to display devices, and more particularly, to a light-emitting device and an electronic apparatus including the same.

Discussion of the Background

Light-emitting devices are self-emissive devices that, as compared with devices of the related art, have wide viewing angles, high contrast ratios, short response times, and excellent characteristics in terms of luminance, driving voltage, and response speed.

In a light-emitting device, a first electrode is located on a substrate, and a hole transport region, an emission layer, an electron transport region, and a second electrode are sequentially formed on the first electrode. Holes provided from the first electrode move toward the emission layer through the hole transport region, and electrons provided from the second electrode move toward the emission layer through the electron transport region. Carriers, such as holes and electrons, recombine in the emission layer to produce light.

The above information disclosed in this Background section is only for understanding of the background of the inventive concepts, and, therefore, it may contain information that does not constitute prior art.

SUMMARY

Light-emitting devices and electronic apparatuses constructed according to the principles and illustrative implementations of the invention include a layer doped with a non-lead-based perovskite compound, which provides for improved efficiency and lifespan.

Additional features of the inventive concepts will be set forth in the description which follows, and in part will be apparent from the description, or may be learned by practice of the inventive concepts.

According to one aspect of the invention, a light-emitting device includes: a first electrode; a second electrode facing the first electrode; and an interlayer between the first electrode and the second electrode and including a first layer, wherein the first electrode has a work function value of about −5.5 eV to about −6.1 eV, and the interlayer includes a second layer doped with a non-lead-based perovskite compound.

The first electrode may include an anode, the second electrode may include a cathode, and the light-emitting device may further include a hole transport region between the first electrode and the first layer may include an emission layer and may include a hole injection layer, a hole transport layer, an electron blocking layer, or any combination thereof.

The first electrode may include an anode, the second electrode may include a cathode, and the light-emitting device may further include an electron transport region between the second electrode and the first layer may include an emission layer and may include a hole blocking layer, an electron transport layer, an electron injection layer, or any combination thereof.

The energy level of a valence band of the non-lead-based perovskite compound may be about −5.5 eV to about −6.3 eV.

The permittivity of the non-lead-based perovskite compound may be about 30 F/m or more.

The hole transport region may include the second layer doped with the non-lead-based perovskite compound.

The at least one of the hole injection layer and hole transport layer may include the second layer doped with the non-lead-based perovskite compound.

The first electrode may include an indium tin oxide, an indium zinc oxide, a tin oxide, a zinc oxide, or any combination thereof.

The non-lead-based perovskite compound may of Formula 1: AaZ, wherein in Formula 1, A is a cation of an alkali metal, Z is an anion, and a is an integer of 1, 2, or 3.

In Formula 1, the variable a may be 3 and Z may be $B_2X_5^{-3}$, a may be 2 and Z may be $BX_3^{-2}$, or a may be 1 and Z may be $B_2X_3^{-1}$, wherein A may be the cation of the alkali metal, B may be Cu, Ag, or any combination thereof, and X may be F, Cl, Br, I, or any combination thereof.

In Formula 1, the variable a may be 3 and Z may be $BX_5^{-3}$, a may be 2 and Z may be $BX_4^{-2}$, or a may be 1 and Z may be $B_2X_5^{-1}$, wherein A may be the cation of the alkali metal, B may be Mn, Tl, Zn, Ni, Ce, Pr, Nd, Pm, Sm, Eu, Gd, Tb, Dy, Ho, Er, Tm, Yb, Lu, or any combination thereof, and X may be F, Cl, Br, I, or any combination thereof.

In Formula 1, the a may be 3 and Z may be $BX_6^{-3}$, or a may be 2 and Z may be $BX_5^{-2}$, wherein A may be the cation of the alkali metal, B may be In, Sb, Bi, Ce, Pr, Nd, Pm, Sm, Eu, Gd, Tb, Dy, Ho, Er, Tm, Yb, Lu, or any combination thereof, and X may be F, Cl, Br, I, or any combination thereof.

The alkali metal may be Li, Na, K, Rb, Cs, Fr, or any combination thereof.

The first electrode may include an anode, the second electrode may include a cathode, the interlayer may include a hole injection layer and a hole transport layer, the hole injection layer may include the second layer doped with the non-lead-based perovskite compound, and the hole injection layer and the hole transport layer may include a same compound.

The second layer doped with the non-lead-based perovskite compound may have a thickness of about 1 Å to about 10,000 Å.

The second layer doped with the non-lead-based perovskite compound, the non-lead-based perovskite compound may have a doping concentration of about 1 wt % to about 99 wt %.

The electron transport region may include a metal-containing material.

An electronic apparatus may include the light-emitting device, as described above.

The electronic apparatus may further include a thin-film transistor, wherein the thin-film transistor may include a source electrode and a drain electrode, and the first electrode of the light-emitting device may be electrically connected to at least one of the source electrode and the drain electrode of the thin-film transistor.

The electronic apparatus may further include a color filter, a color conversion layer, a touch screen layer, a polarizing layer, or any combination thereof.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
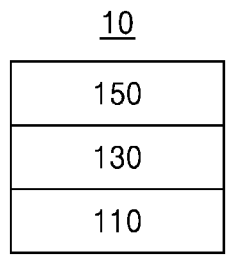
FIG. 1 is a schematic cross-sectional view of an embodiment of a light-emitting device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements, and duplicative explanations are omitted to avoid redundancy.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

According to one aspect of the invention, one or more embodiments of a light-emitting device includes: a first electrode; a second electrode facing the first electrode; and an interlayer located between the first electrode and the second electrode and including an emission layer, wherein the first electrode may have a work function value of about −5.5 eV to about −6.1 eV, and the interlayer includes a layer doped with a non-lead-based perovskite compound. In an embodiment, the first electrode may be an anode, the second electrode may be a cathode, and a hole transport region located between the first electrode and the emission layer and including a hole injection layer, a hole transport layer, and an electron blocking layer may be further included.

In an embodiment, the first electrode may be an anode, the second electrode may be a cathode, and an electron transport region located between the second electrode and the first layer in the form of an emission layer and include a hole blocking layer, an electron transport layer, an electron injection layer, or any combination thereof may be further included. In an embodiment, an energy level of a valence band of the non-lead-based perovskite compound may be about −5.5 eV to about −6.3 eV. As the energy level of the valence band of the non-lead-based perovskite compound is within the above range, charge may be smoothly introduced from the first electrode, which has a work function value of about −5.5 eV to about −6.1 eV. For example, the first electrode may be an anode. For example, the charge may be a hole.

In an embodiment, the permittivity of the non-lead-based perovskite compound may be about 30 farad per meter (F/m) or more. For example, the permittivity of the non-lead-based perovskite compound may be from about 30 F/m to about 40 F/m. The non-lead-based perovskite compound having high permittivity may have ferroelectricity. Therefore, band-bending may occur in the layer doped with the non-lead-based perovskite compound and the surrounding layers under an electric field. As a result, a sufficiently thin energy barrier may be formed between layers and charge tunneling may be increased, thereby allowing effective charge transfer. This contributes to the improvement in stability and efficiency of a device. The non-lead-based perovskite compound may be relatively cheaper than organic materials of the related art.

In an embodiment, the hole transport region may include a layer optionally in the form of a second layer doped with the non-lead-based perovskite compound. For example, the hole injection layer and/or hole transport layer may include the layer doped with the non-lead-based perovskite compound. For example, the layer doped with the non-lead-based perovskite compound may be a single layer or may be multi-layered with two or more layers.

For example, the first electrode and the layer doped with the non-lead-based perovskite compound may physically contact each other. Because the energy level of the valence band of the non-lead-based perovskite compound is about −5.5 eV to about −6.3 eV, and the work function value of the first electrode is about −5.5 eV to about −6.1 eV, a low energy barrier is formed and charge accumulation occurs less, and thus, deterioration in an interface may be minimized. In addition, because the non-lead-based perovskite compound is relatively more resistant to oxygen and moisture than organic materials of the related art, atmospheric storage stability is excellent and heat deposition is possible.

In an embodiment, the first electrode may include indium tin oxide (ITO), indium zinc oxide (IZO), tin oxide (SnO$_2$), zinc oxide (ZnO), or any combination thereof. For example, the first electrode may be indium tin oxide (ITO), and the non-lead-based perovskite compound may have a permittivity of about 30 F/m to about 40 F/m.

In an embodiment, the non-lead-based perovskite compound may be represented by Formula 1:

$$A_aZ \qquad \text{Formula 1}$$

wherein, in Formula 1, A may be a cation of an alkali metal, Z may be an anion, and a may be an integer of 1, 2, or 3. Because the non-lead-based perovskite compound is neutral as a whole, the sum of the charge of the cation and the charge of the anion is 0. In an embodiment, a may be 3 and Z may be $B_2X_5^{-3}$; a may be 2, and Z may be $BX_3^{-2}$; or a may be 1, and Z may be $B_2X_3^{-1}$, and A is as described above.

The group B may be Cu, Ag, or any combination thereof, and X may be F, Cl, Br, I, or any combination thereof. In an embodiment, a may be 3 and Z may be $BX_5^{-3}$; a may be 2 and Z may be $BX_4^{-2}$; or a may be 1 and Z may be $B_2X_5^{-1}$. The variable B may be Mn, Tl, Zn, Ni, Ce, Pr, Nd, Pm, Sm, Eu, Gd, Tb, Dy, Ho, Er, Tm, Yb, Lu, or any combination thereof, and X may be F, Cl, Br, I, or any combination thereof.

In an embodiment, a may be 3 and Z may be $BX_6^{-3}$; or a may be 2 and Z may be $BX_5^{-2}$, and A is as described above. The variable B may be In, Sb, Bi, Ce, Pr, Nd, Pm, Sm, Eu, Gd, Tb, Dy, Ho, Er, Tm, Yb, Lu, or any combination thereof, and X may be F, Cl, Br, I, or any combination thereof.

In an embodiment, the alkali metal may be Li, Na, K, Rb, Cs, Fr, or any combination thereof. In an embodiment, the first electrode may be an anode, the second electrode may be a cathode, the interlayer may include a hole injection layer and a hole transport layer, the hole injection layer may include the layer doped with the non-lead-based perovskite compound, and the hole injection layer and the hole transport layer may include a same compound.

When the same compound is Y, for example, the light-emitting device according to an embodiment may include a first electrode/hole injection layer (Y+non-lead-based perovskite compound doping)/hole transport layer (Y) structure. In an embodiment, the thickness of the layer doped with the non-lead-based perovskite compound may be about 1 angstrom (Å) to about 10,000 Å. For example, the thickness of the layer doped with the non-lead-based perovskite compound may be about 100 Å to about 700 Å. For example, the thickness of the layer doped with the non-lead-based perovskite compound may be about 100 Å to about 400 Å. When the thickness of the layer doped with the non-lead-based perovskite compound is within the above range, the injection performance of the charge may be optimized.

In an embodiment, in the layer doped with the non-lead-based perovskite compound, a doping concentration of the non-lead-based perovskite compound may be about 1 weight percent (wt %) to about 99 wt %. For example, the doping concentration may be about 1 wt % to about 40 wt %. For example, the doping concentration may be about 1 wt % to about 10 wt %. When the doping concentration is within the above range, the injection performance of the charge may be optimized.

The non-lead-based perovskite compound may be manufactured by using LiF, NaF, KF, RbF, CsF, BeF$_2$, MgF$_2$, CaF$_2$, SrF$_2$, BaF$_2$, YbF$_2$, YbF$_3$, SmF$_2$, SmF$_3$, EuF$_2$, EuF$_3$, TmF$_2$, TmF$_3$, CuF, TlF, AgF, CdF$_2$, HgF$_2$, SnF$_2$, BiF$_3$, ZnF$_2$, MnF$_2$, FeF$_2$, GeF$_2$, CoF$_2$, NiF$_2$, AlF$_3$, ThF$_4$, UF$_3$, LiCl, NaCl, KCl, RbCl, CsCl, BeCl$_2$, MgCl$_2$, CaCl$_2$, SrCl$_2$, BaCl$_2$, YbCl$_2$, YbCl$_3$, SmCl$_2$, SmCl$_3$, EuCl$_2$, EuCl$_3$, TmCl$_2$, TmCl$_3$, CuCl, TlCl, AgCl, CdCl$_2$, HgCl$_2$, SnCl$_2$, BiCl$_3$, ZnCl$_2$, MnCl$_2$, FeCl$_2$, GeCl$_2$, CoCl$_2$, NiCl$_2$, AlCl$_3$, ThCl$_4$, UCl$_3$, LiBr, NaBr, KBr, RbBr, CsBr, BeBr$_2$, MgBr$_2$, CaBr$_2$, SrBr$_2$, BaBr$_2$, YbBr$_2$, YbBr$_3$, SmBr$_2$, SmBr$_3$, EuBr$_2$, EuBr$_3$, TmBr$_2$, TmBr$_3$, CuBr, TlBr, AgBr, CdBr$_2$, HgBr$_2$, SnBr$_2$, BiBr$_3$, ZnBr$_2$, MnBr$_2$, FeBr$_2$, GeBr$_2$, CoBr$_2$, NiBr$_2$, AlBr$_3$, ThBr$_4$, UBr$_3$, LiI, NaI, KI, RbI, CsI, BeI$_2$, MgI$_2$, CaI$_2$, SrI$_2$, BaI$_2$, YbI$_2$, YbI$_3$, SmI$_2$, SmI$_3$, EuI$_2$, EuI$_3$, TmI$_2$, TmI$_3$, CuI, TlI, AgI, CdI$_2$, HgI$_2$, SnI$_2$, BiI$_3$, ZnI$_2$, MnI$_2$, FeI$_2$, GeI$_2$, CoI$_2$, NiI$_2$, AlI$_3$, ThI$_4$, UI$_3$, or any combination thereof. As methods of manufacturing the non-lead-based perovskite compound are known in the art, a detailed explanation thereof will be omitted herein.

According to another aspect of the invention an electronic apparatus may include the light-emitting device. In an embodiment, the electronic apparatus may further include a thin-film transistor, the thin-film transistor may include a source electrode and a drain electrode, and the first electrode of the light-emitting device may be electrically connected to at least one of the source and drain electrodes of the thin-film transistor. In an embodiment, the electronic apparatus may further include a color filter, a color conversion layer, a touch screen layer, a polarizing layer, or any combination thereof.

Description of FIG. 1

FIG. 1 is a schematic cross-sectional view of an embodiment of a light-emitting device constructed according to the principles of the invention.

Particularly, FIG. 1 is a schematic cross-sectional view of a light-emitting device 10 according to an embodiment. The light-emitting device 10 may include a first electrode 110, an interlayer 130, and a second electrode 150. Hereinafter, the structure of the light-emitting device 10 according to an embodiment and an illustrative method of manufacturing the light-emitting device 10 will be described in connection with FIG. 1.

First Electrode 110

In FIG. 1, a substrate may be additionally located under the first electrode 110 or above the second electrode 150. As the substrate, a glass substrate or a plastic substrate may be used. In one or more embodiments, the substrate may be a flexible substrate, and may include plastics with excellent heat resistance and durability, such as a polyimide, a polyethylene terephthalate (PET), a polycarbonate, a polyethylene naphthalate, a polyarylate (PAR), a polyetherimide, or any combination thereof. The first electrode 110 may be formed by, for example, depositing or sputtering a material for forming the first electrode 110 on the substrate. When the first electrode 110 is an anode, the material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, the material for forming the first electrode 110 may include an indium tin oxide (ITO), an indium zinc oxide (IZO), a tin oxide (SnO$_2$), a zinc oxide (ZnO), or any combinations thereof. The first electrode 110 may have a single-layered structure consisting of a single layer or a multi-layered structure including a plurality of layers. For example, the first electrode 110 may have a three-layered structure of an ITO/Ag/ITO.

Interlayer 130

The interlayer 130 may be located on the first electrode 110. The interlayer 130 may include an emission layer. The interlayer 130 may further include a hole transport region placed between the first electrode 110 and the emission layer and an electron transport region placed between the emission layer and the second electrode 150. The interlayer 130 may further include, in addition to various organic materials, metal-containing compounds such as organometallic compounds, inorganic materials such as quantum dots, and the like. In one or more embodiments, the interlayer 130 may include i) two or more emission layers sequentially stacked between the first electrode 110 and the second electrode 150 and ii) a charge generation layer located between the two or more emission layers. When the interlayer 130 includes the emission layer and the charge generation layer as described above, the light-emitting device 10 may be a tandem light-emitting device.

Hole Transport Region in Interlayer 130

The hole transport region may have: i) a single-layered structure consisting of a single layer consisting of a single material, ii) a single-layered structure consisting of a single layer consisting of a plurality of different materials, or iii) a multi-layered structure including a plurality of layers including different materials.

The hole transport region may include a hole injection layer, a hole transport layer, an emission auxiliary layer, an electron blocking layer, or any combination thereof. For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 110.

The hole transport region may include a compound represented by Formula 201, a compound represented by Formula 202, or any combination thereof:

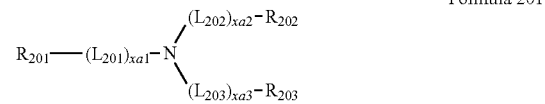

Formula 201

Formula 202

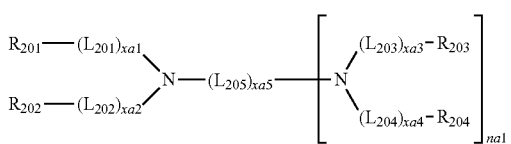

wherein, in Formulae 201 and 202,
$L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
$L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$,
xa1 to xa4 may each independently be an integer from 0 to 5,
xa5 may be an integer from 1 to 10,
$R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
$R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (for example, Compound HT16),
$R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and
na1 may be an integer from 1 to 4.
In one or more embodiments, each of Formulae 201 and 202 may include at least one of groups represented by Formulae CY201 to CY217.

CY201

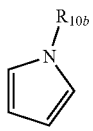

CY202

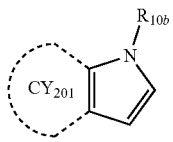

CY203

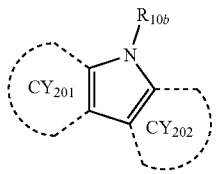

CY204

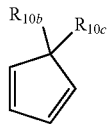

CY205

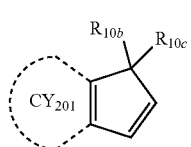

CY206

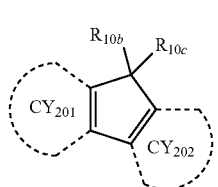

CY207

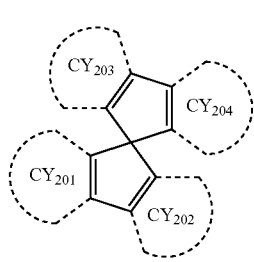

CY208

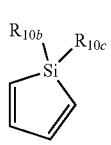

CY209

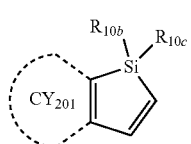

CY210

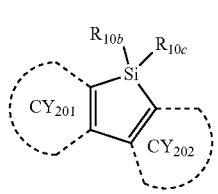

CY211

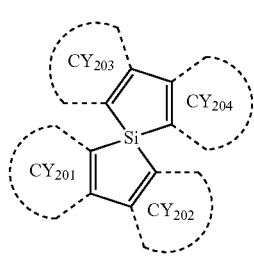

CY212

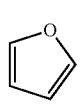

-continued

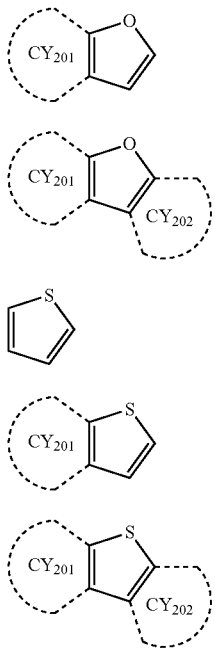

CY213

CY214

CY215

CY216

CY217

The variables $R_{10b}$ and $R_{10c}$ in Formulae CY201 to CY217 are the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In one or more embodiments, ring $CY_{201}$ to ring $CY_{204}$ in Formulae CY201 to CY217 may each independently be a benzene group, a naphthalene group, a phenanthrene group, or an anthracene group. In one or more embodiments, each of Formulae 201 and 202 may include at least one of groups represented by Formulae CY201 to CY203. In one or more embodiments, Formula 201 may include at least one of groups represented by Formulae CY201 to CY203 and at least one of groups represented by Formulae CY204 to CY217.

In one or more embodiments, xa1 in Formula 201 may be 1, $R_{201}$ may be a group represented by one of Formulae CY201 to CY203, xa2 may be 0, and $R_{202}$ may be a group represented by one of Formulae CY204 to CY207. In one or more embodiments, each of Formulae 201 and 202 may not include a group represented by one of Formulae CY201 to CY203. In one or more embodiments, each of Formulae 201 and 202 may not include a group represented by one of Formulae CY201 to CY203, and may include at least one of groups represented by Formulae CY204 to CY217. In one or more embodiments, each of Formulae 201 and 202 may not include a group represented by one of Formulae CY201 to CY217.

In an embodiment, the hole transport region may include one of Compounds HT1 to HT46, 4,4',4"-tris[phenyl(m-tolyl)amino]triphenylamine (m-MTDATA), 1-N,1-N-bis[4-(diphenylamino)phenyl]-4-N,4-N-diphenylbenzene-1,4-diamine (TDATA), 4,4',4"-tris[2-naphthyl(phenyl)amino]triphenylamine (2-TNATA), bis(naphthalen-1-yl)-N,N'-bis(phenyl)benzidine (NPB or NPD), N4,N4'-di(naphthalen-2-yl)-N4,N4'-diphenyl-[1,1'-biphenyl]-4,4'-diamine (β-NPB), N,N'-bis(3-methylphenyl)-N,N'-diphenylbenzidine (TPD), N,N'-bis(3-methylphenyl)-N,N'-diphenyl-9,9-spirobifluorene-2,7-diamine (spiro-TPD), N2,N7-di-1-naphthalenyl-N2,N7-diphenyl-9,9'-spirobi[9H-fluorene]-2,7-diamine (spiro-NPB), N,N'-di(1-naphthyl)-N,N-diphenyl-2,2'-dimethyl-(1,1'-biphenyl)-4,4'-diamine (methylated NPB), 4,4'-cyclohexylidenebis[N,N-bis(4-methylphenyl)benzenamine] (TAPC), N,N,N',N'-tetrakis(3-methylphenyl)-3,3'-dimethylbenzidine (HMTPD), 4,4',4"-tris(N-carbazolyl)triphenylamine (TCTA), polyaniline/dodecylbenzenesulfonic acid (PANT/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

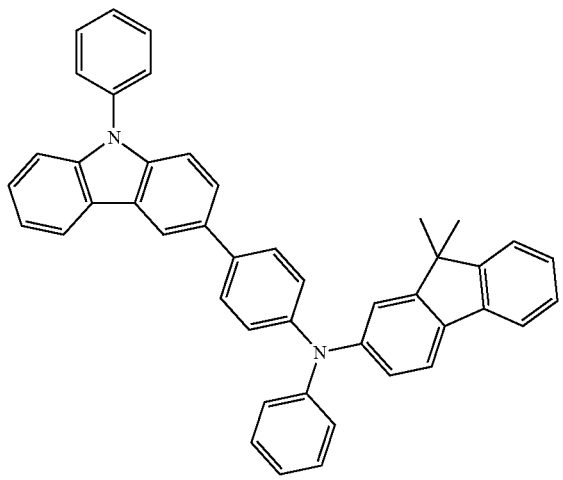

HT1

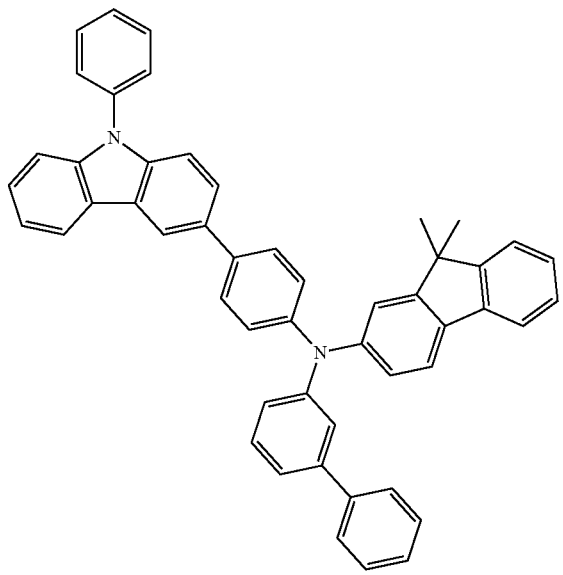

HT2

-continued
HT3
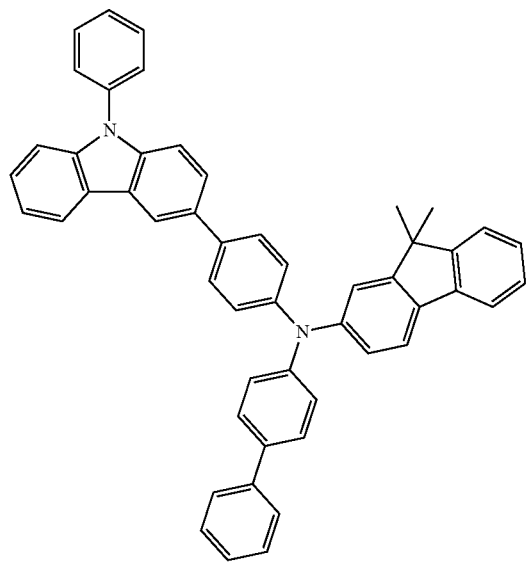
HT4
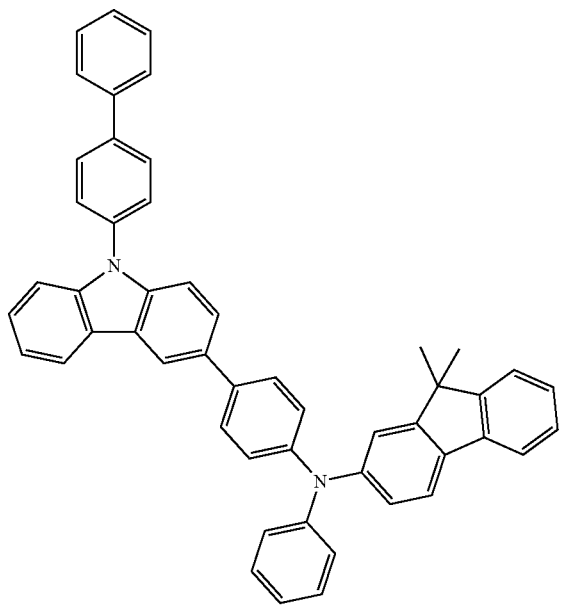
HT5
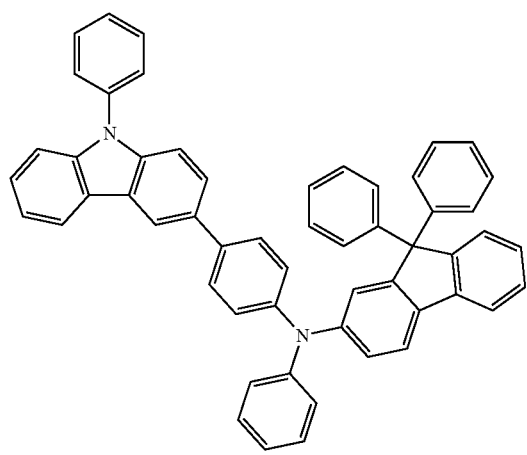
HT6
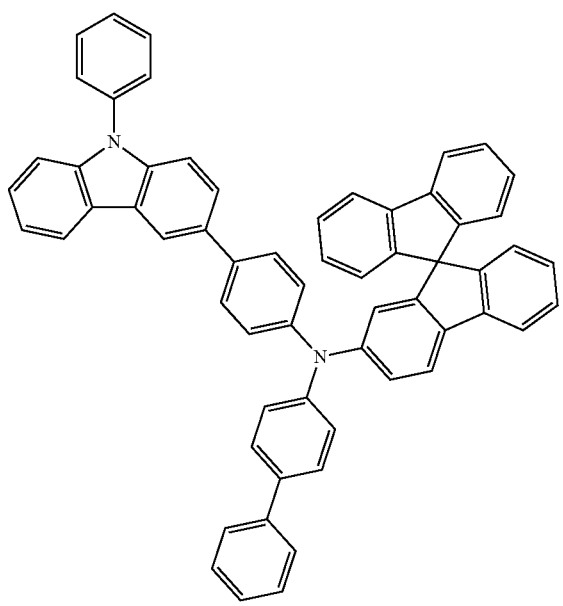

-continued
HT7
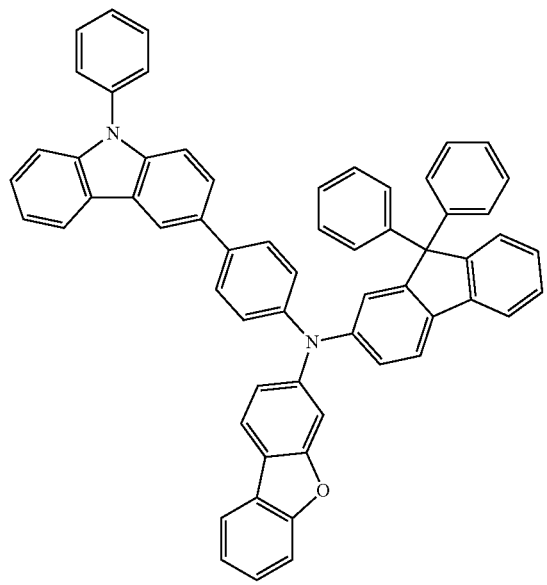
HT8
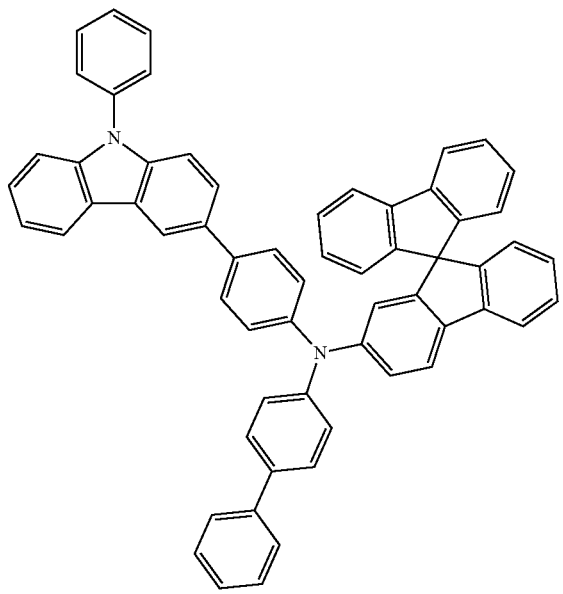
HT9
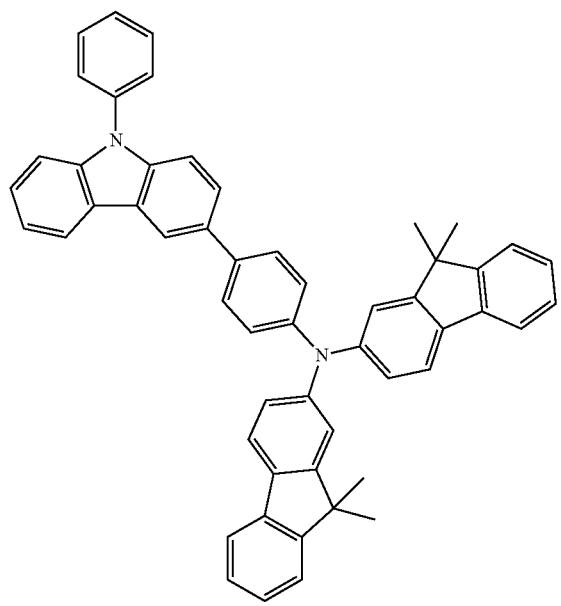
HT10
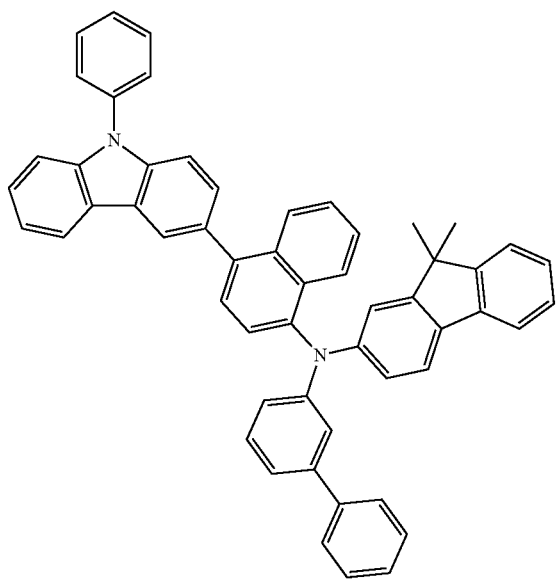

-continued
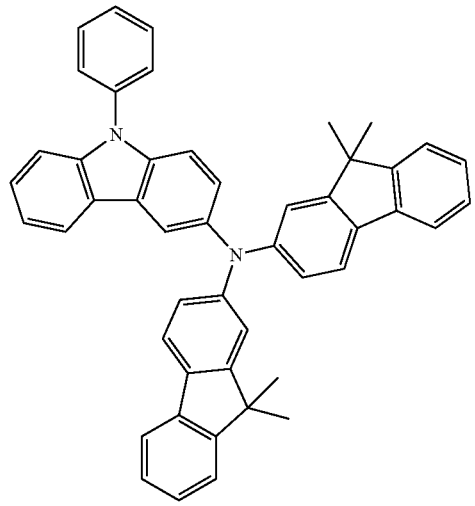
HT11
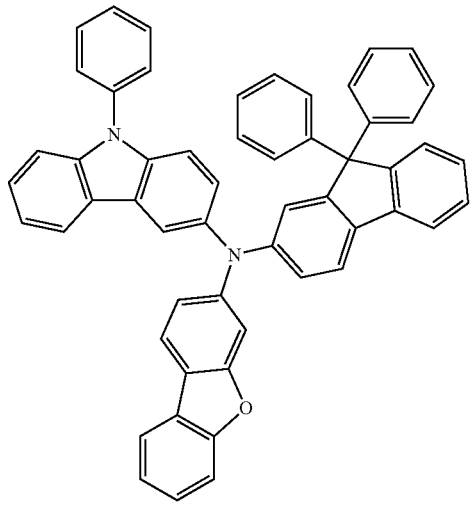
HT12
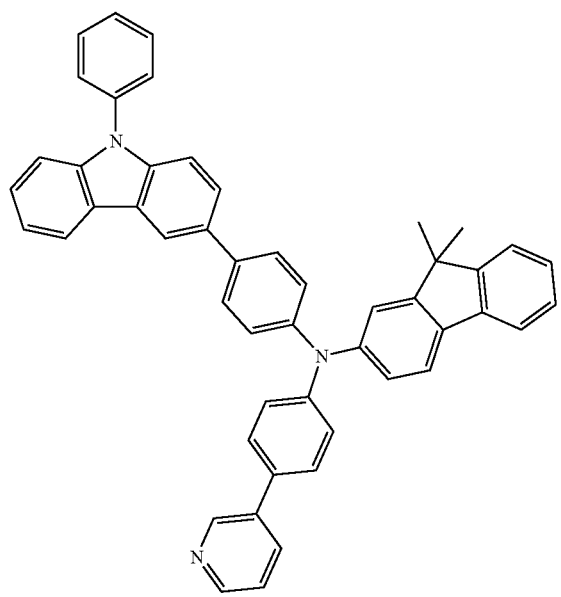
HT13
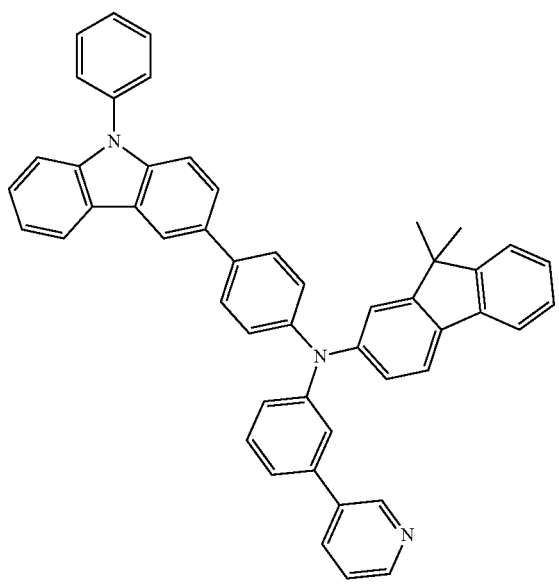
HT14
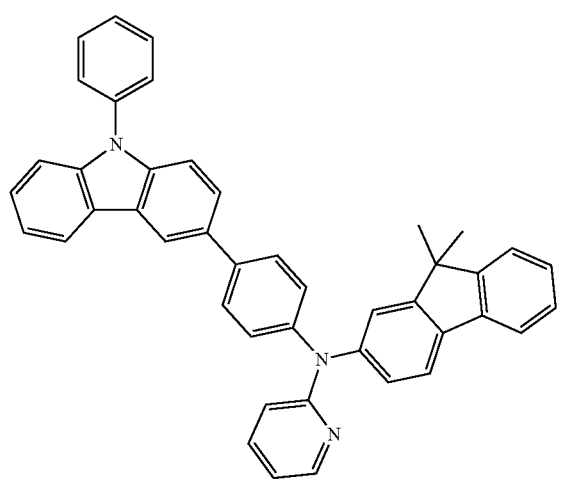
HT15
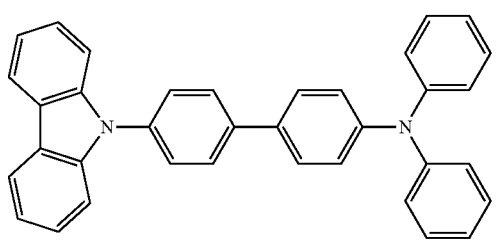
HT16

-continued
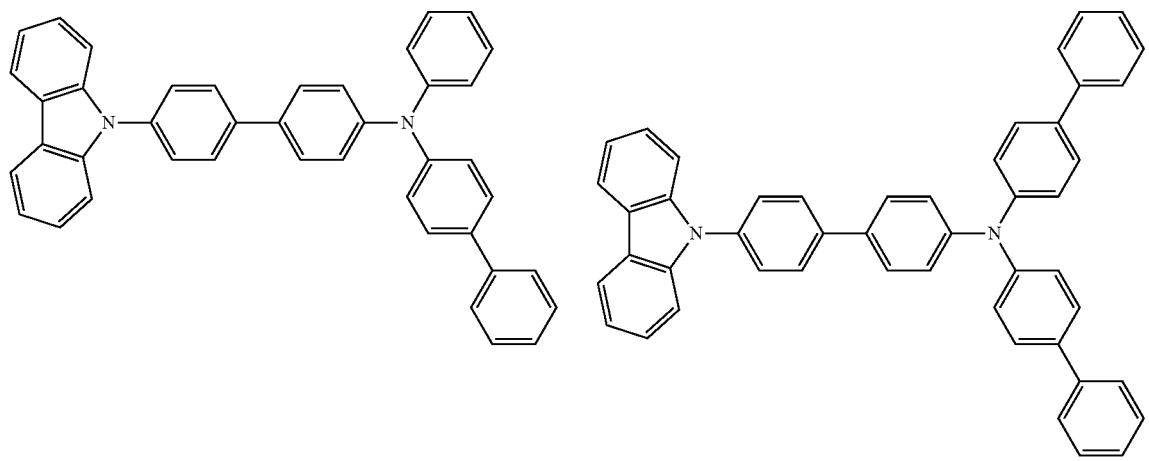
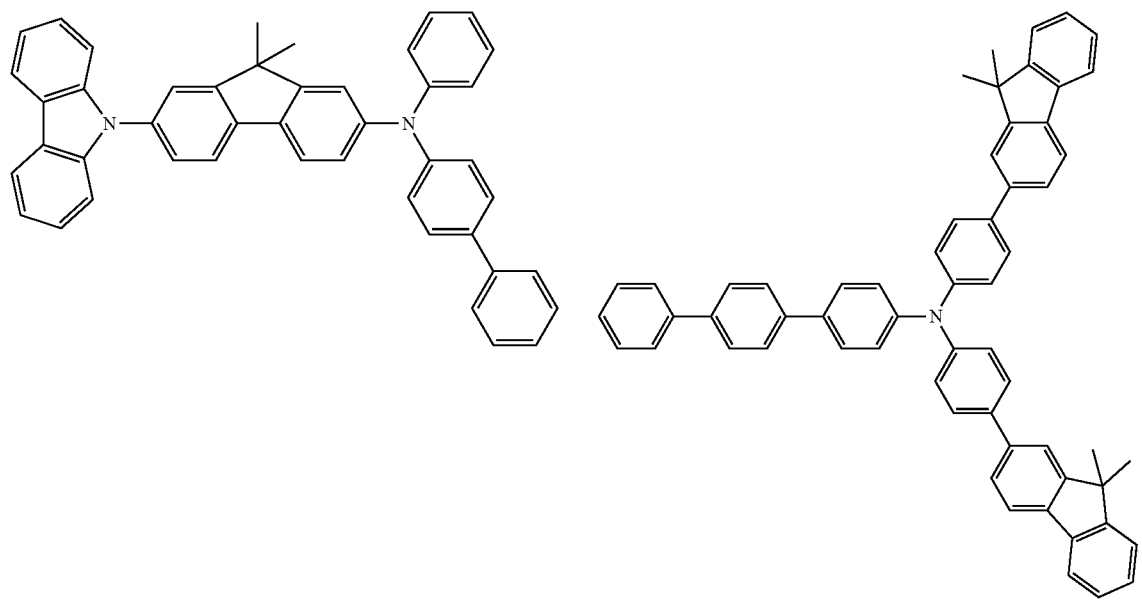

HT21
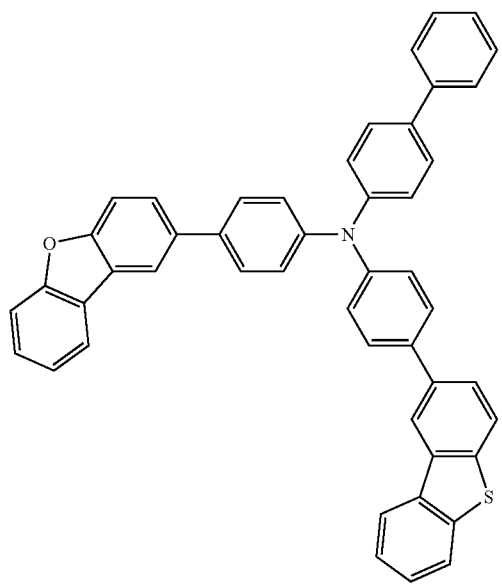
HT22
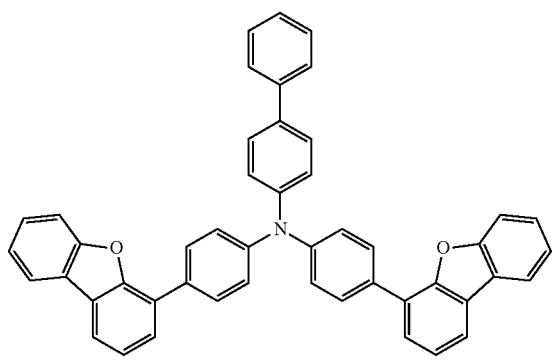
HT23
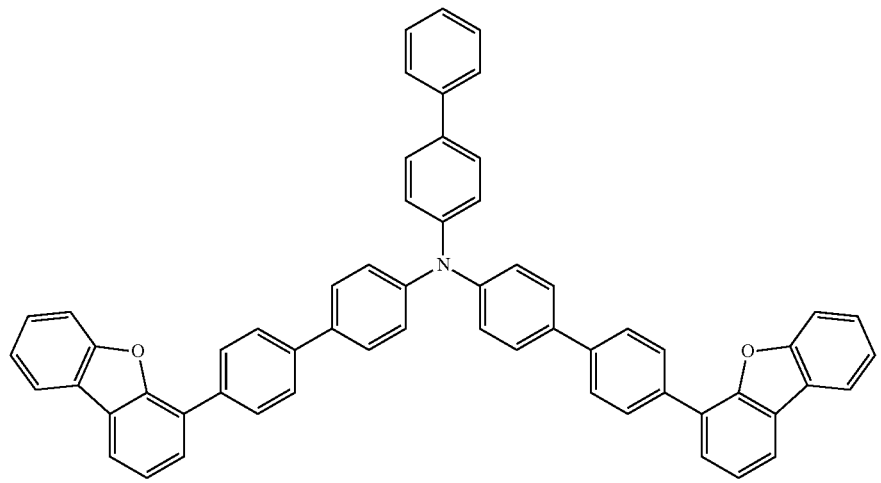
HT24
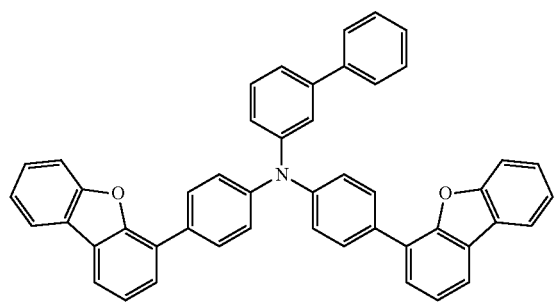
HT25
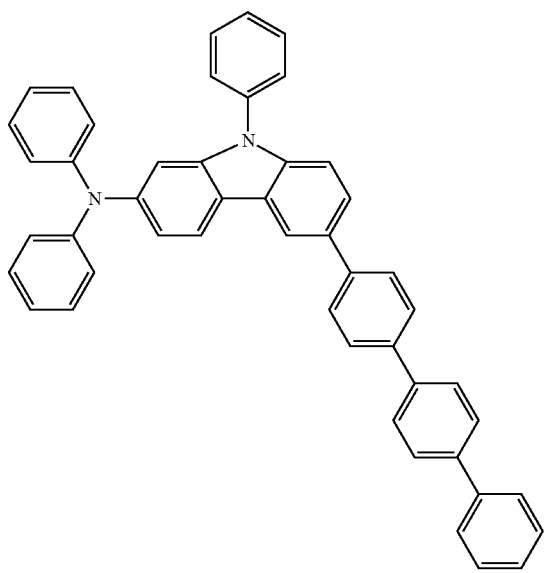

-continued
HT26
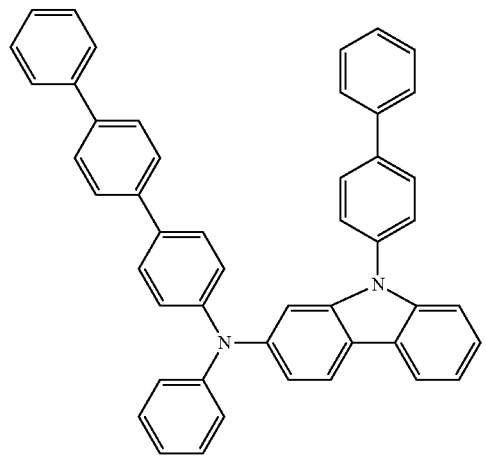
HT27
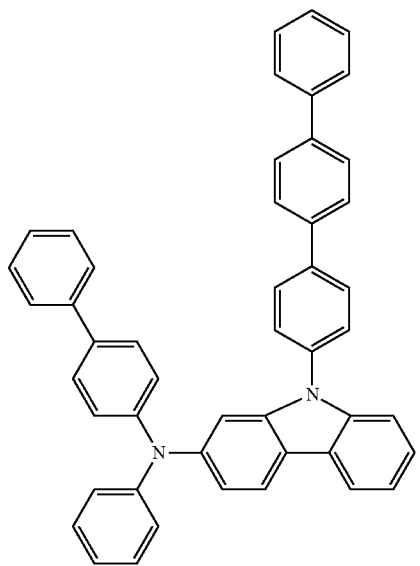
HT28
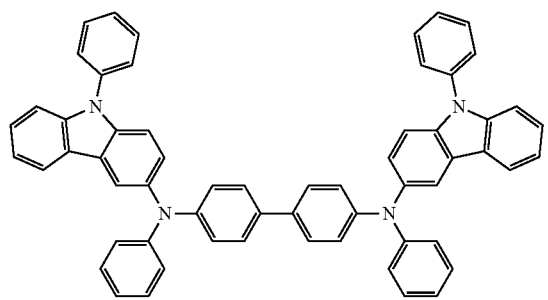
HT29
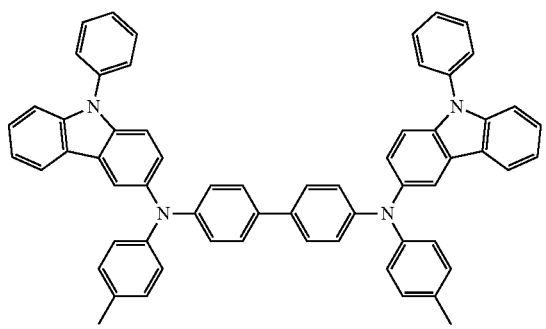
HT30
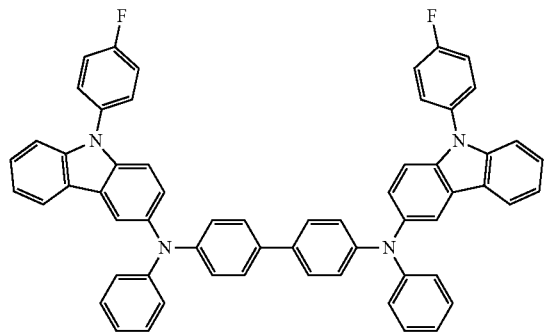
HT31
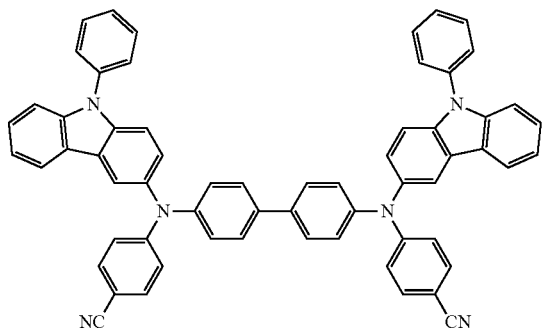

-continued
HT32
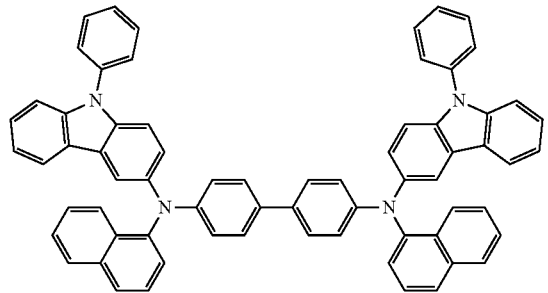
HT33
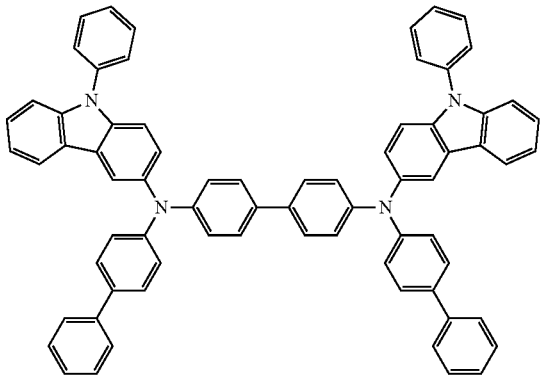
HT34
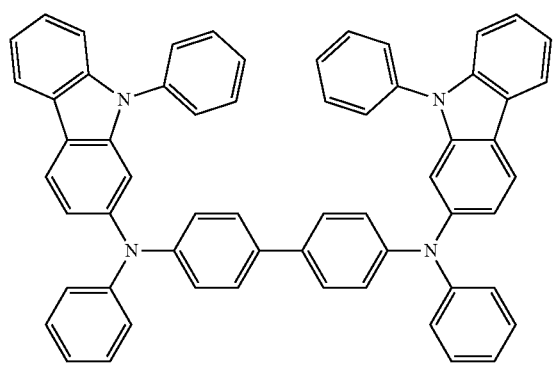
HT35
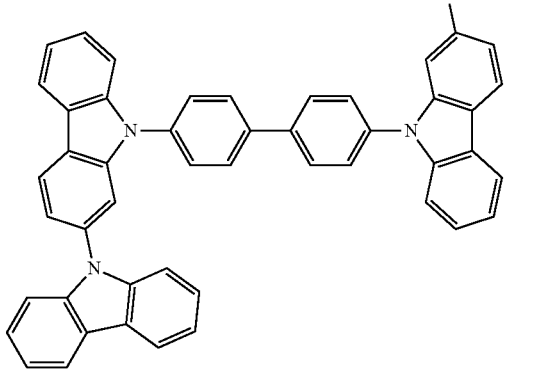
HT36
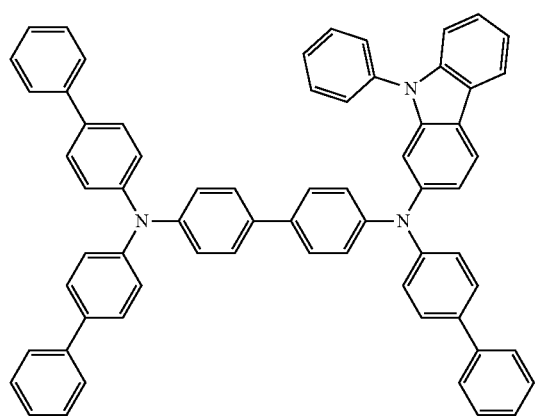
HT37
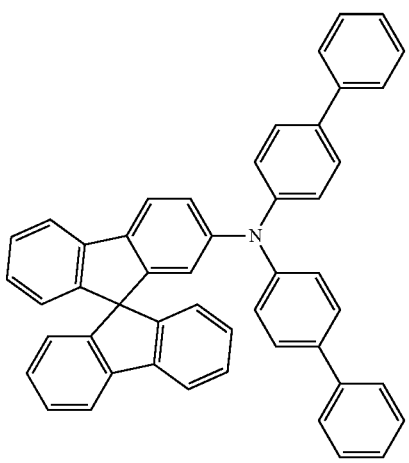

-continued
HT38
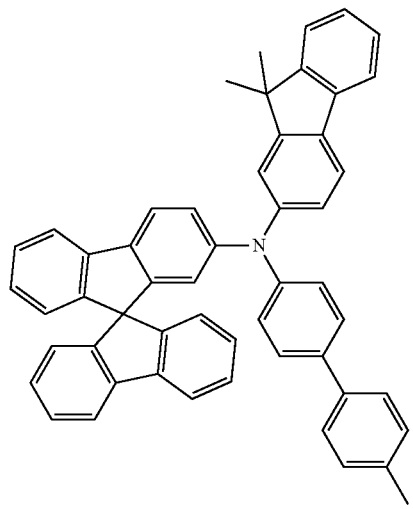
HT39
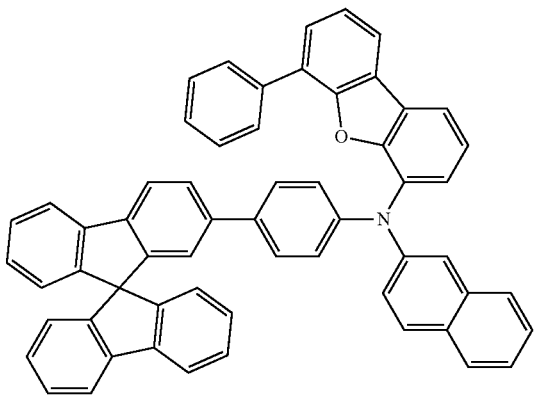
HT40
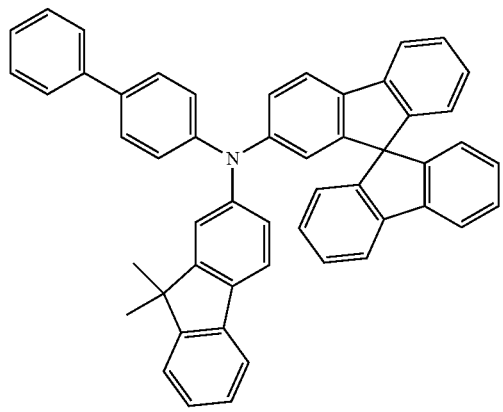
HT41
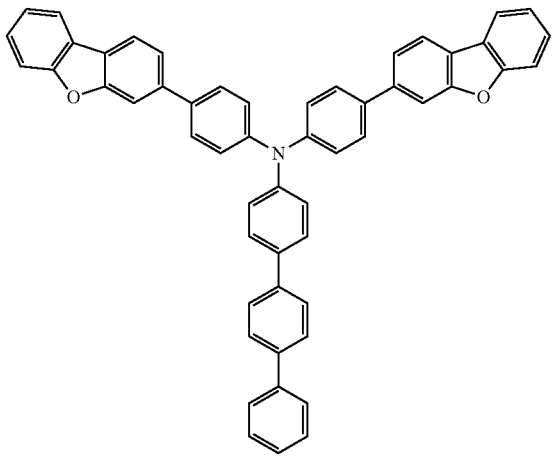
HT42
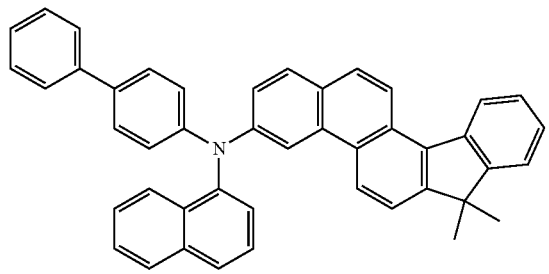
HT43
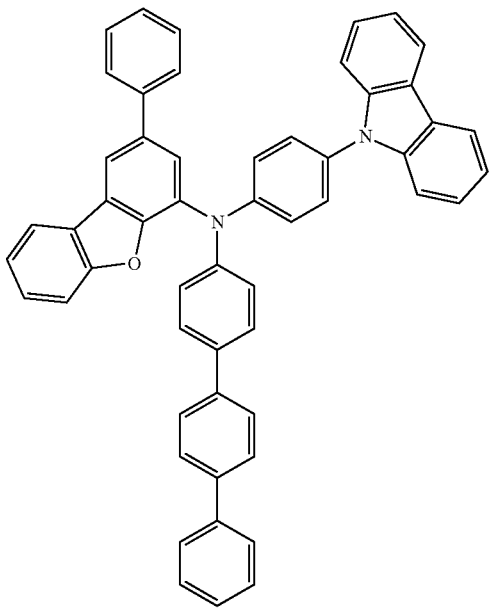

-continued
HT44
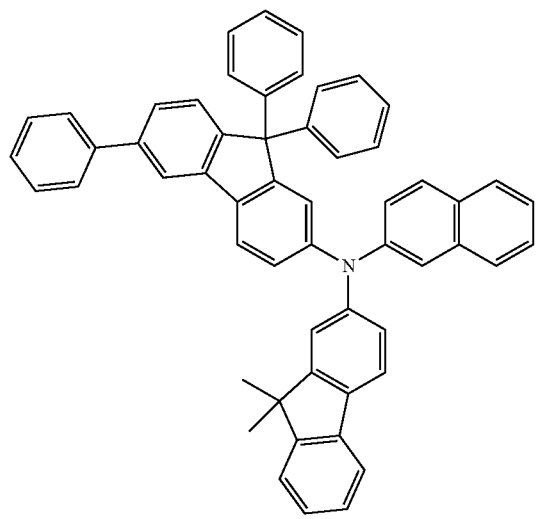
HT45
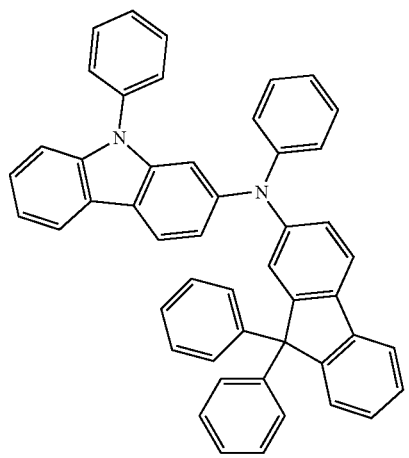
HT46
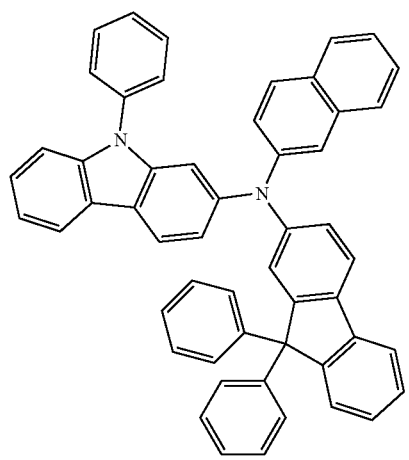
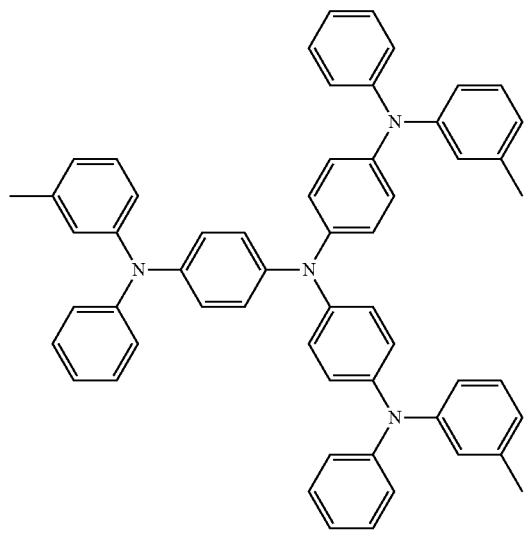
m-MTDATA
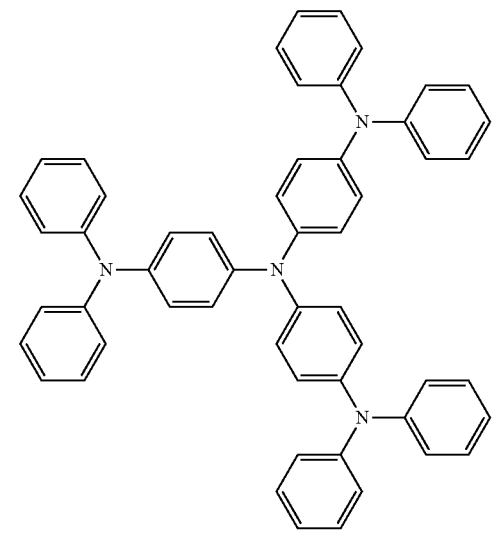
TDATA -continued
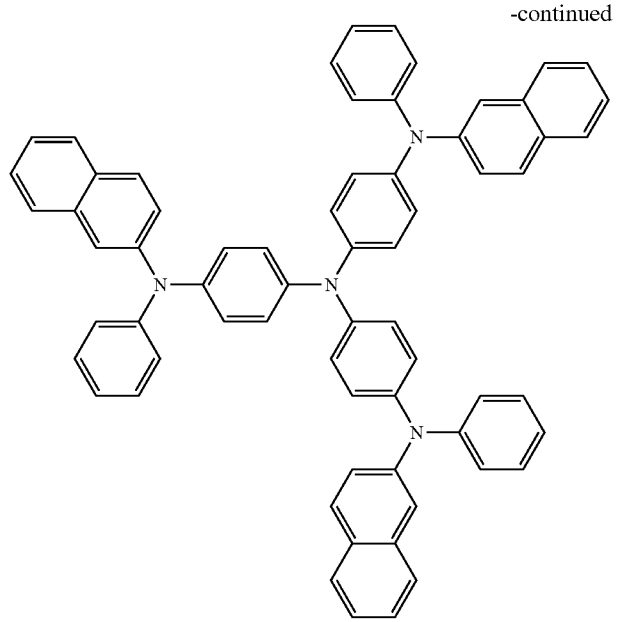
2-TNATA
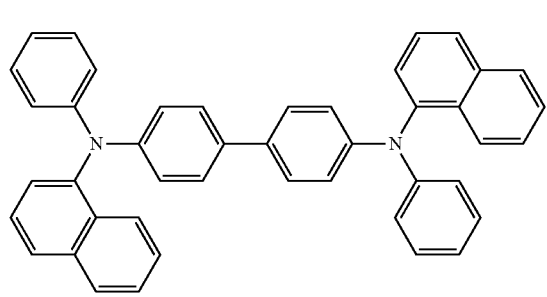
NPB
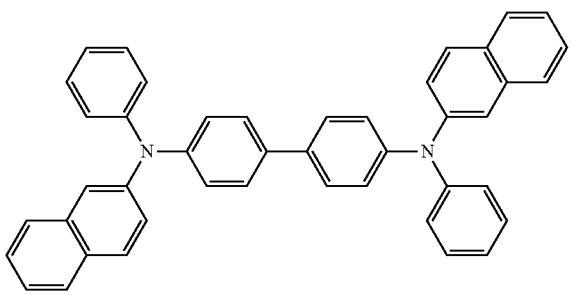
β-NPB
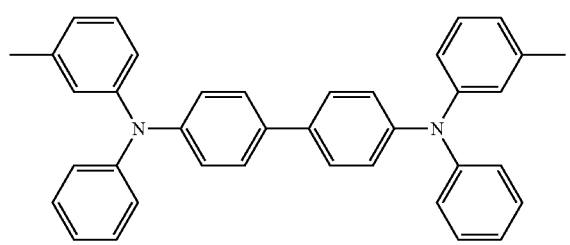
TPD
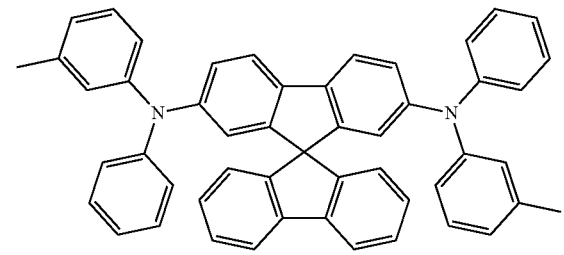
Spiro-TPB
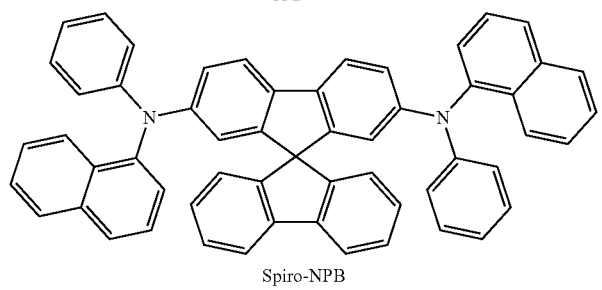
Spiro-NPB -continued

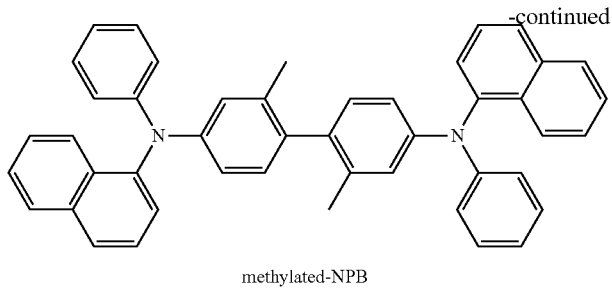

methylated-NPB

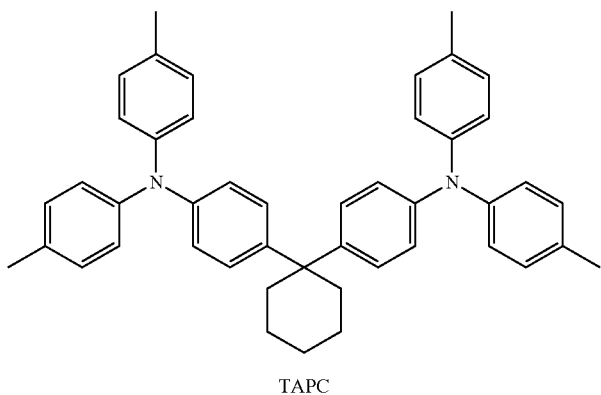

TAPC

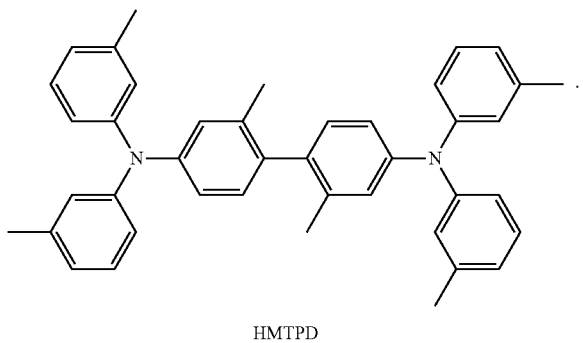

HMTPD

The thickness of the hole transport region may be in a range of about 50 Å to about 10,000 Å, for example, about 100 Å to about 4,000 Å. When the hole transport region includes the hole injection layer, the hole transport layer, or any combination thereof, the thickness of the hole injection layer may be in a range of about 100 Å to about 9,000 Å, for example, about 100 Å to about 1,000 Å, and the thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the leakage of electrons from an emission layer to a hole transport region. Materials that may be included in the hole transport region may be included in the emission auxiliary layer and the electron blocking layer. For example, the hole injection layer and/or hole transport layer may include the layer doped with the non-lead-based perovskite compound. For example, the layer doped with the non-lead-based perovskite compound may be a hole injection layer.

Emission Layer in Interlayer 130

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers of a red emission layer, a green emission layer, and a blue emission layer, in which the two or more layers contact each other or are separated from each other. In one or more embodiments, the emission layer may include two or more materials of a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof. The amount of the dopant in the emission layer may be from about 0.01 to about 15 parts by weight based on 100 parts by weight of the host. In one or more embodiments, the emission layer may include a quantum dot. The emission layer may include a delayed fluorescence material. The delayed fluorescence material may act as a host or a dopant in the emission layer. The thickness of the emission layer may be in a range of about 100 Å to about 1,000 Å, for example, about 200 Å to about 600 Å. When the thickness of the emission layer is within these ranges, excellent light-emission characteristics may be obtained without a substantial increase in driving voltage.

Host

In one or more embodiments, the host may include a compound represented by Formula 301 below:

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si$(Q_{301})(Q_{302})(Q_{303})$, —N$(Q_{301})(Q_{302})$, —B$(Q_{301})(Q_{302})$, —C(=O)$(Q_{301})$, —S(=O)$_2(Q_{301})$, or —P(=O)$(Q_{301})(Q_{302})$, xb21 may be an integer from 1 to 5, and $Q_{301}$ to $Q_{303}$ are each the same as described in connection with $Q_{11}$ as described herein.

For example, when xb11 in Formula 301 is 2 or more, two or more of $Ar_{301}$(s) may be linked to each other via a single bond. In one or more embodiments, the host may include a compound represented by Formula 301-1, a compound represented by Formula 301-2, or any combination thereof:

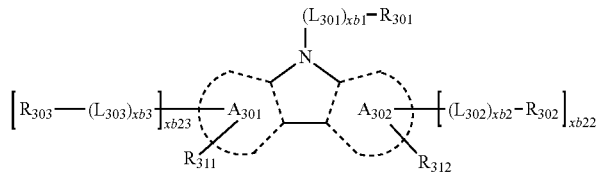

Formula 301-1

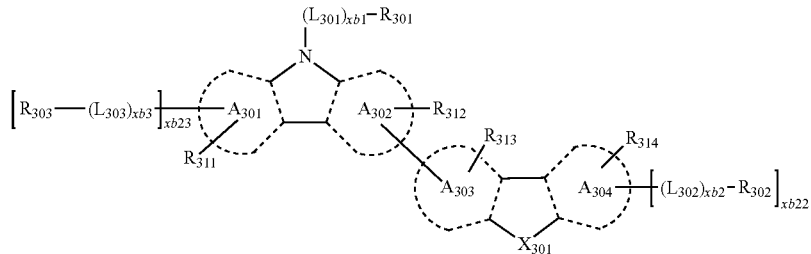

Formula 301-2

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C$(R_{304})(R_{305})$, or Si$(R_{304})(R_{305})$, xb22 and xb23 may each independently be 0, 1, or 2, $L_{301}$, xb1, and $R_{301}$ are the each same as described herein, $L_{302}$ to $L_{304}$ are each independently the same as described in connection with $L_{301}$, xb2 to xb4 are each independently the same as described in connection with xb1, and $R_{302}$ to $R_{305}$ and $R_{311}$ to $R_{314}$ are each the same as described in connection with $R_{301}$.

In one or more embodiments, the host may include an alkali earth metal complex, a post-transition metal complex, or any combination thereof. In one or more embodiments, the host may include a Be complex (for example, Compound H55), an Mg complex, a Zn complex, or any combination thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di(carbazole-9-yl)benzene (mCP), 1,3,5-tri(carbazol-9-yl)benzene (TCP), or any combination thereof:

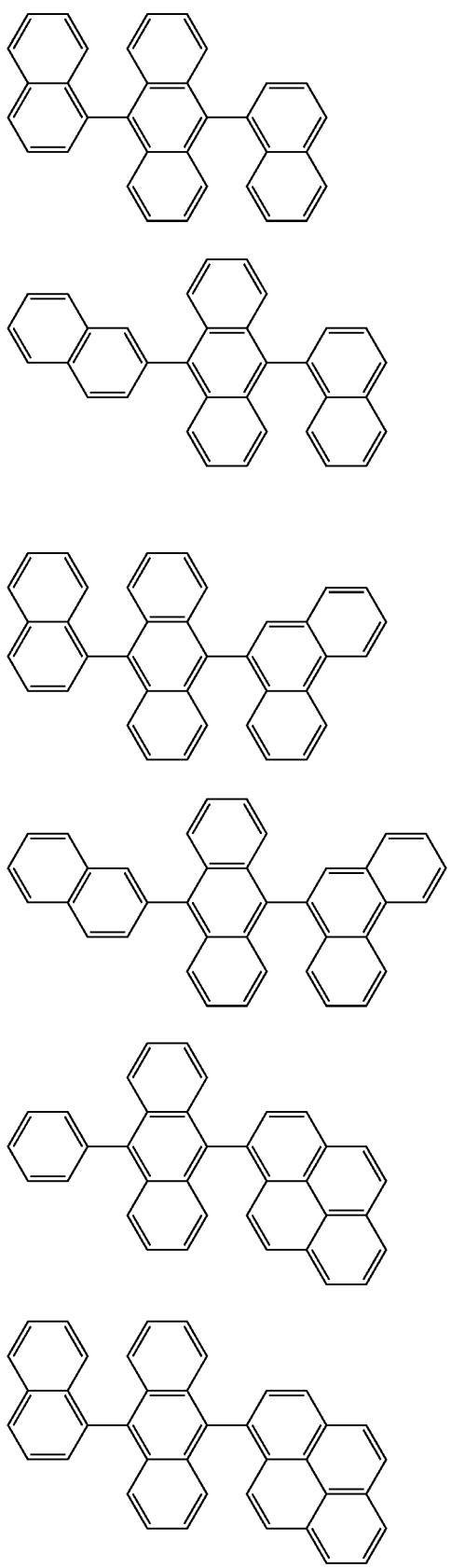
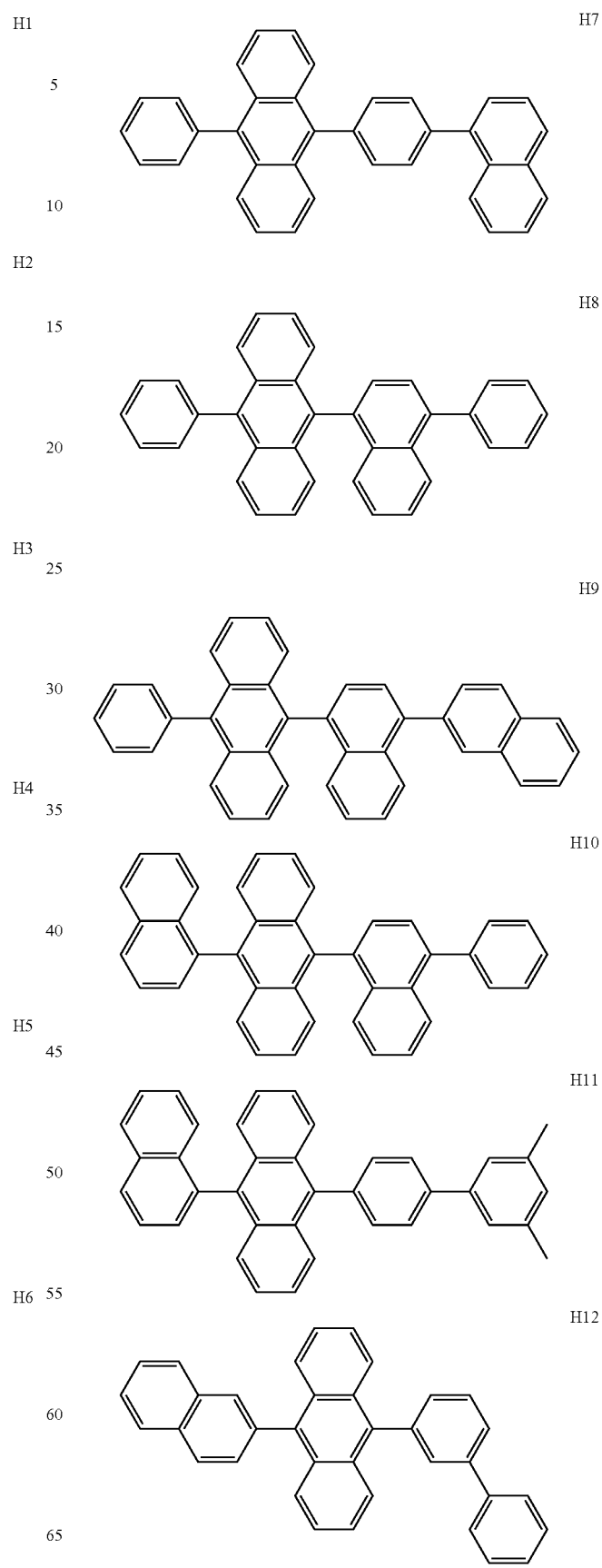

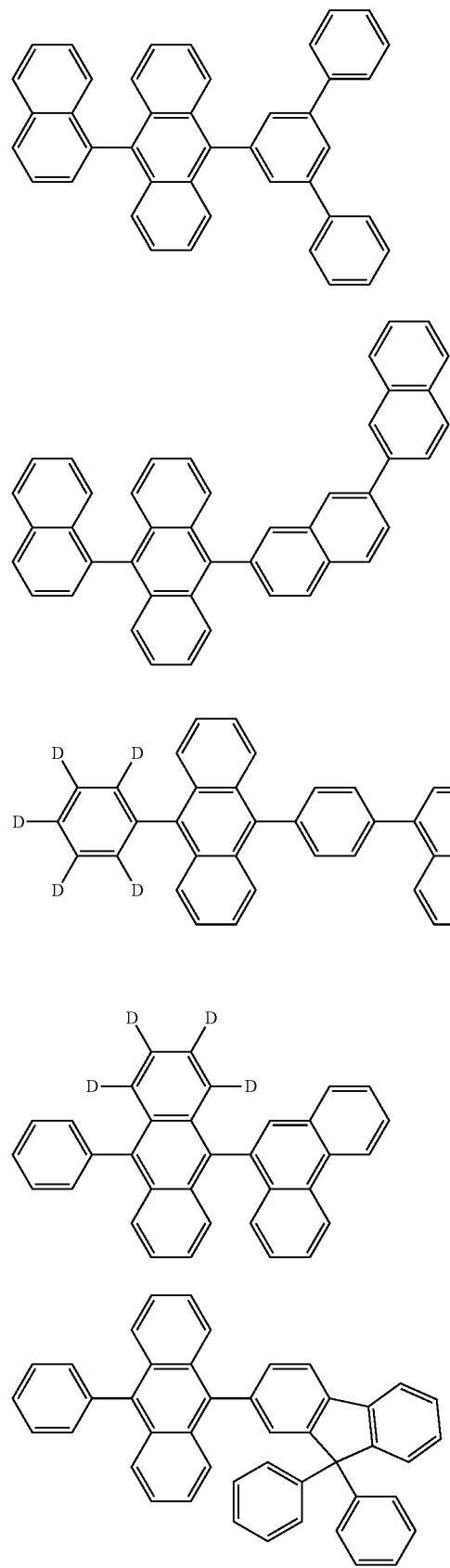

H23
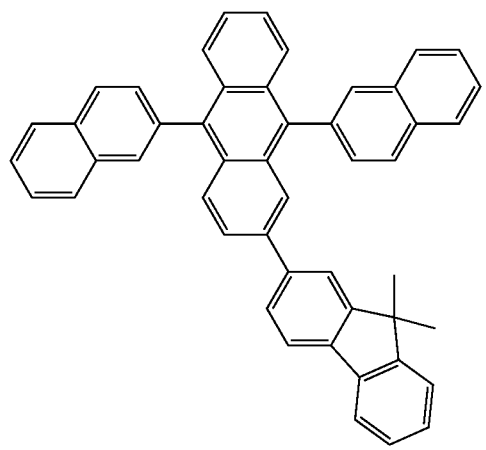
H24
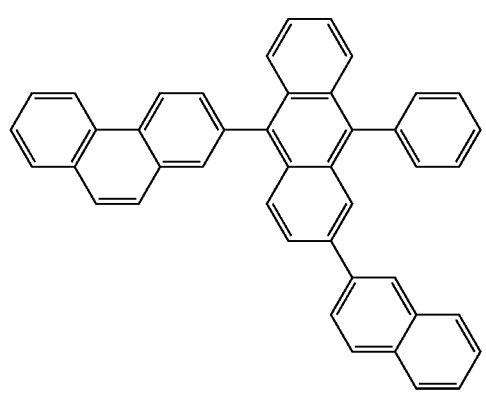
H25
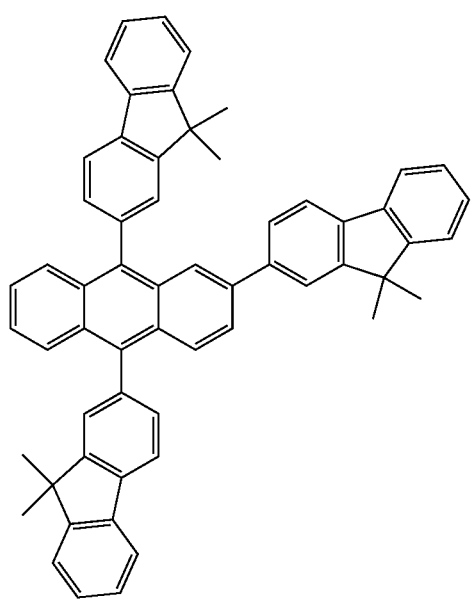
H26
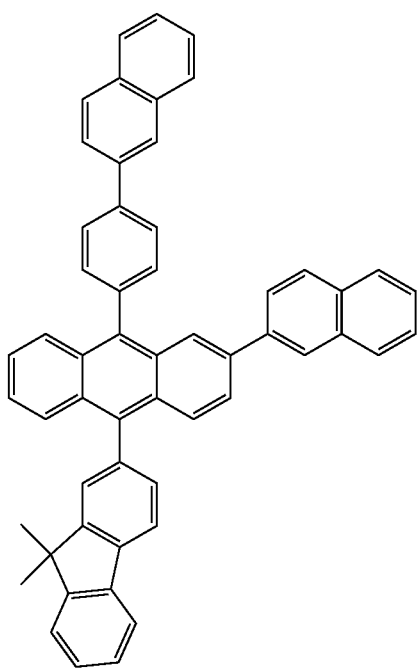
H27
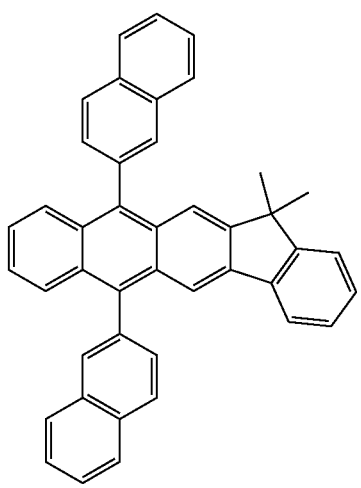
H28
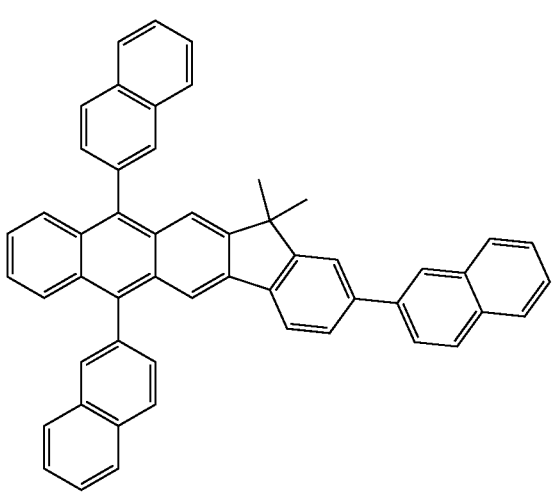

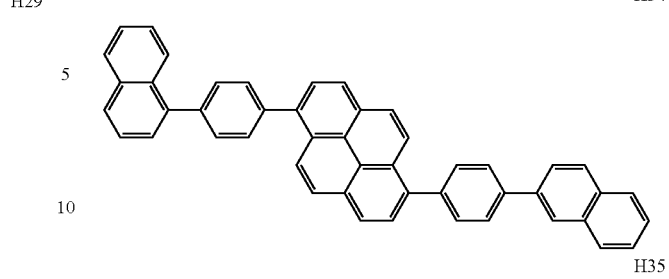
H29
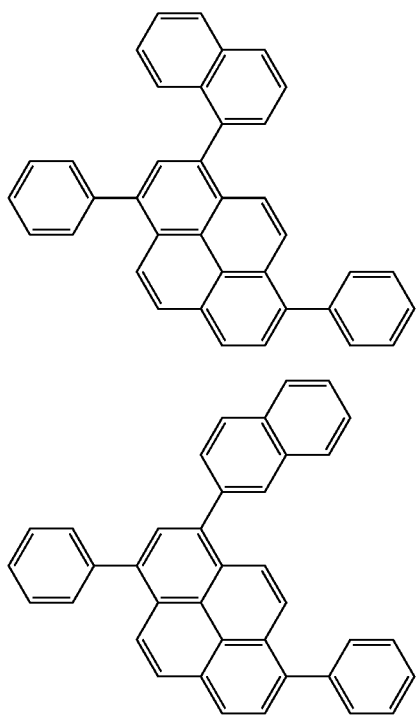
H30
H31
H32
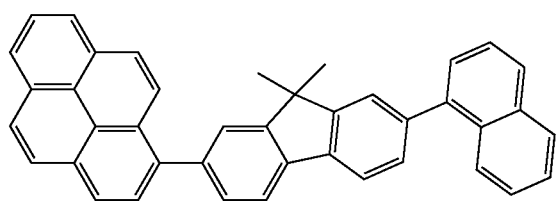
H33
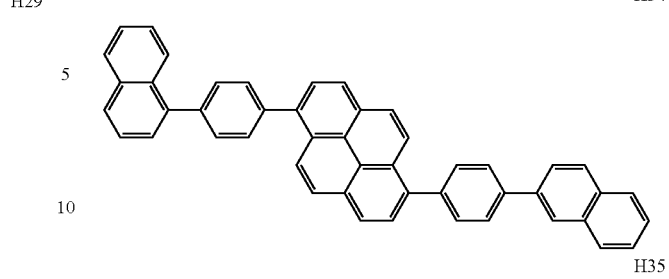
H34
H35
H36
H37
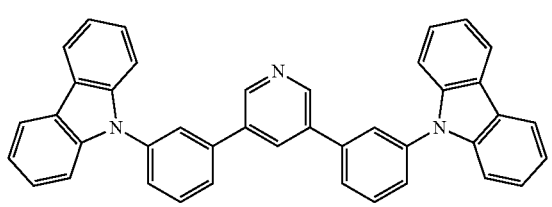
H38

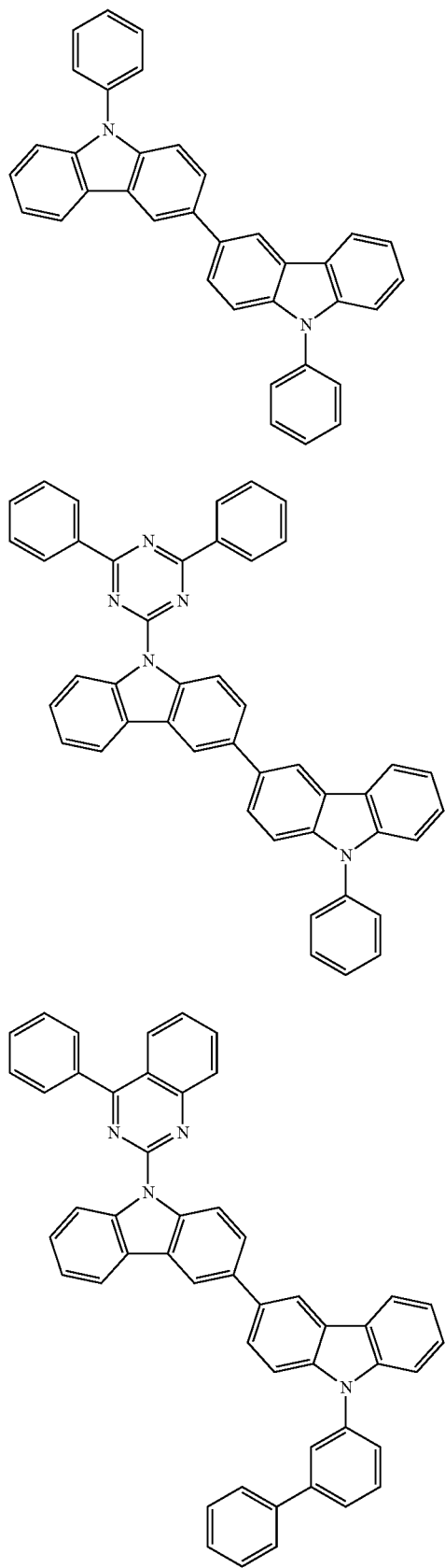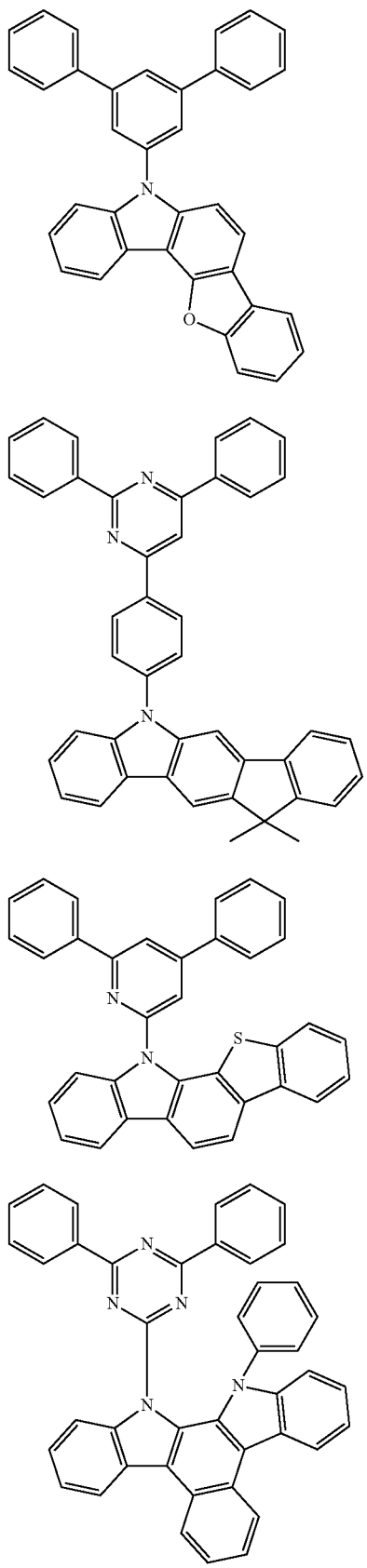

H46 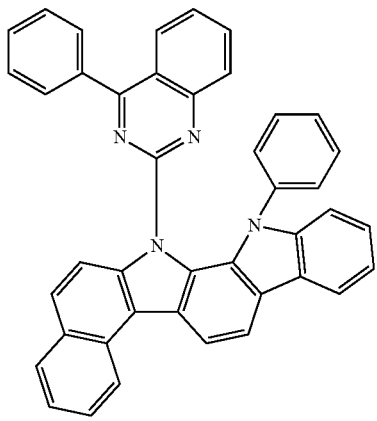
H47 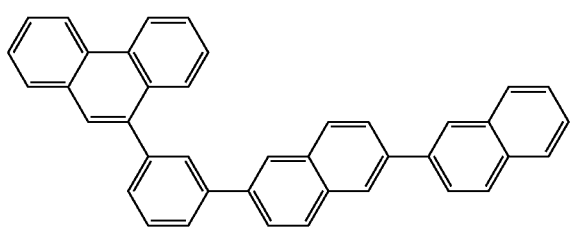
H48 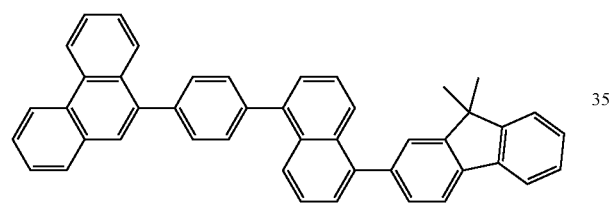
H49 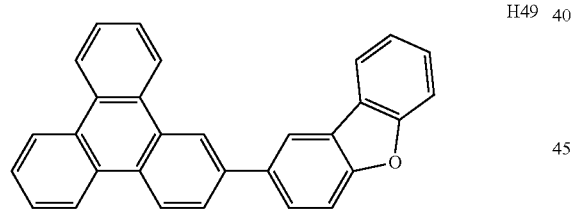
H50 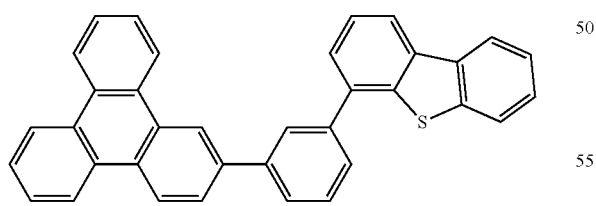
H51 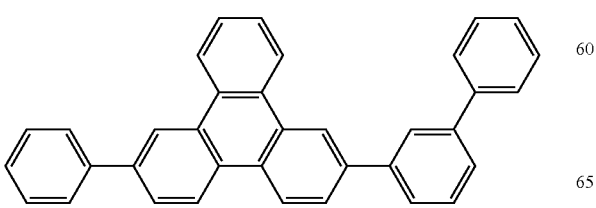
H52 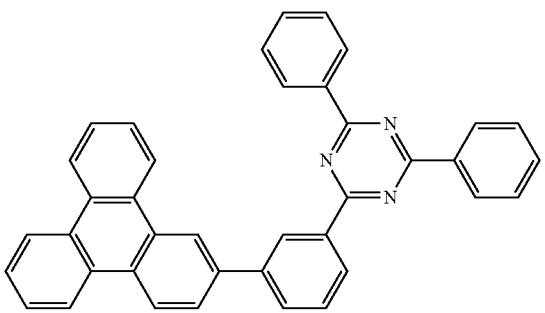
H53 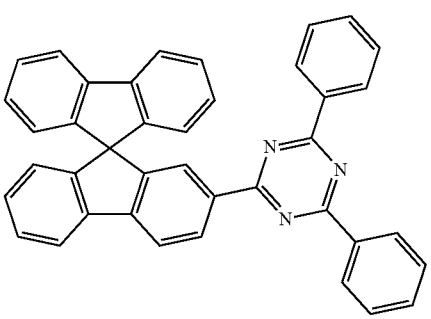
H54 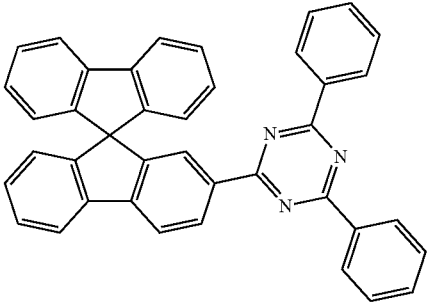
H55 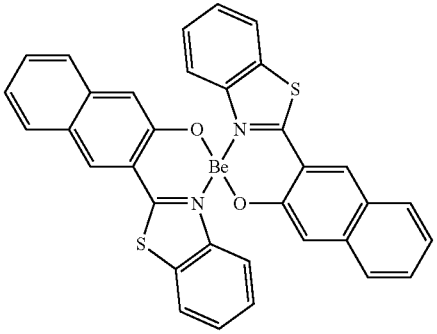

-continued
H56
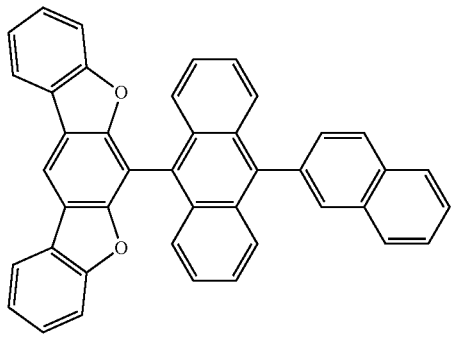
H57
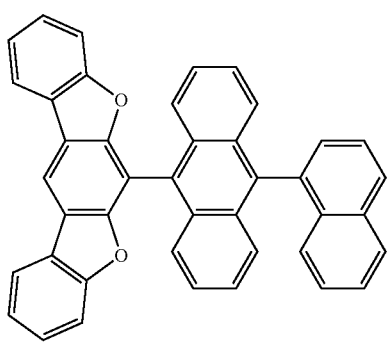
H58
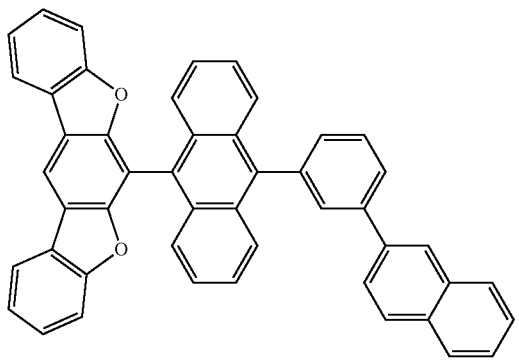
H59
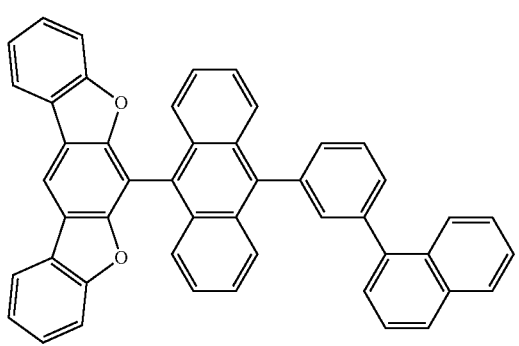
-continued
H60
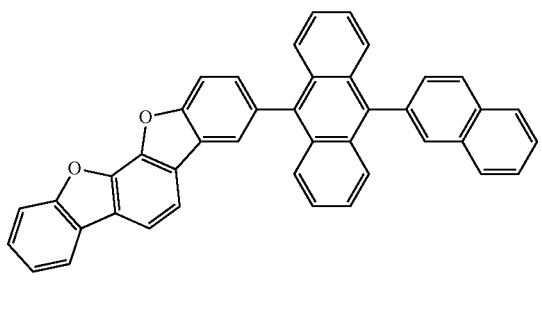
H61
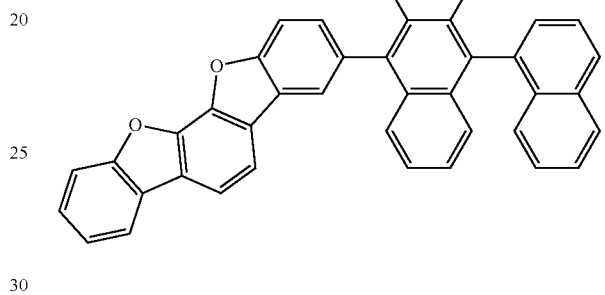
H62
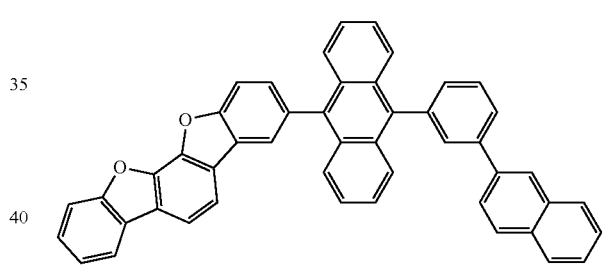
H63
H64
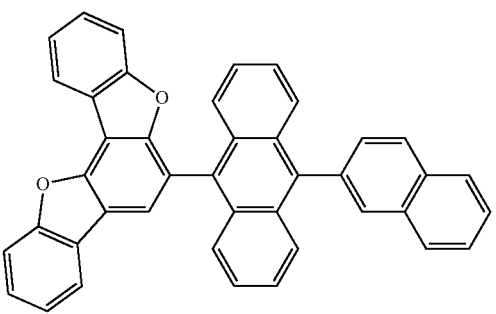

51
-continued
H65
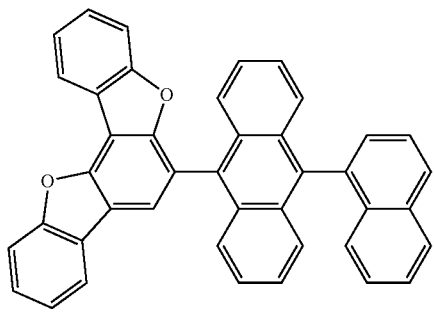
H66
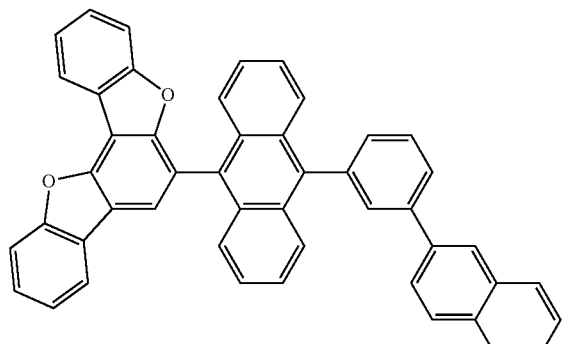
H67
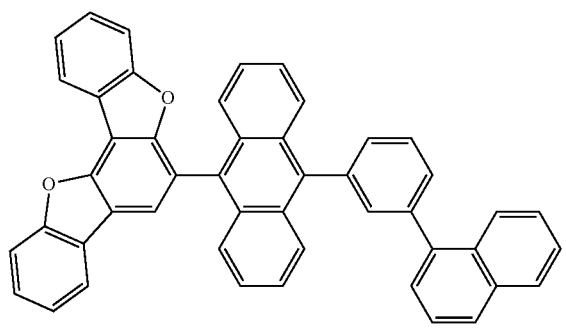
H68
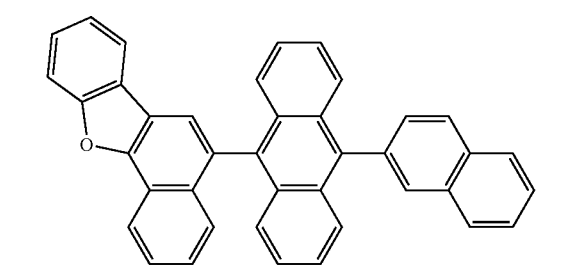
H69
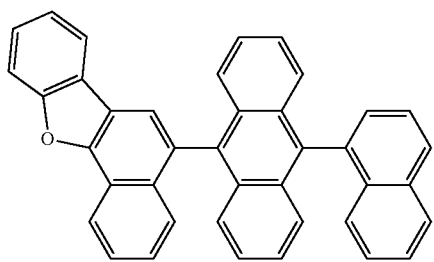
52
-continued
H70
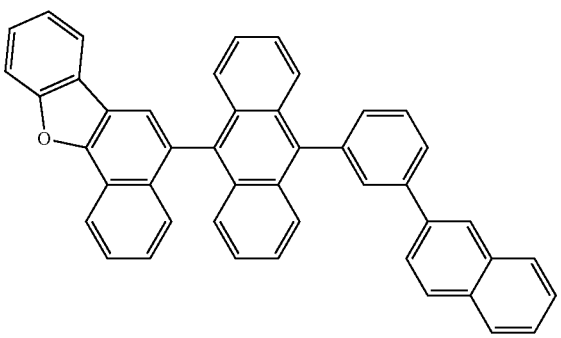
H71
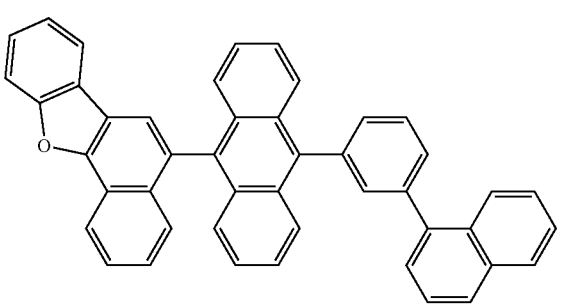
H72
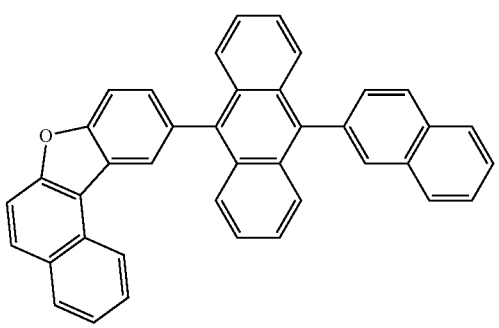
H73
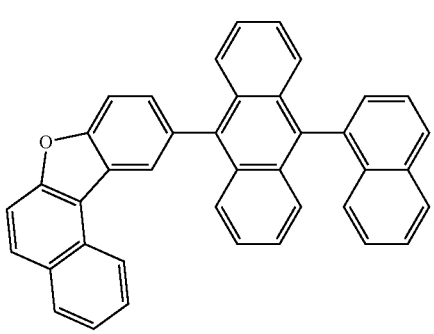

-continued
H74
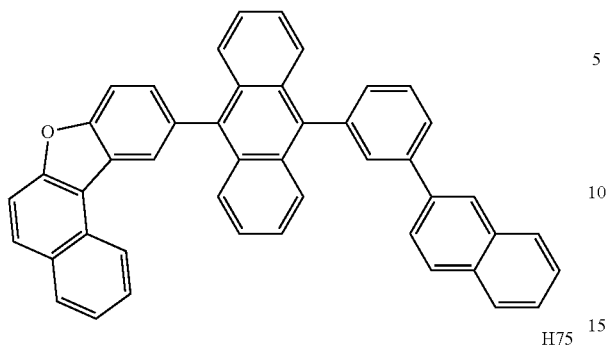
H75
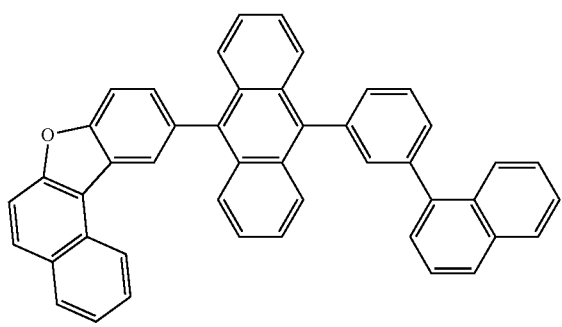
H76
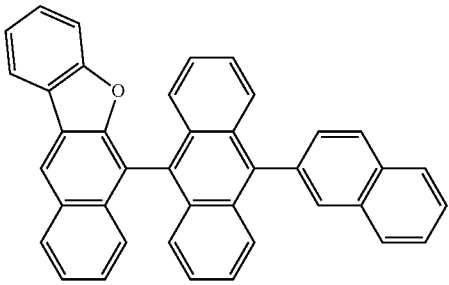
H77
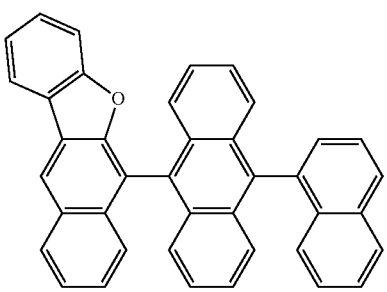
H78
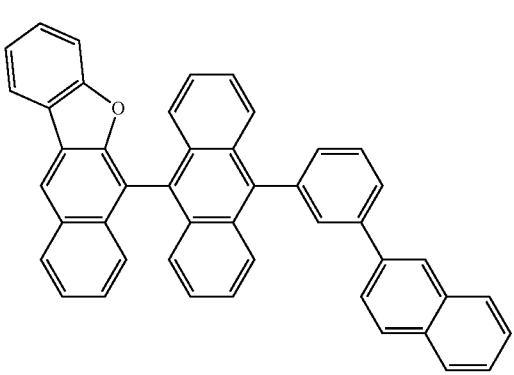
-continued
H79
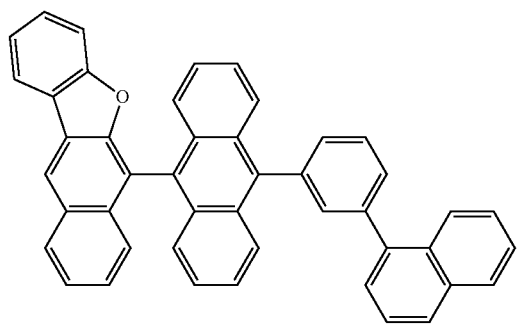
H80
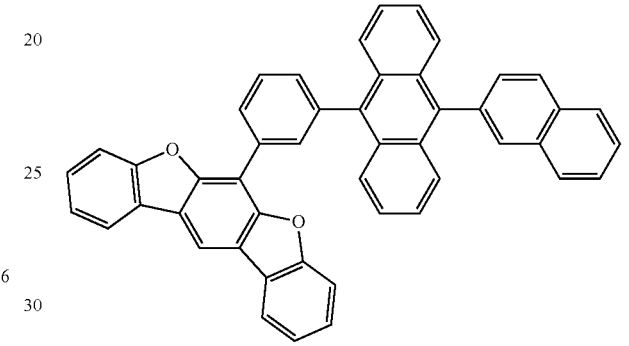
H81
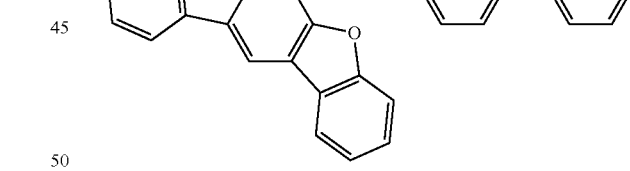
H82
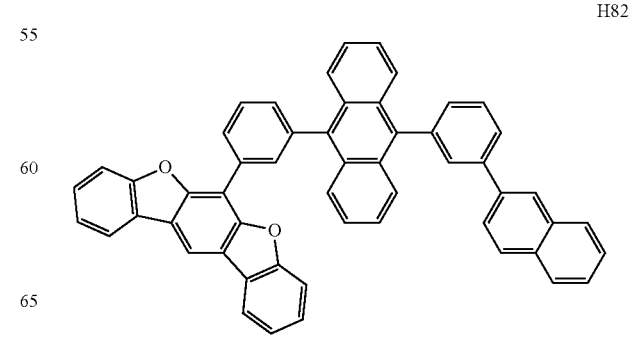

H83
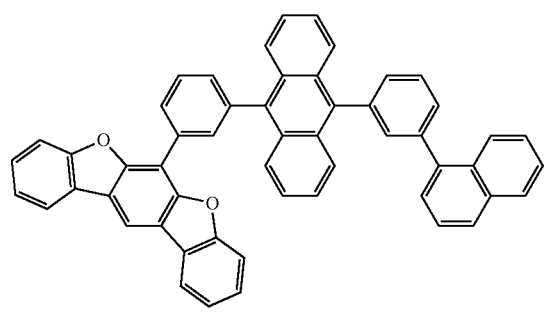
H84
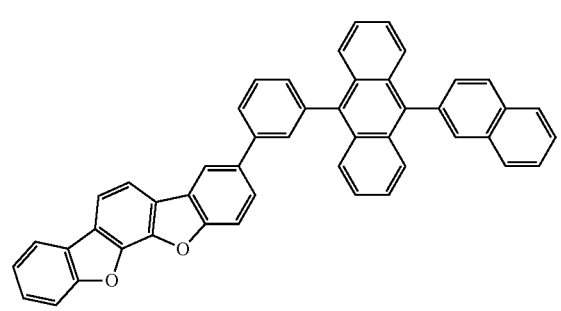
H85
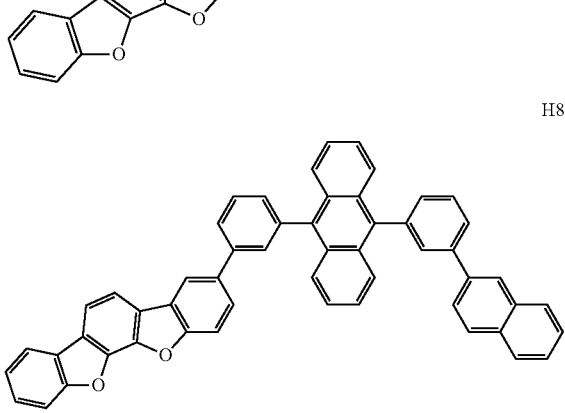
H86
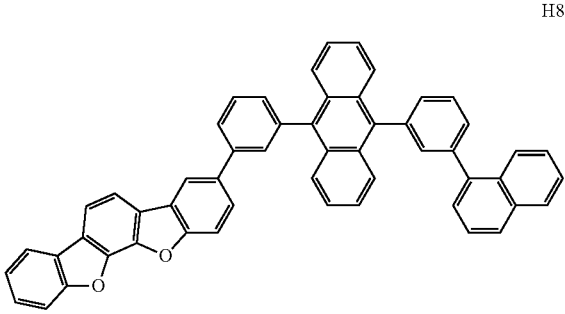
H88
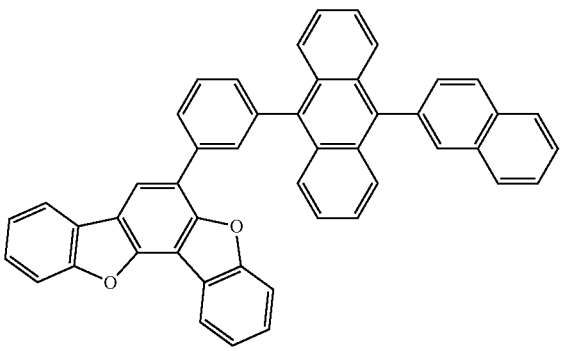
H89
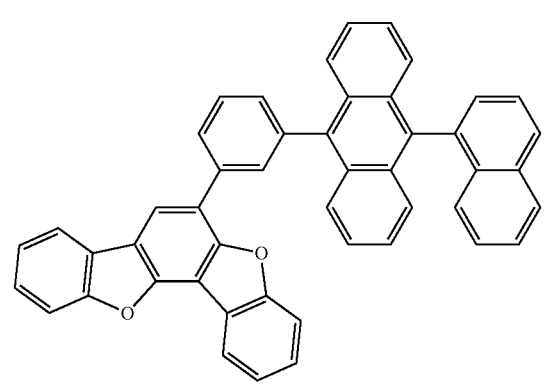
H90
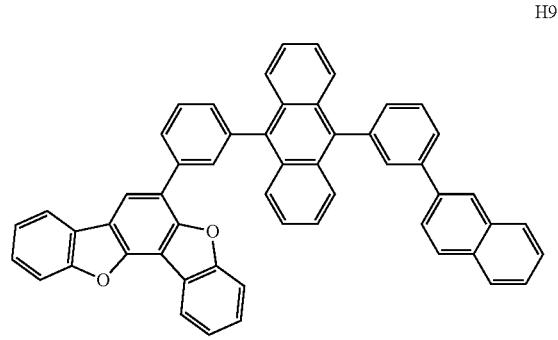
H91
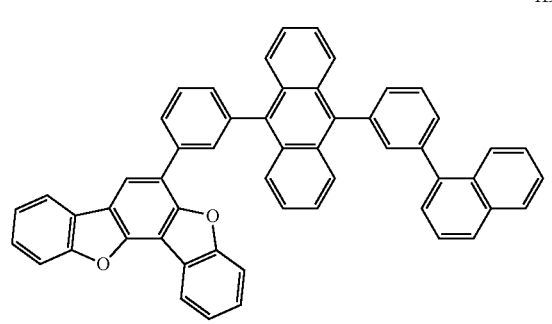
H87

H92
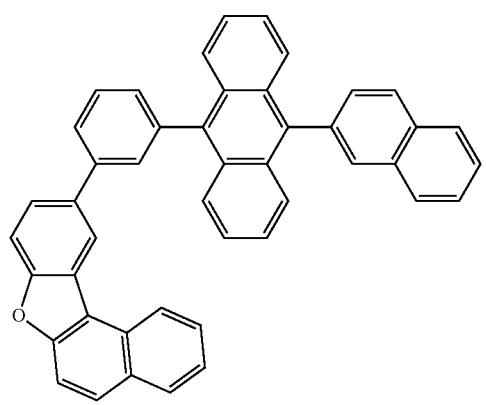
H93
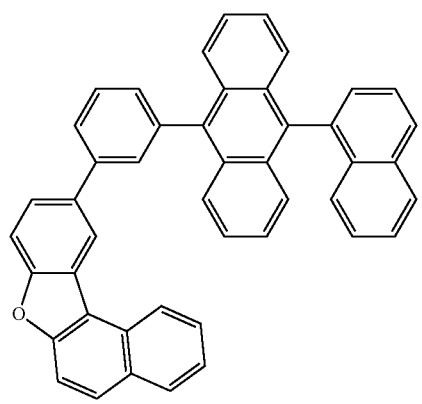
H94
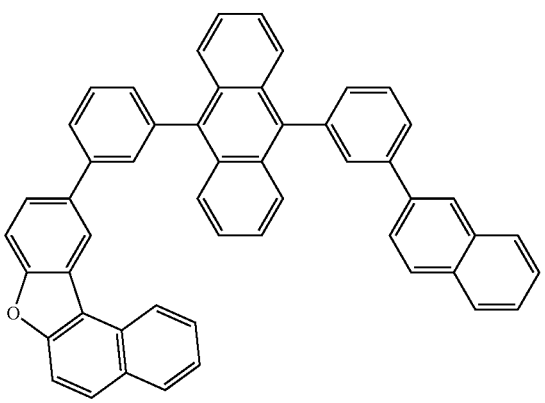
H95
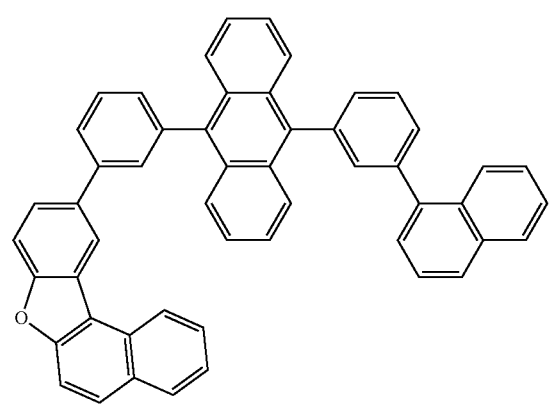
H96
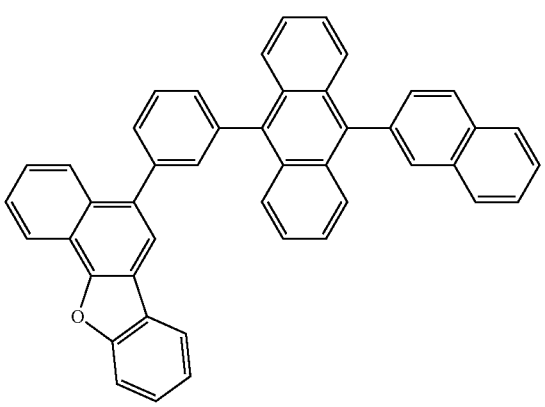
H97
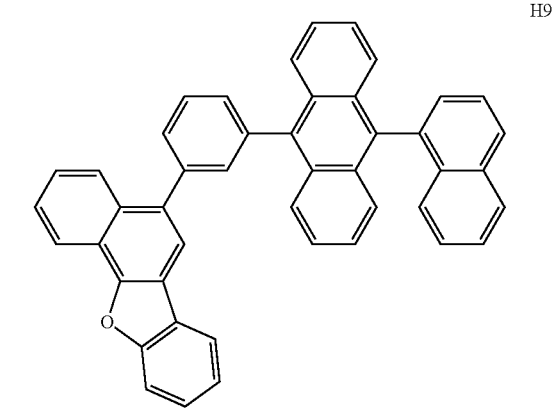
H98
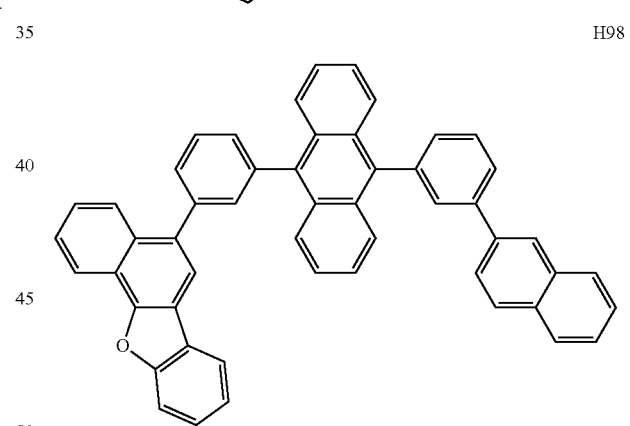
H99
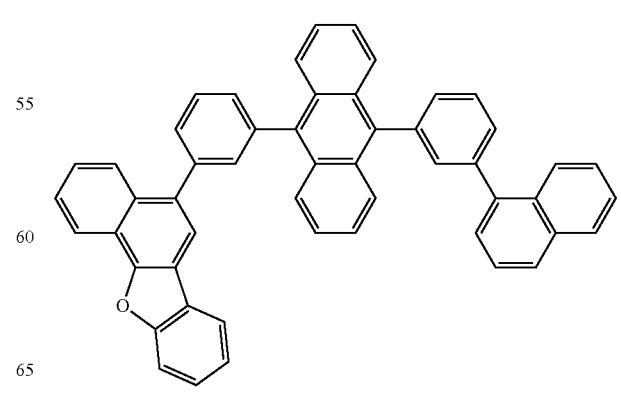

H100
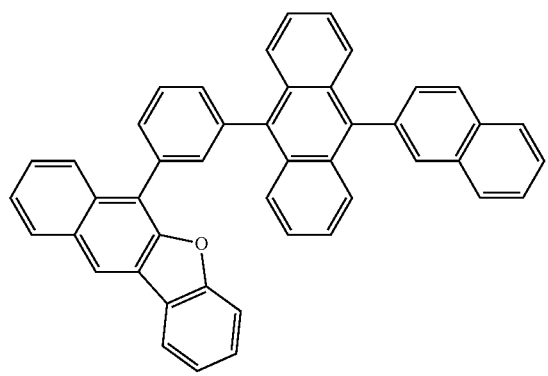
H101
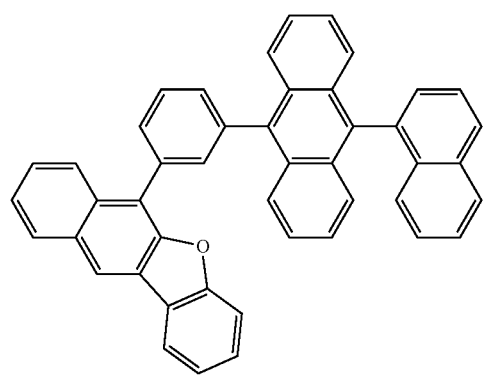
H102
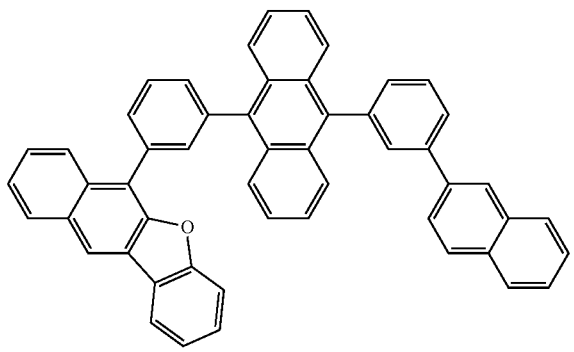
H103
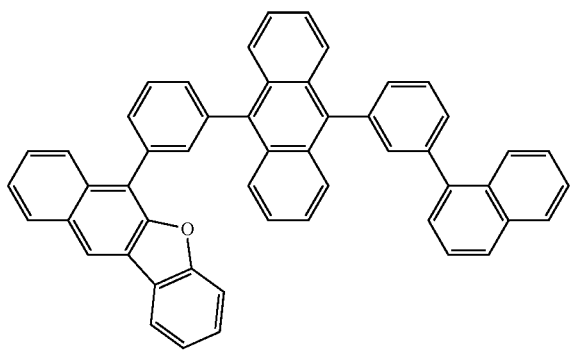
H104
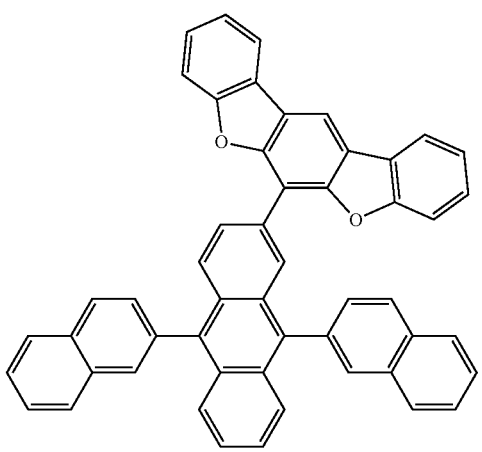
H105
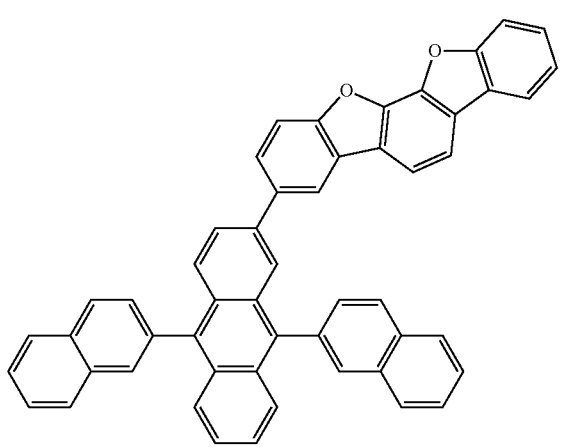
H106
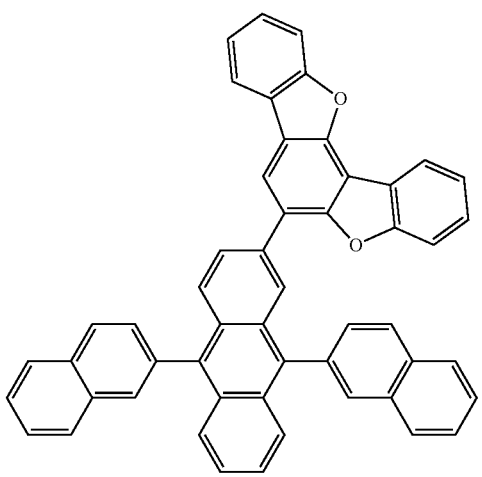

-continued
H107
H108
H109
H110
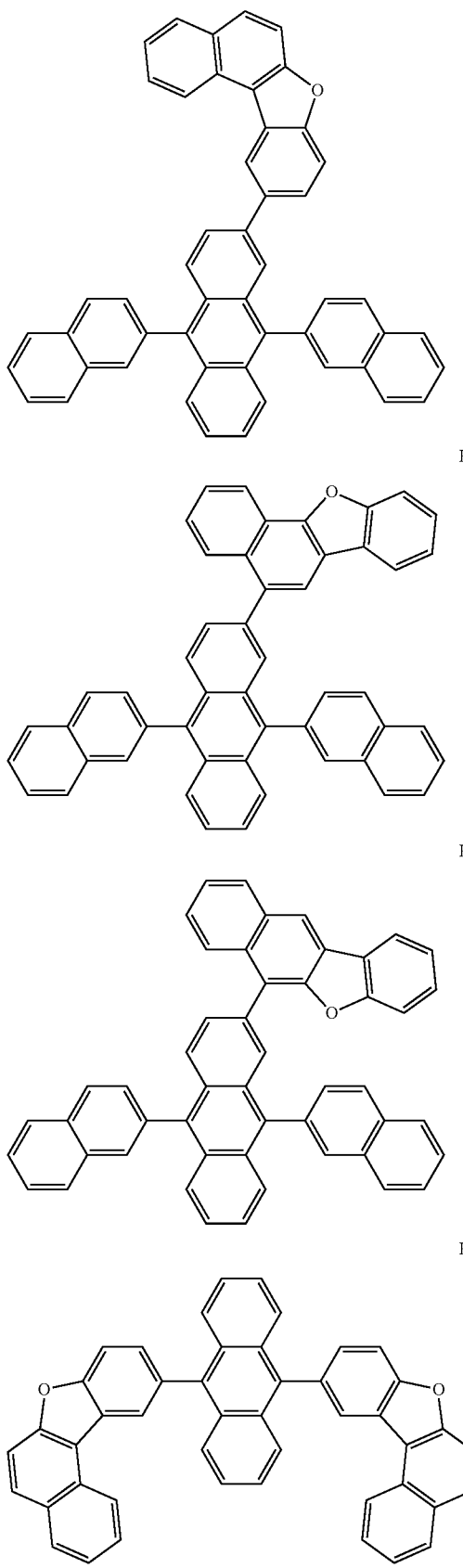
-continued
H111
H112
H113
H114
H115
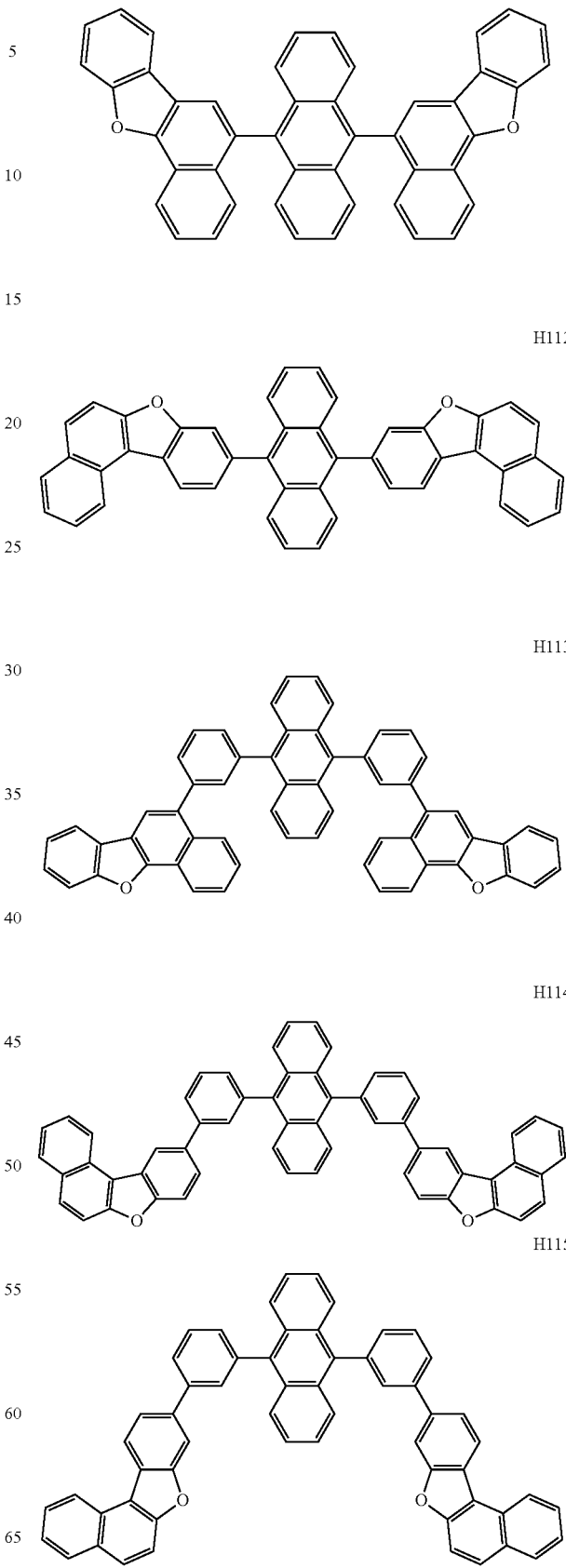

H116
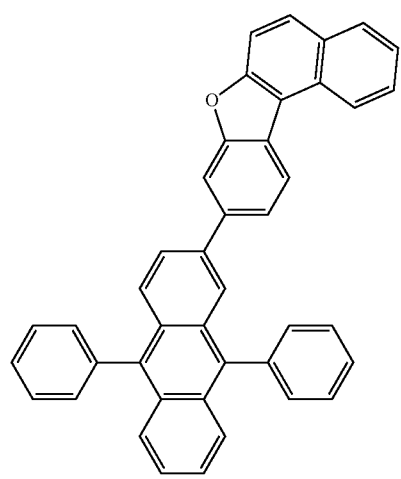
H117
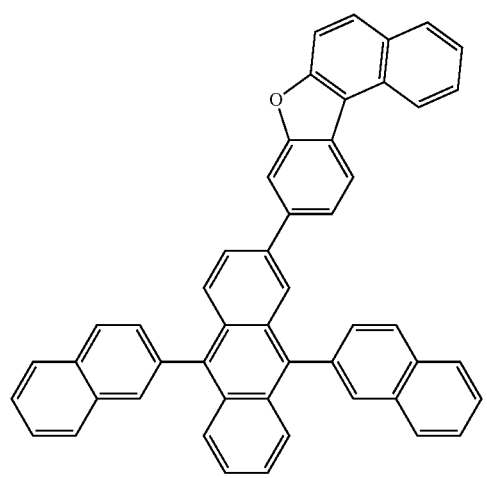
H118
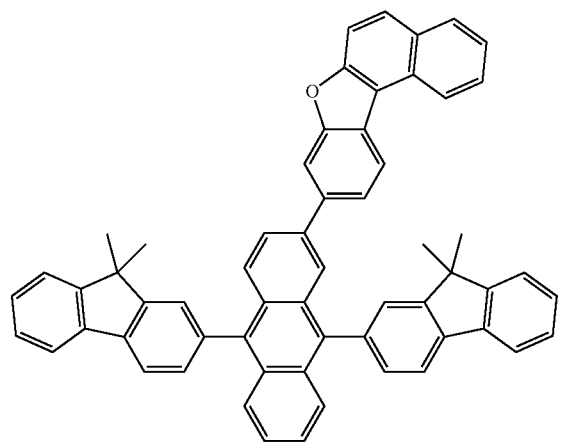
H119
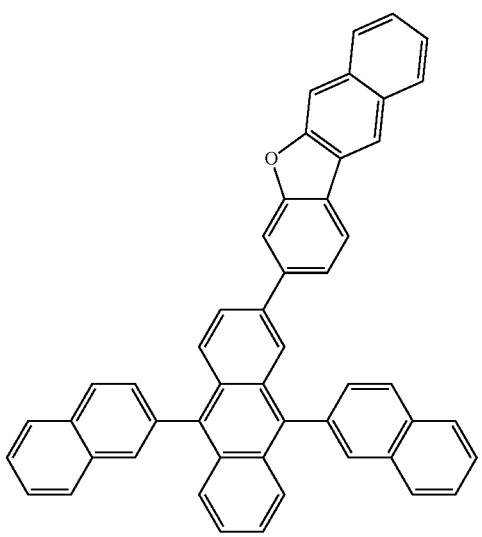
H120
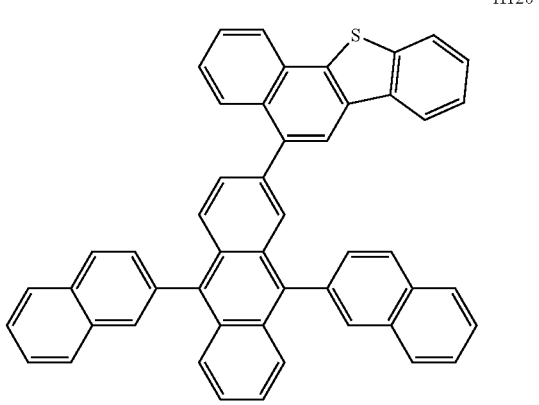
H121
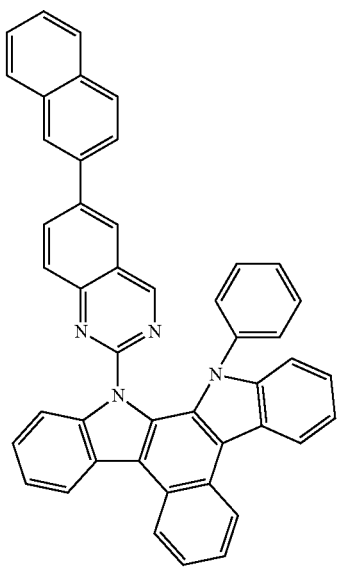

-continued

H122
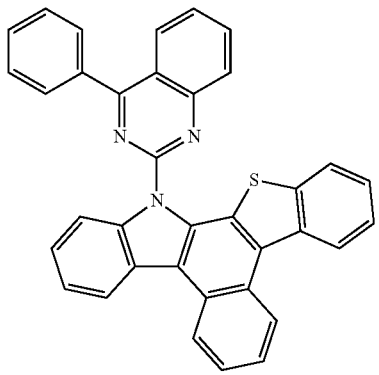

H123
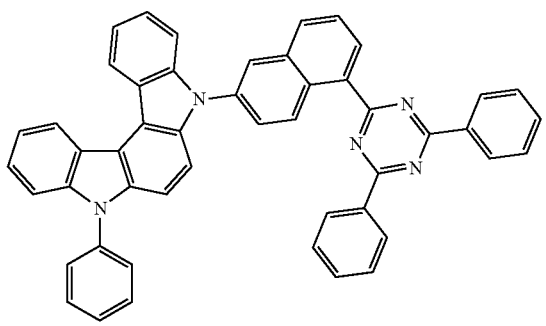

H124
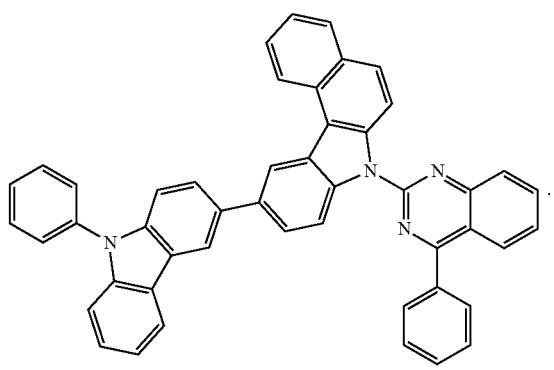

Phosphorescent Dopant

In one or more embodiments, the phosphorescent dopant may include at least one transition metal as a central metal. The phosphorescent dopant may include a monodentate ligand, a bidentate ligand, a tridentate ligand, a tetradentate ligand, a pentadentate ligand, a hexadentate ligand, or any combination thereof. The phosphorescent dopant may be electrically neutral.

For example, the phosphorescent dopant may include an organometallic compound represented by Formula 401:

$$M(L_{401})_{xc1}(L_{402})_{xc2}$$ Formula 401

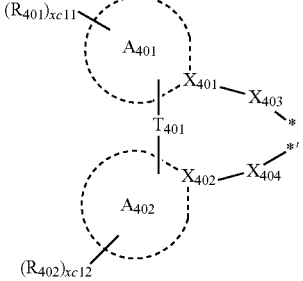

Formula 402 wherein, in Formulae 401 and 402,

M may be transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is 2 or more, two or more of $L_{401}$(s) may be identical to or different from each other, $L_{402}$ may be an organic ligand, and xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, —O—, —S—, —C(=O)—, —N($Q_{411}$)-, —C($Q_{411}$)($Q_{412}$)-, —C($Q_{411}$)=C($Q_{412}$)-, —C($Q_{411}$)=, or =C=, $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ are each the same as described in connection with $Q_1$, xc11 and xc12 may each independently be an integer from 0 to 10, and

* and *′ in Formula 402 each indicate a binding site to M in Formula 401.

For example, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 402 is 2 or more, two ring $A_{401}$(s) in two or more of $L_{401}$(s) may be optionally linked to each other via T$_{402}$, which is a linking group, and two ring A$_{402}$(s) may be optionally linked to each other via T$_{403}$, which is a linking group (see Compounds PD1 to PD4 and PD7). The variables T$_{402}$ and T$_{403}$ are the same as described in connection with T$_{401}$.

The group L$_{402}$ in Formula 401 may be an organic ligand. For example, L$_{402}$ may include a halogen group, a diketone group (for example, an acetylacetonate group), a carboxylic acid group (for example, a picolinate group), a —C(=O) group, an isonitrile group, a —CN group, a phosphorus group (for example, a phosphine group, a phosphite group, etc.), or any combination thereof.

The phosphorescent dopant may include, for example, one of Compounds PD1 to PD25, or any combination thereof:

PD1

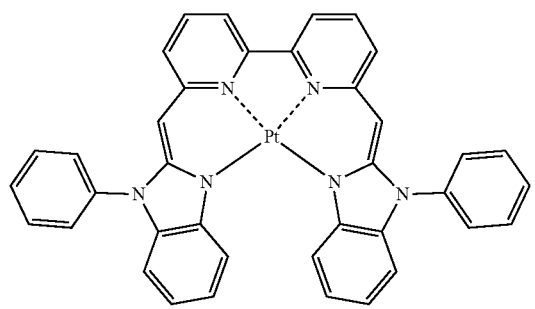

PD2

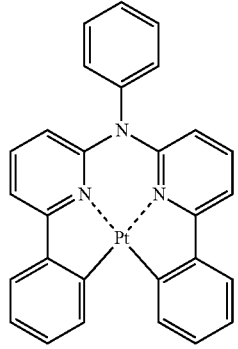

PD3

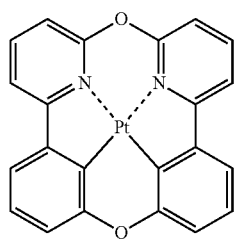

PD4

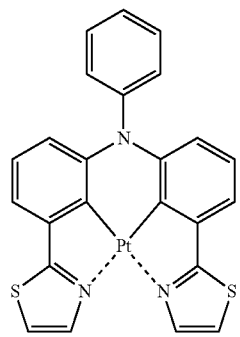

PD5

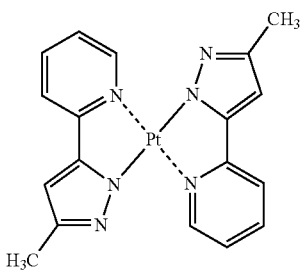

PD6

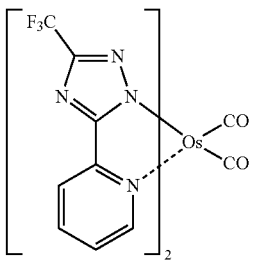

PD7

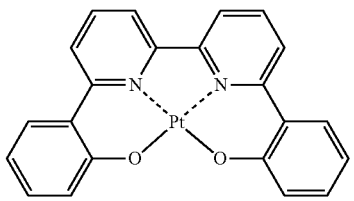

PD8

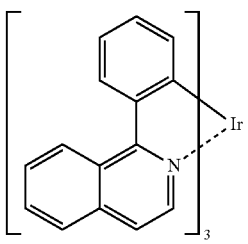

PD9

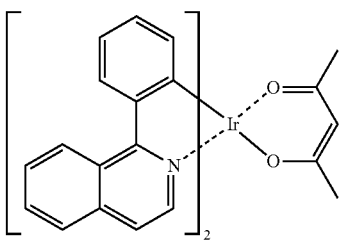

PD10

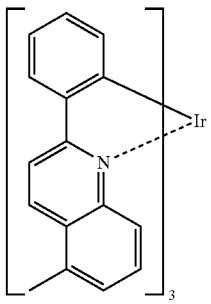

PD11 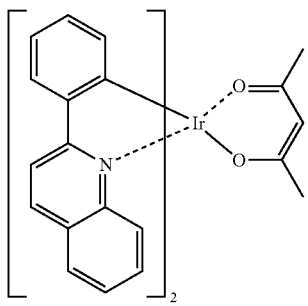
PD12 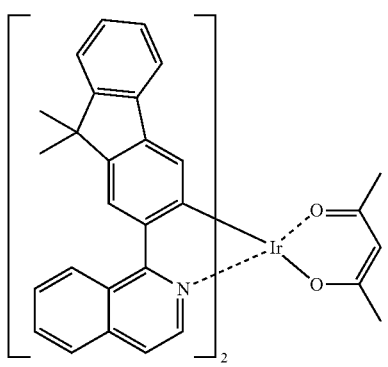
PD13 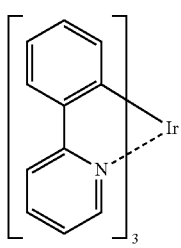
PD14 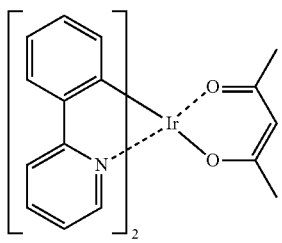
PD15 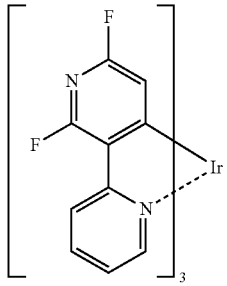
PD16 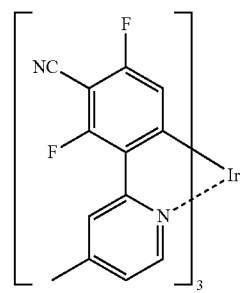
PD17 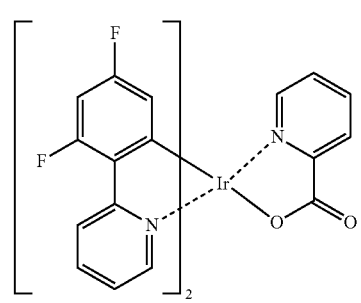
PD18 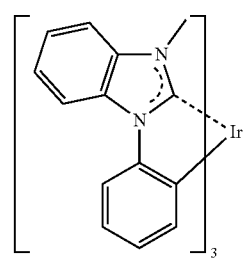
PD19 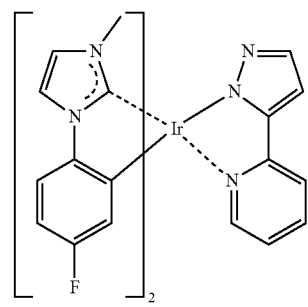
PD20 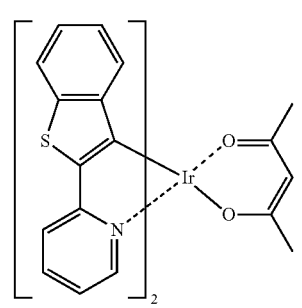

PD21

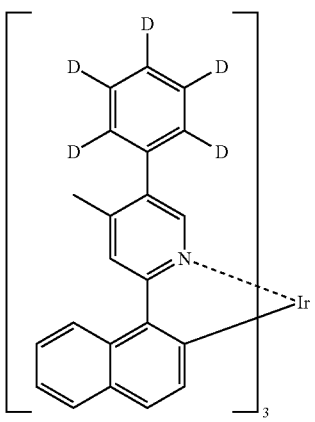

PD22

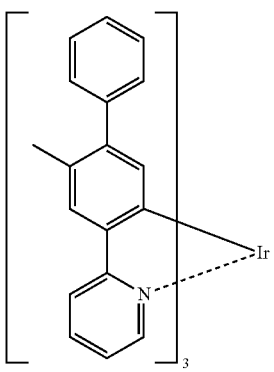

PD23

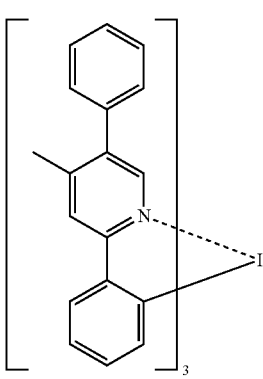

PD24

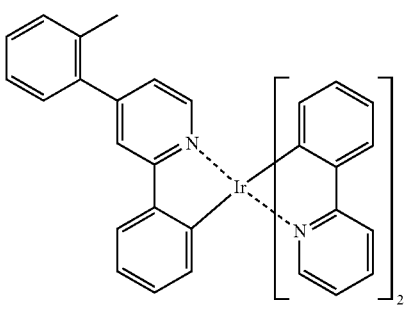

PD25

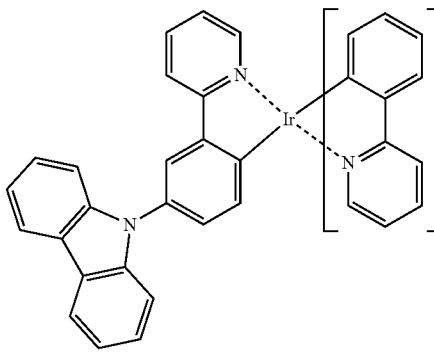

Fluorescent Dopant

The fluorescent dopant may include an amine group-containing compound, a styryl group-containing compound, or any combination thereof. In one or more embodiments, the fluorescent dopant may include a compound represented by Formula 501:

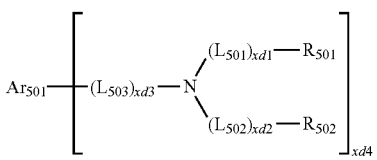

Formula 501 wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In one or more embodiments, $Ar_{501}$ in Formula 501 may be a condensed cyclic group (for example, an anthracene group, a chrysene group, or a pyrene group) in which three or more monocyclic groups are condensed together. In one or more embodiments, xd4 in Formula 501 may be 2.

In one or more embodiments, the fluorescent dopant may include: one of Compounds FD1 to FD36; DPVBi; DPAVBi; or any combination thereof:

73 74
FD1
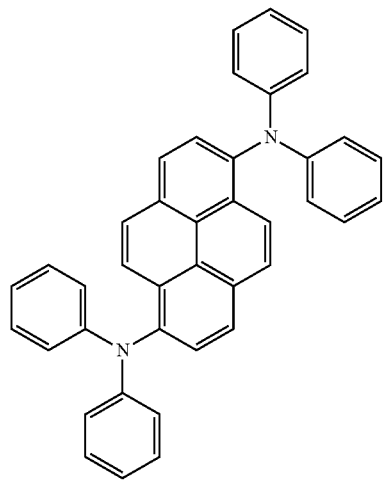
FD2
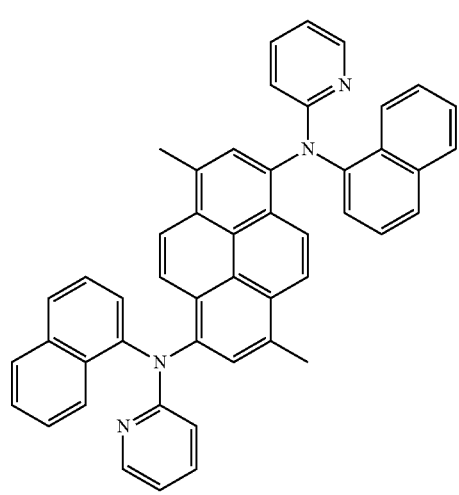
FD3
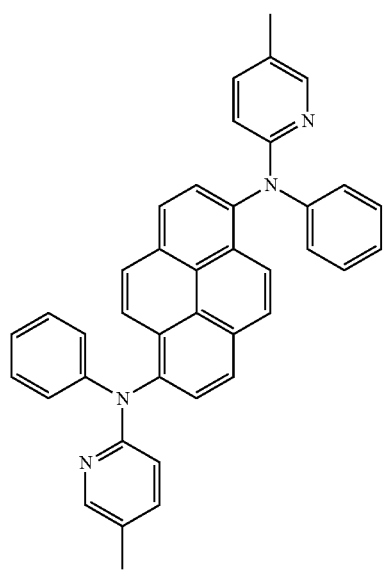
FD4
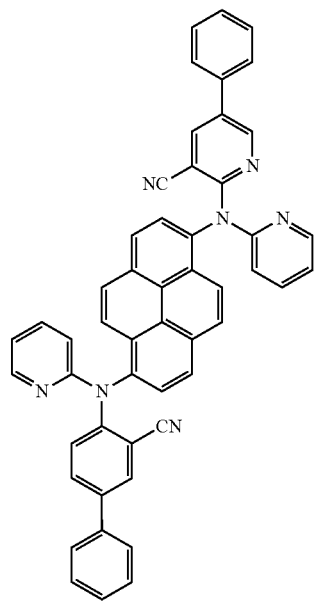
FD5
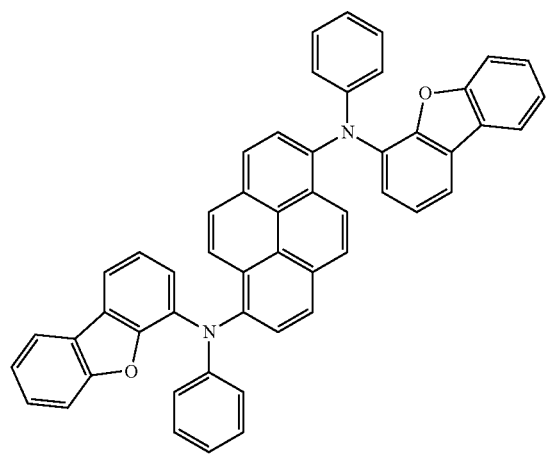
FD6
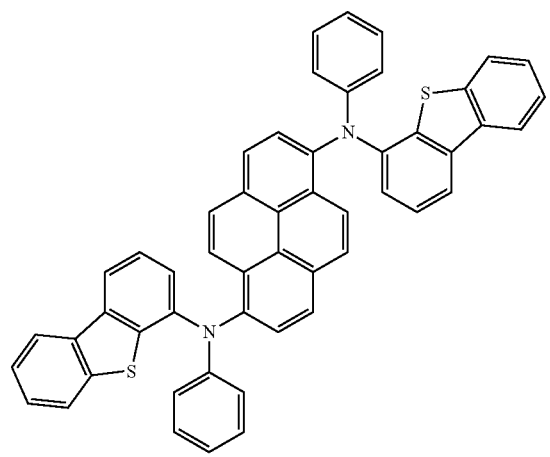

-continued
FD7
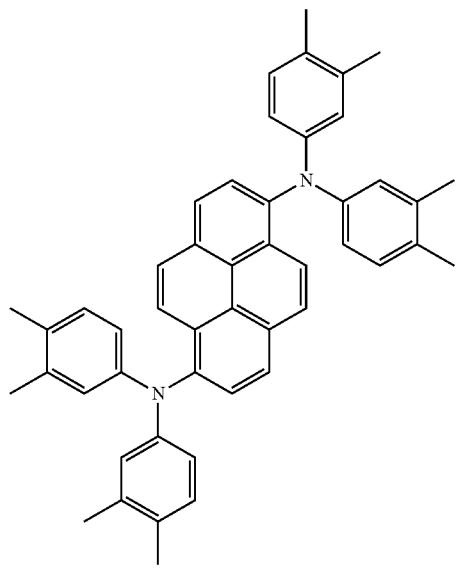
FD8
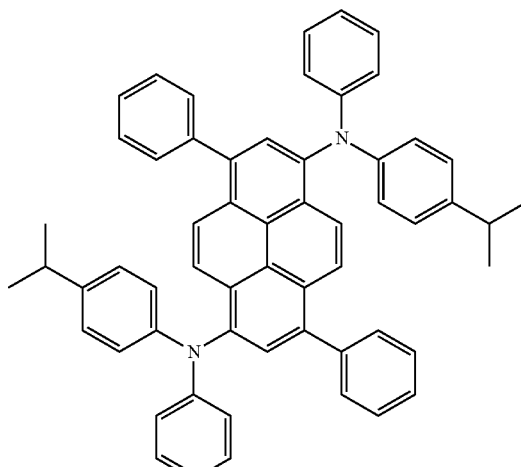
FD9
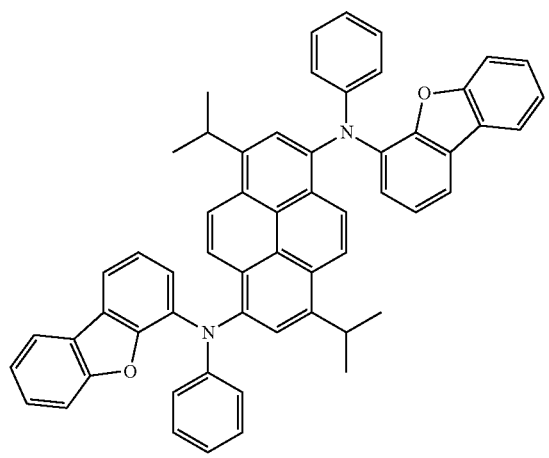
FD10
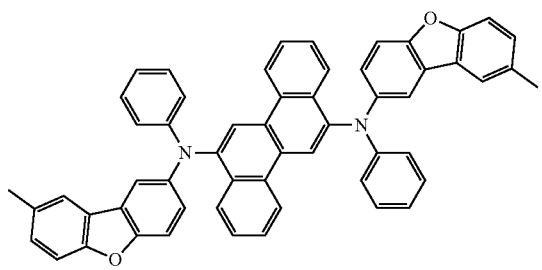
FD11
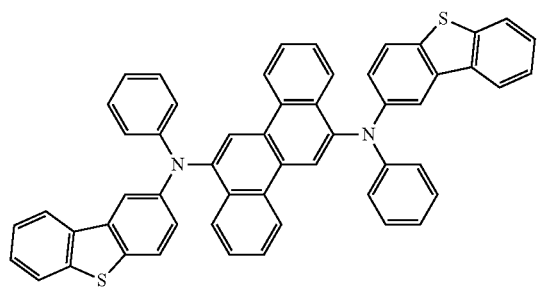
FD12
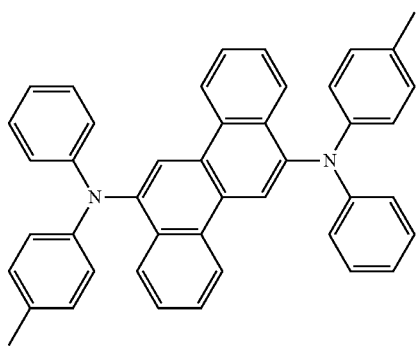

-continued
FD13
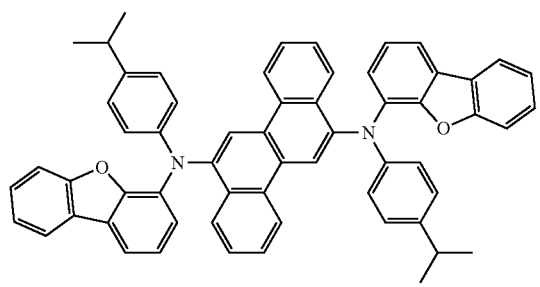
FD14
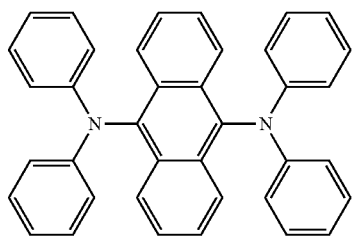
FD15
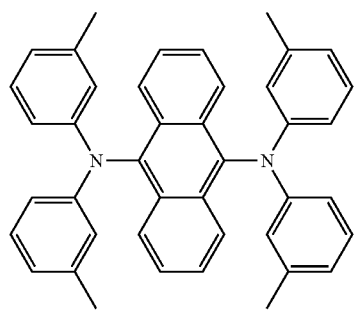
FD16
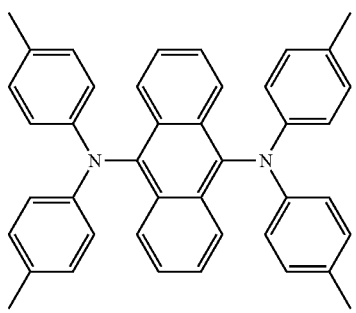
FD17
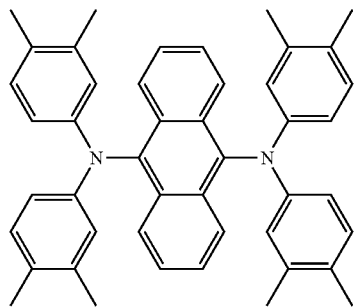
FD18
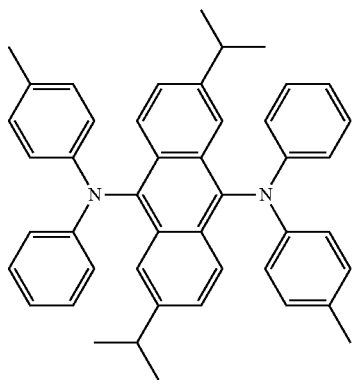
FD19
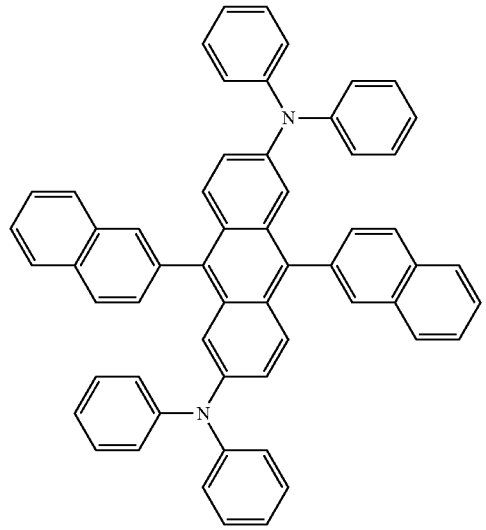
FD20
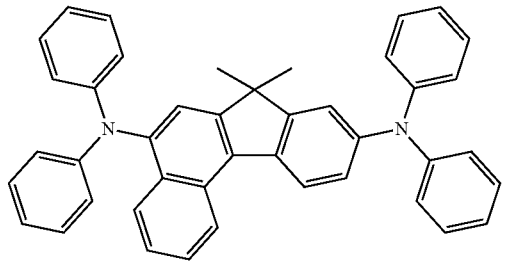

-continued
FD21
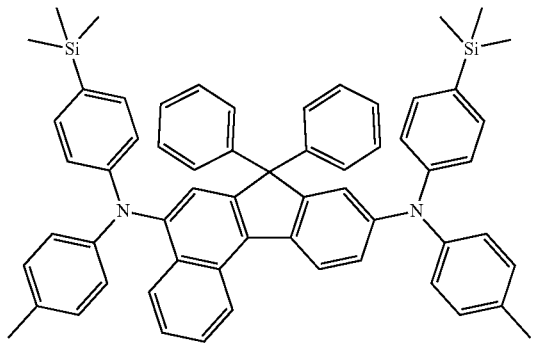
FD22
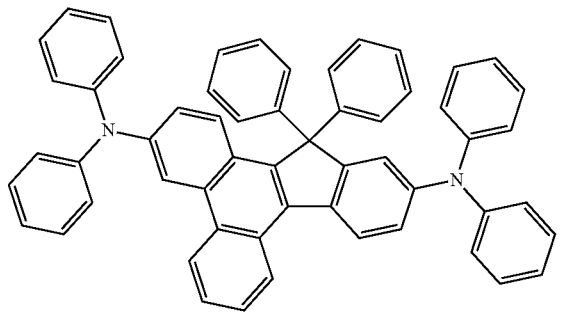
FD23
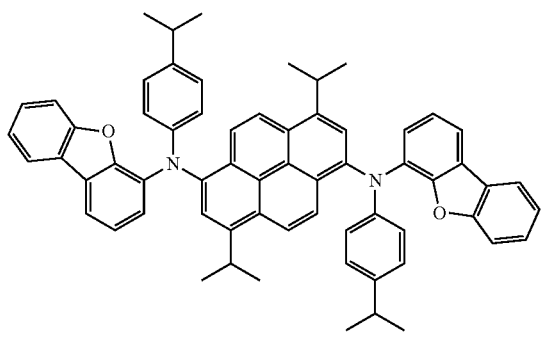
FD24
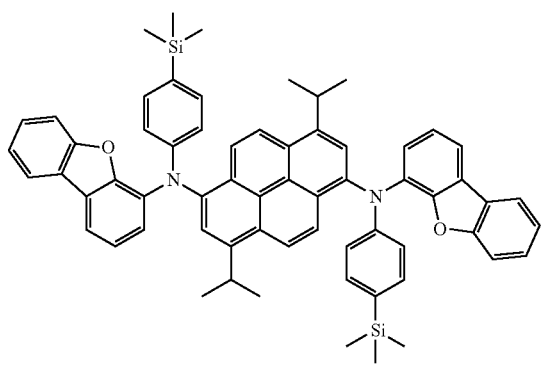
FD25
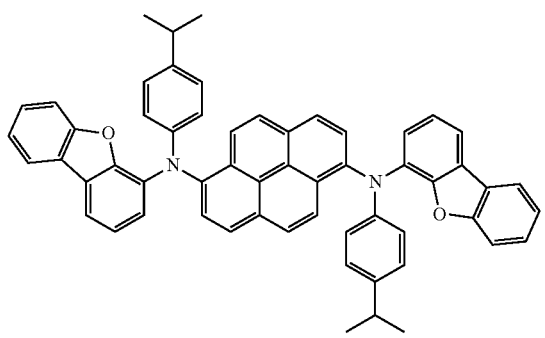
FD26
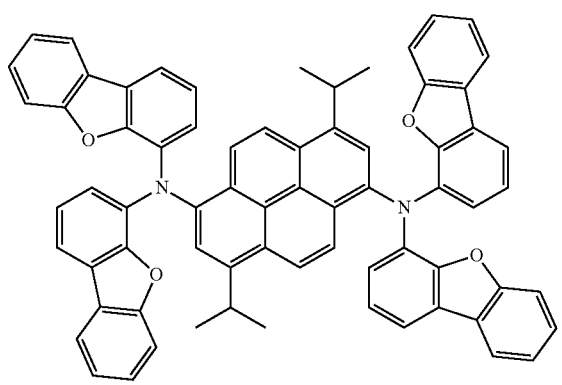
FD27
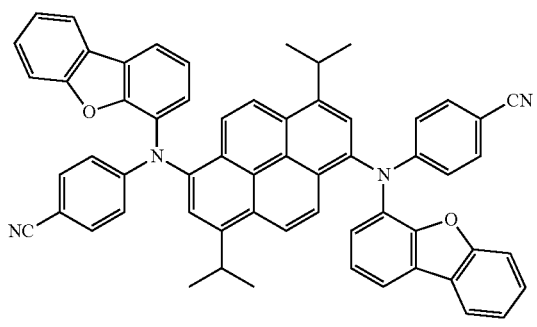
FD28
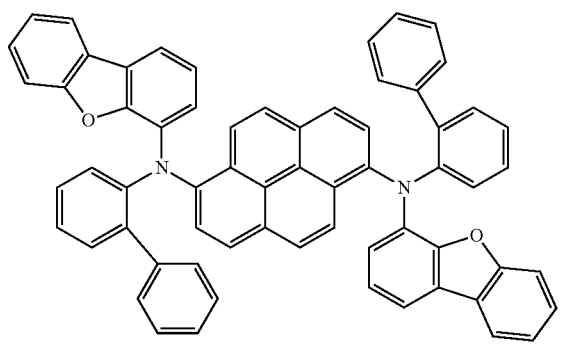

-continued
FD29
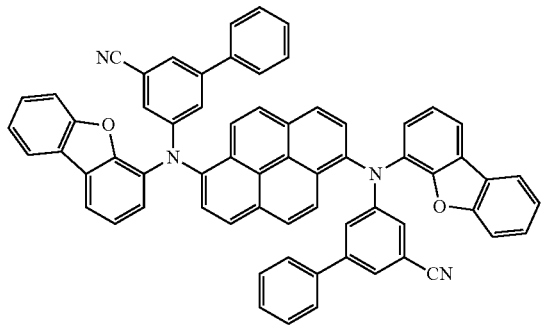
FD30
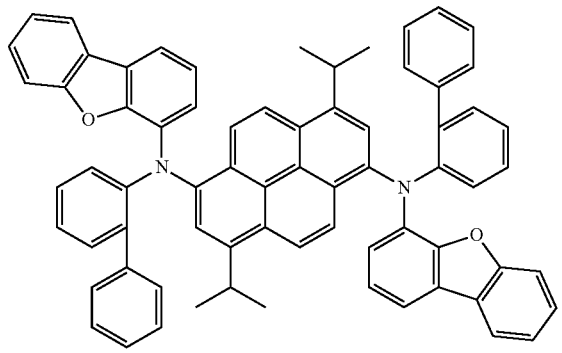
FD31
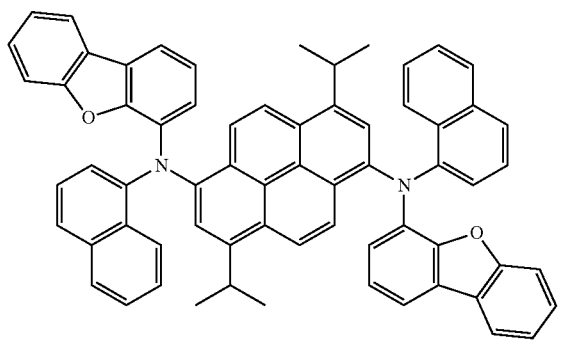
FD32
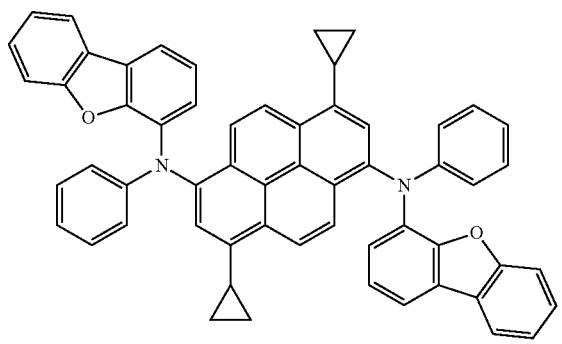
FD33
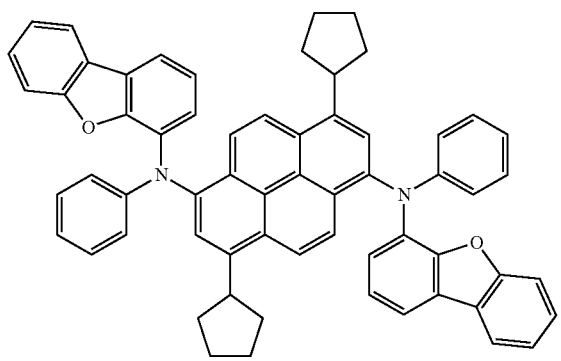
FD34
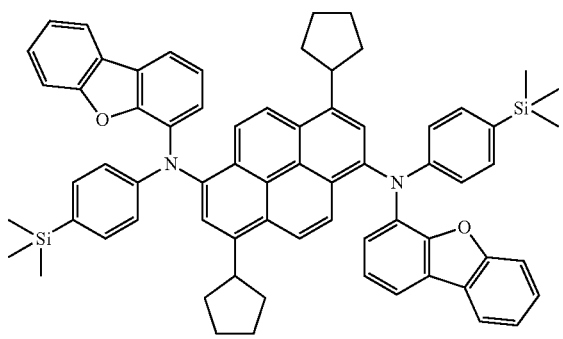
FD35
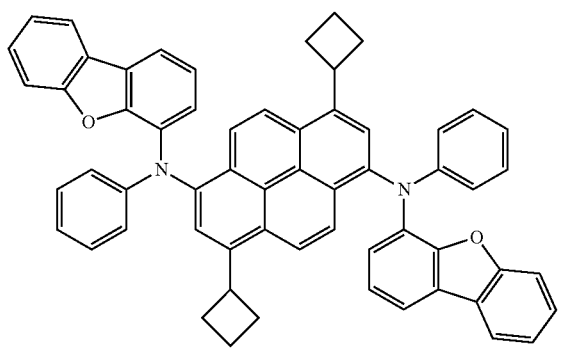
FD36
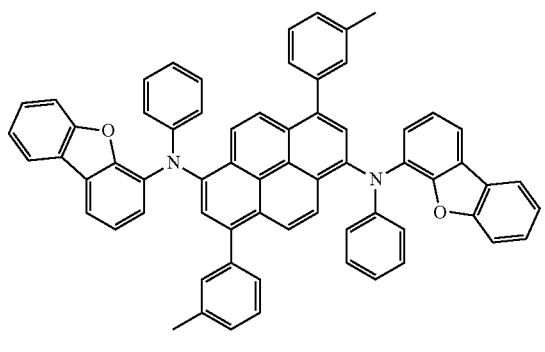

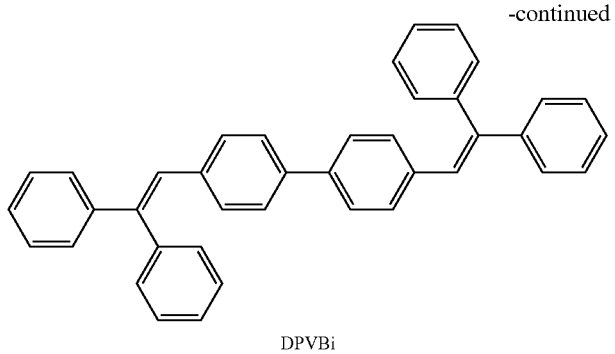

DPVBi

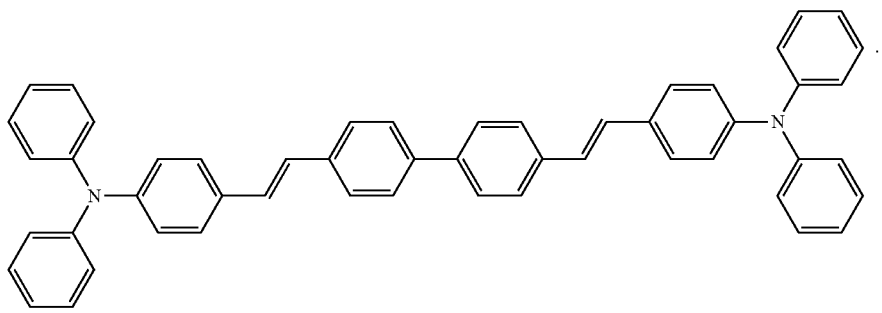

DPAVBi

Delayed Fluorescence Material

The emission layer may include a delayed fluorescence material. As described herein, the delayed fluorescence material may be selected from compounds capable of emitting delayed fluorescent light based on a delayed fluorescence emission mechanism. The delayed fluorescence material included in the emission layer may act as a host or a dopant depending on the type of other materials included in the emission layer.

In one or more embodiments, the difference between the triplet energy level in electron volt (eV) of the delayed fluorescence material and the singlet energy level (eV) of the delayed fluorescence material may be greater than or equal to about 0 eV and less than or equal to about 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the emission efficiency of the light-emitting device 10 may be improved.

In one or more embodiments, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and ii) a material including a $C_8$-$C_{60}$ polycyclic group in which two or more cyclic groups are condensed while sharing boron (B).

In one or more embodiments, the delayed fluorescence material may include at least one of Compounds DF1 to DF9:

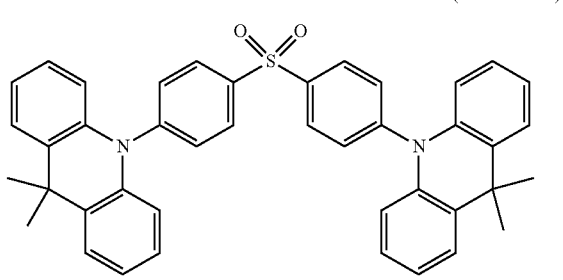

DF1(DMAC-DPS)

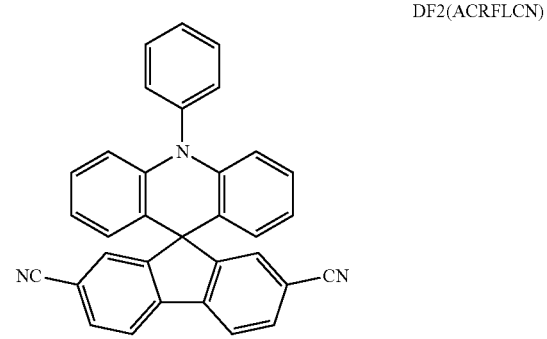

DF2(ACRFLCN)

DF3(ACRSA)

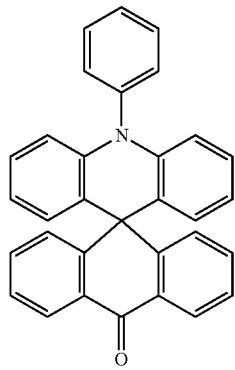

DF4(CC2TA)

DF5(PIC-TRZ)

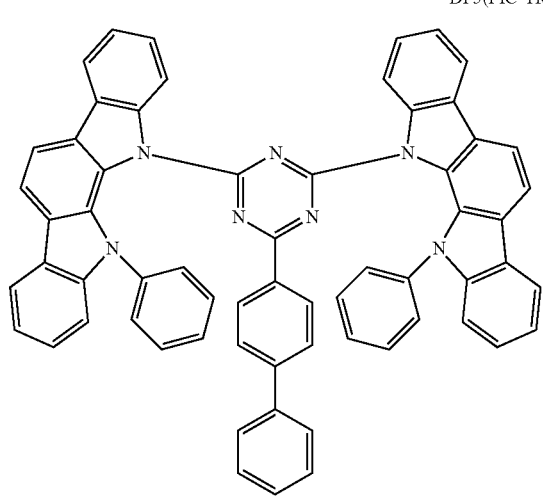

DF6(PIC-TRZ2)

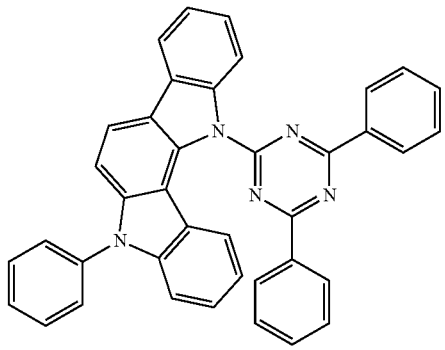

DF7(PXZ-TRZ)

DF8(DABNA-1)

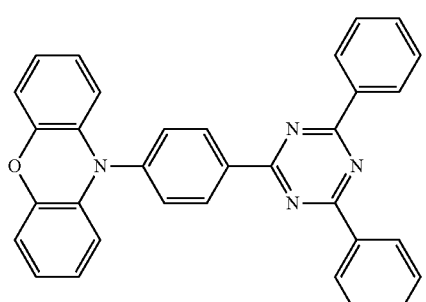

DF9(DABNA-2)

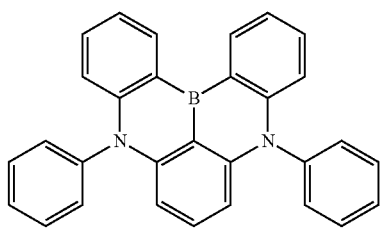

Quantum Dot

The emission layer may include a quantum dot. The diameter of the quantum dot may be, for example, in a range of about 1 nm to about 10 nm. The quantum dot may be synthesized by a wet chemical process, a metal organic chemical vapor deposition process, a molecular beam epitaxy process, or any process similar thereto.

According to the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal so that the growth of quantum dot particles can be controlled through a process which is more easily performed than vapor deposition methods, such as metal organic chemical vapor deposition (MOCVD) or molecular beam epitaxy (MBE), and which requires low costs.

The quantum dot may include a semiconductor compound of Groups II-VI, a semiconductor compound of Groups III-V, a semiconductor compound of Groups a semiconductor compound of Groups I, III, and VI, a semiconductor compound of Groups IV-VI, an element or a compound of Group IV; or any combination thereof.

Examples of the semiconductor compound of Groups II-VI are a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the semiconductor compound of Groups III-V are a binary compound, such as GaN, GaP, GaAs, GaSb, AlN, AlP, AlAs, AlSb, InN, InP, InAs, InSb, or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or the like; or any combination thereof. The semiconductor compound of Groups III-V may further include an element of Group II. Examples of the semiconductor compound of Groups III-V further including the element of Group II are InZnP, InGaZnP, InAlZnP, etc.

Examples of the semiconductor compound of Groups III-VI are: a binary compound, such as GaS, GaSe, $Ga_2Se_3$, GaTe, InS, InSe, $In_2S_3$, $In_2Se_3$, or InTe; a ternary compound, such as $InGaS_3$, or $InGaSe_3$; and any combination thereof. Examples of the semiconductor compound of Groups I, III, and VI are: a ternary compound, such as AgInS, $AgInS_2$, CuInS, $CuInS_2$, $CuGaO_2$, $AgGaO_2$, or $AgAlO_2$; or any combination thereof.

Examples of the semiconductor compound of Groups IV-VI are: a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, to such as SnPbSSe, SnPbSeTe, or SnPbSTe; or any combination thereof.

The element or compound of Group IV may include: a single element compound, such as Si or Ge; a binary compound, such as SiC or SiGe; or any combination thereof. Each element included in a multi-element compound such as the binary compound, the ternary compound, and the quaternary compound, may exist at a uniform concentration or non-uniform concentration in a particle.

The quantum dot may have a single structure or a dual core-shell structure. In the case of the quantum dot having a single structure, the concentration of each element included in the corresponding quantum dot may be uniform. In one or more embodiments, the material contained in the core and the material contained in the shell may be different from each other. The shell of the quantum dot may act as a protective layer to prevent chemical degeneration of the core to maintain semiconductor characteristics and/or as a charging layer to impart electrophoretic characteristics to the quantum dot. The shell may be single-layered or multi-layered. The interface between the core and the shell may have a concentration gradient in which the concentration of an element existing in the shell is decreased as the element is located closer to the center of the core.

Examples of the shell of the quantum dot may be an oxide of a metal, a metalloid, or a non-metal, a semiconductor compound, and any combination thereof. Examples of the oxide of a metal, a metalloid, or a non-metal are a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; and any combination thereof. Examples of the semiconductor compound are, as described herein, the semiconductor compound of Groups II-VI; the semiconductor compound of Groups III-V; the semiconductor compound of Groups III-VI; the semiconductor compounds of Groups I, III, and VI; the semiconductor compound of Groups IV-VI; and any combination thereof. In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The full width at half maximum (FWHM) of an emission wavelength spectrum of the quantum dot may be about 45 nm or less, for example, about 40 nm or less, for example, about 30 nm or less, and within these ranges, color purity or color gamut may be increased. In addition, since the light emitted through the quantum dot is emitted in all directions, the wide viewing angle may be improved.

In addition, the quantum dot may be a generally spherical particle, a generally pyramidal particle, a generally multi-armed particle, a generally cubic nanoparticle, a generally nanotube-shaped particle, a generally nanowire-shaped particle, a generally nanofiber-shaped particle, or a generally nanoplate-shaped particle.

Because the energy band gap may be adjusted by controlling the size of the quantum dot, light having various wavelength bands may be obtained from the quantum dot emission layer. Accordingly, by using quantum dots of different sizes, a light-emitting device that emits light of various wavelengths may be implemented. In one or more embodiments, the size of the quantum dot may be selected to emit red, green and/or blue light. In addition, the size of the quantum dot may be configured to emit white light by combining light of various colors.

Electron Transport Region in Interlayer 130

The electron transport region may have: i) a single-layered structure consisting of a single layer consisting of a single material, ii) a single-layered structure consisting of a single layer consisting of a plurality of different materials, or iii) a multi-layered structure including a plurality of layers including different materials. The electron transport region may include a hole blocking layer, an electron transport layer, an electron injection layer, or any combination thereof.

In an embodiment, the electron transport region may have an electron transport layer/electron injection layer structure, a hole blocking layer/electron transport layer/electron injection layer structure, and the like, wherein, for each structure, constituting layers are sequentially stacked from an emission layer. The electron transport region (for example, the hole blocking layer or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601 below:

Formula 601 wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ are each the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$(s) may be linked to each other via a single bond. In one or more embodiments, $Ar_{601}$ in Formula 601 may be a substituted or unsubstituted anthracene group.

In an embodiment, the electron transport region may include a compound represented by Formula 601-1:

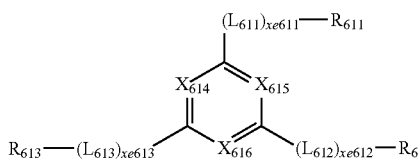

Formula 601-1 wherein, in Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ are each the same as described in connection with $L_{601}$, xe611 to xe613 are each the same as described in connection with xe1, $R_{611}$ to $R_{613}$ are each the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), tris-(8-hydroxyquinoline)aluminum (Alq$_3$), bis(2-methyl-8-quinolinolato-N1,O8)-(1,1'-biphenyl-4-olato)aluminum (BAlq), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ), or any combination thereof:

ET1

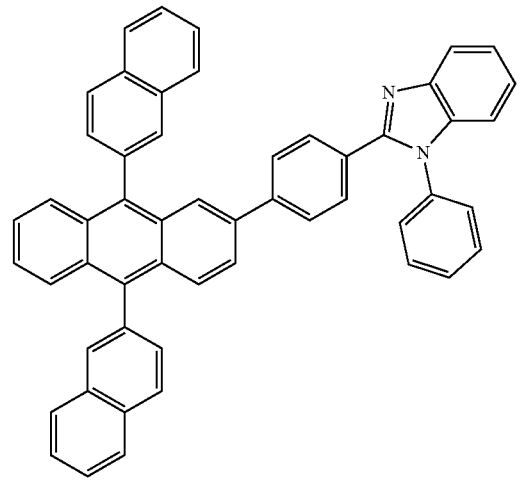

ET2

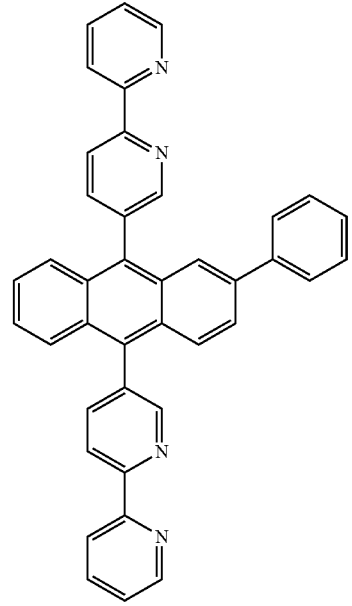

ET3
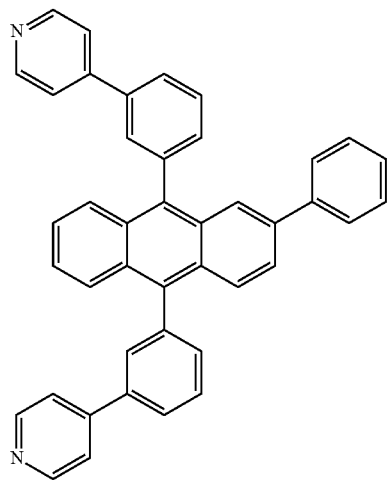
ET4
ET6
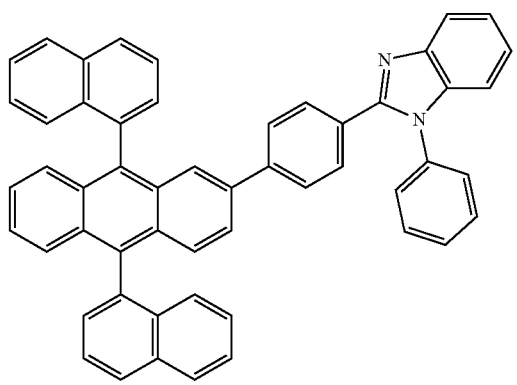
ET7
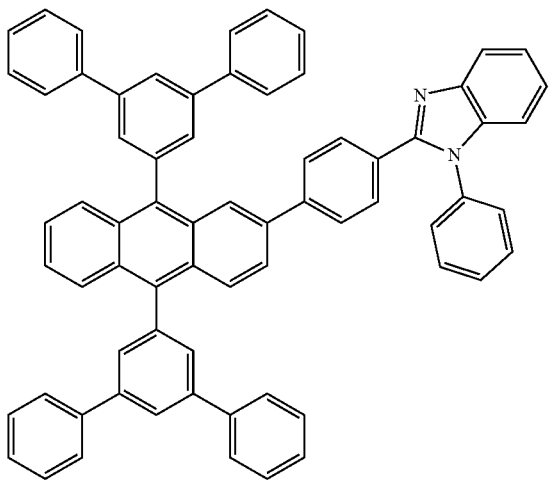
ET5
ET8
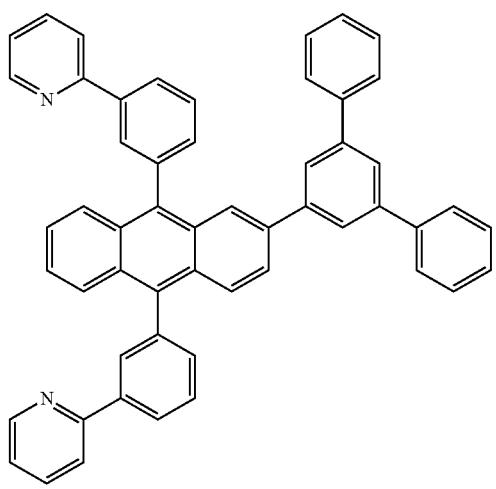

ET9
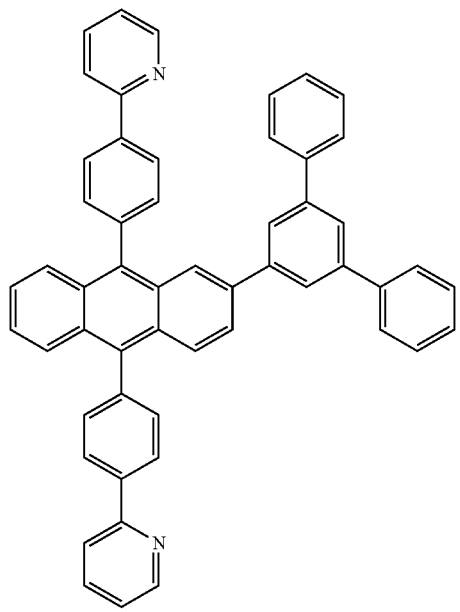
ET10
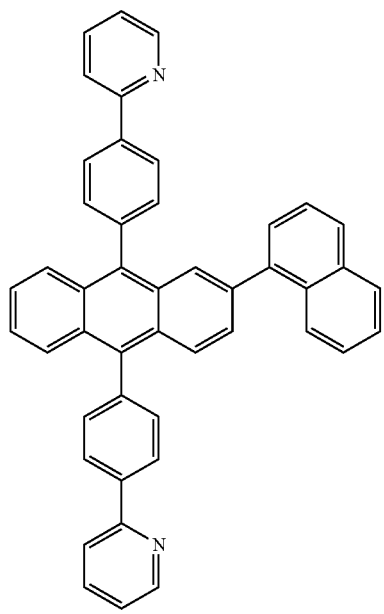
ET11
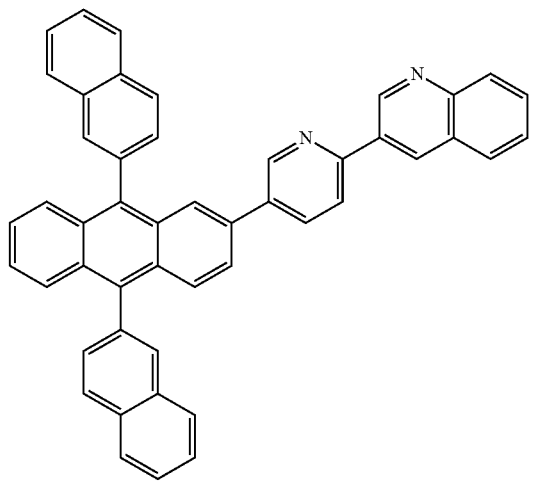
ET12
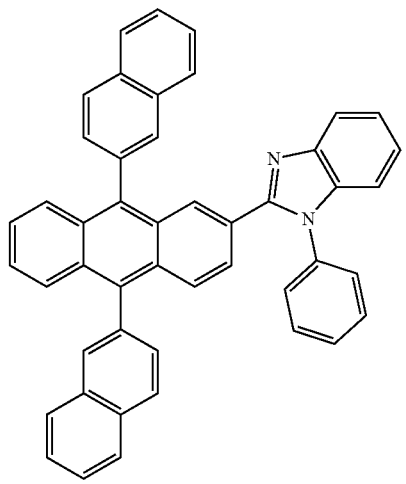
ET13
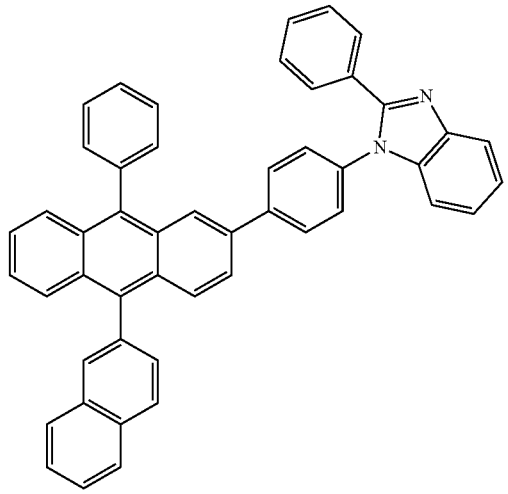

ET14
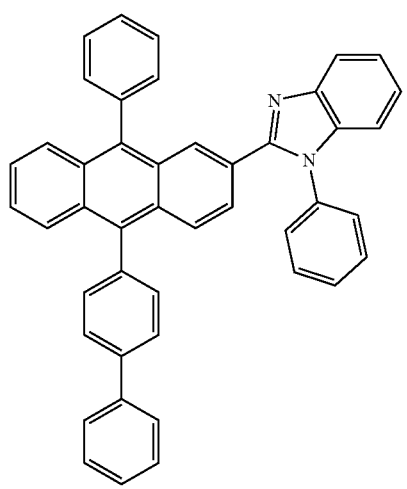
ET15
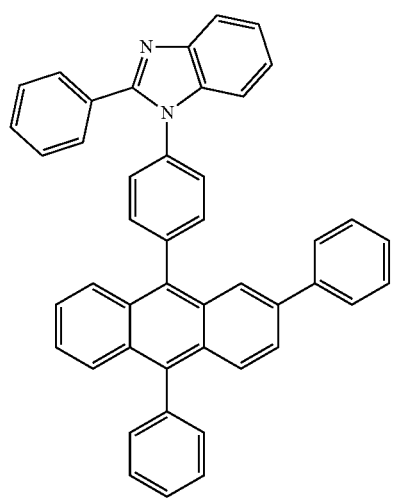
ET16
ET17
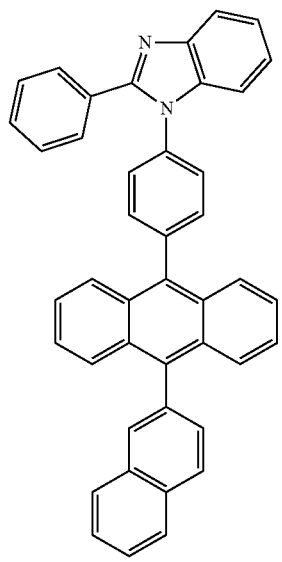
ET18
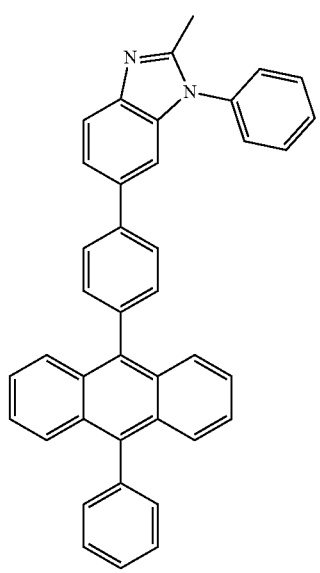
ET19
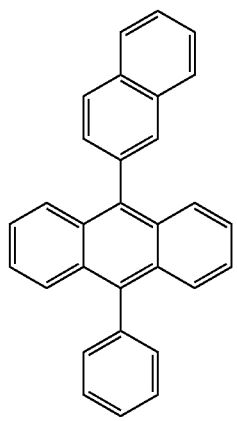

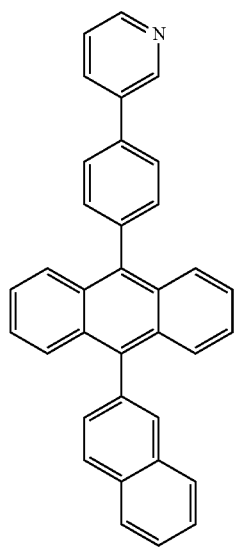
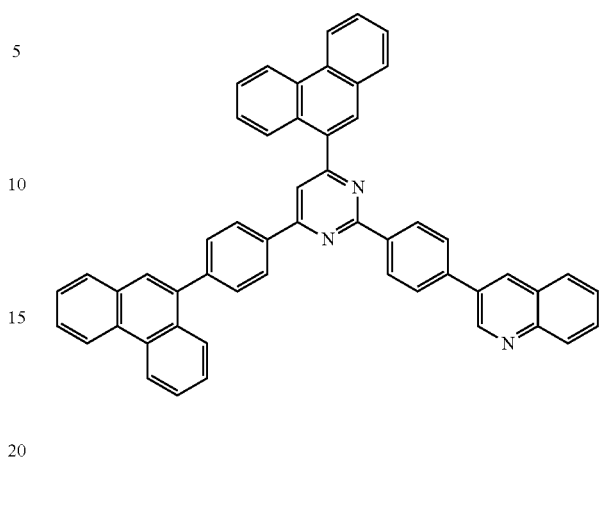
ET20
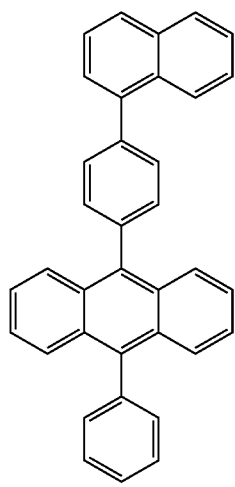
ET21
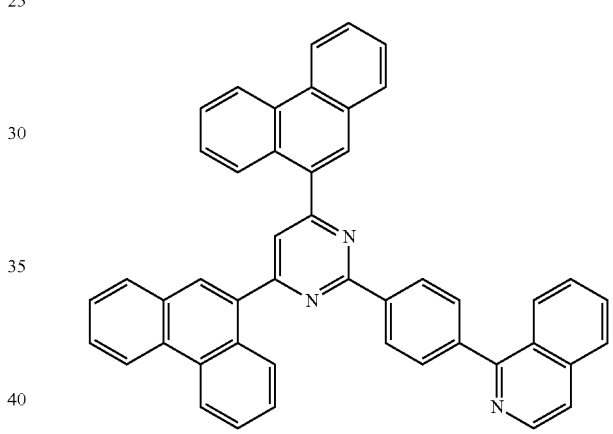
ET23
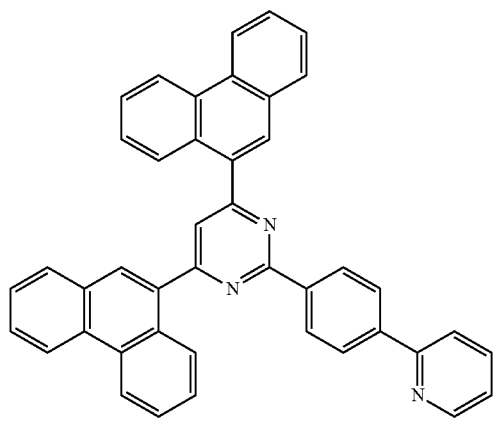
ET22
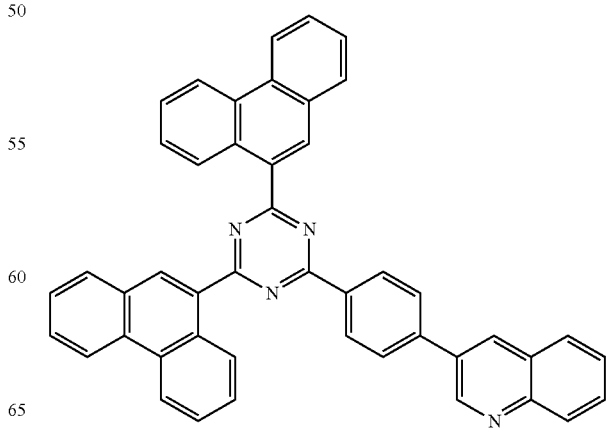
ET24
ET25

ET26
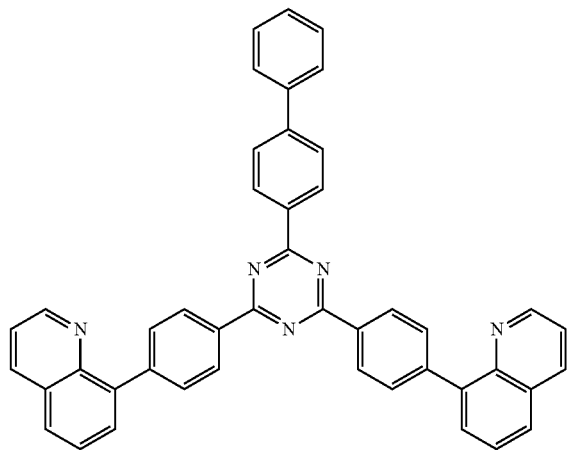
ET27
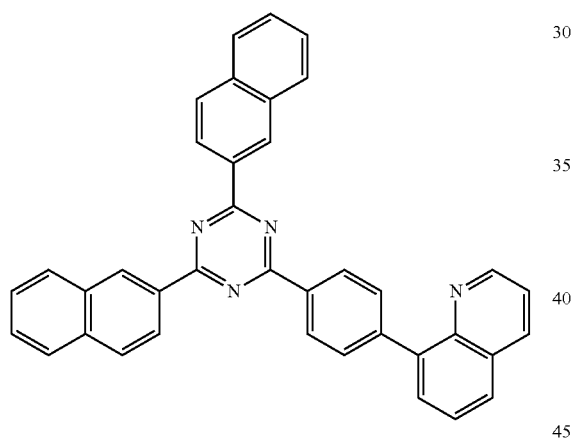
ET28
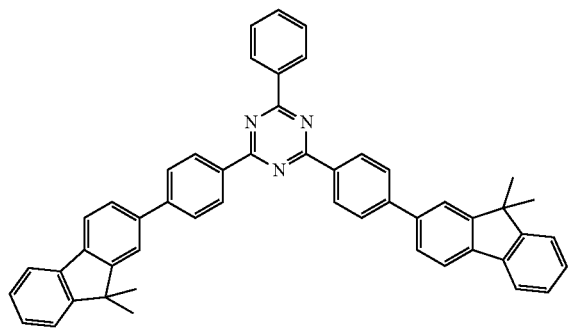
ET29
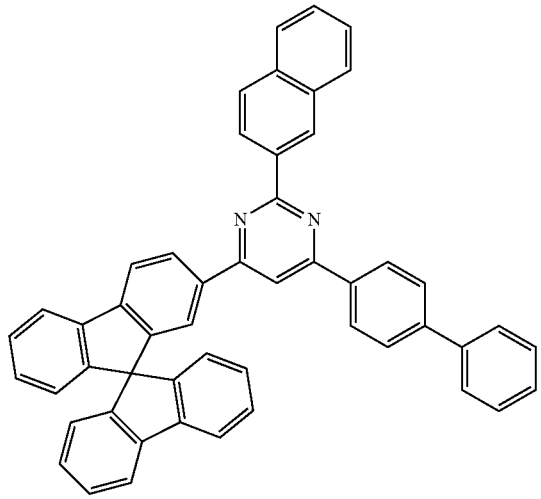
ET30
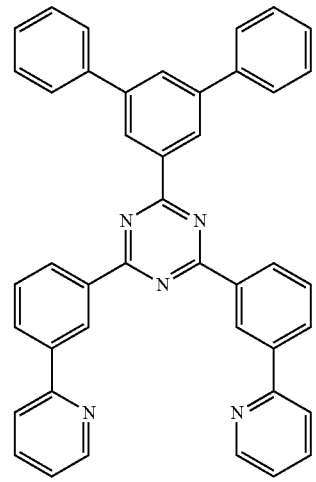
ET31
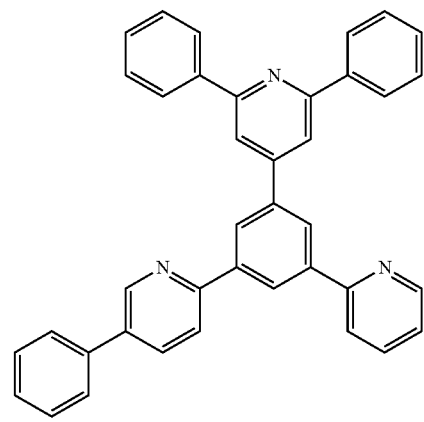

ET32
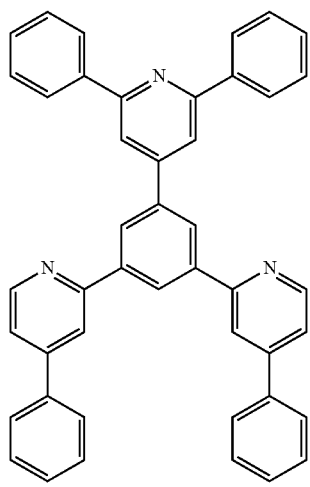
ET33
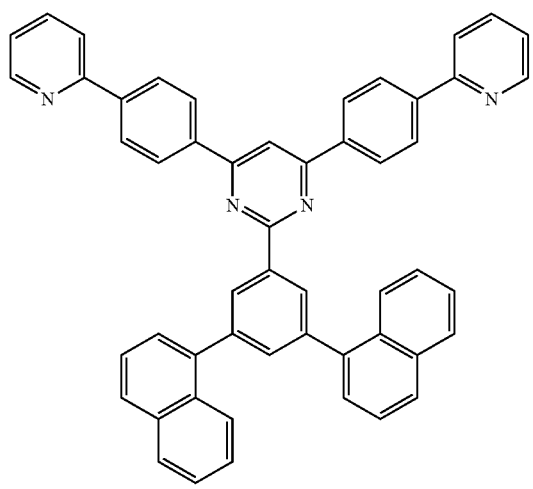
ET34
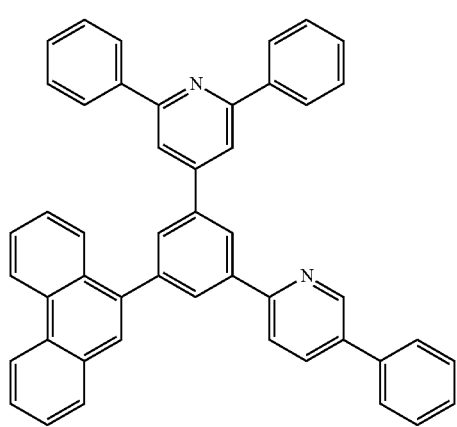
ET35
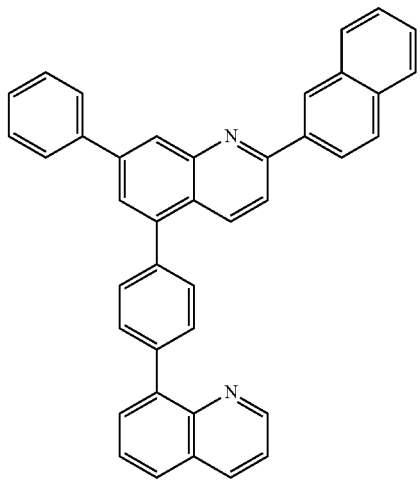
ET36
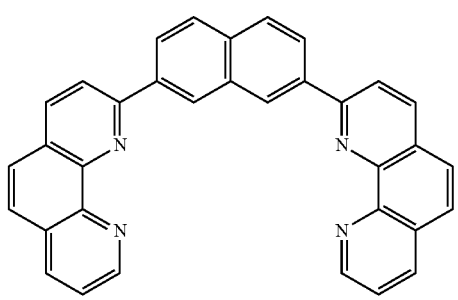
ET37
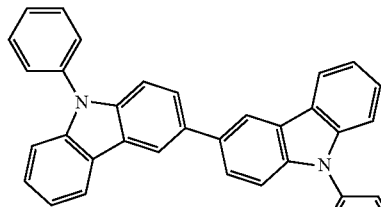
ET38
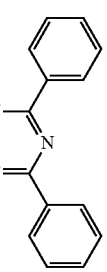

ET39
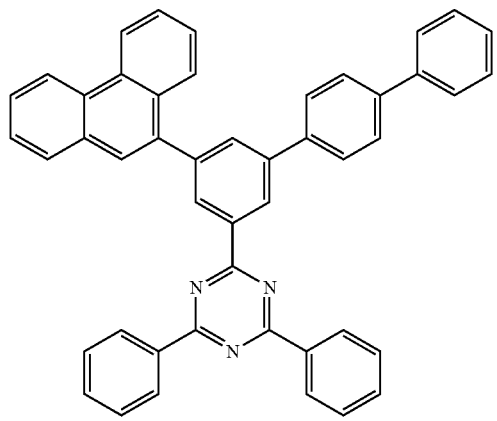
ET40
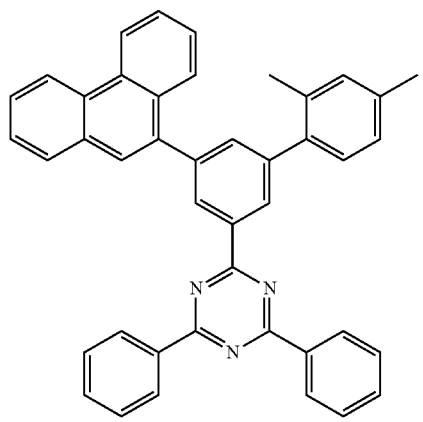
ET41
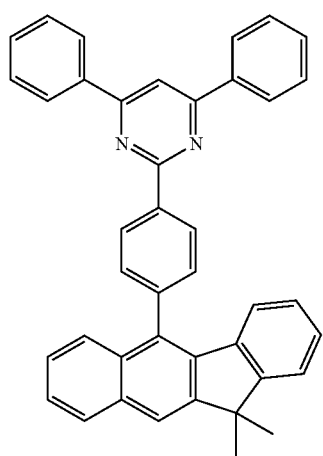
ET42
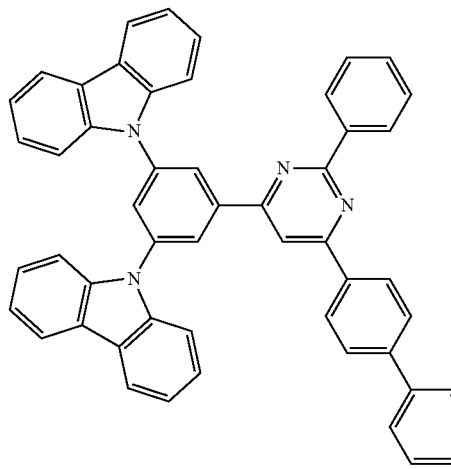
ET43
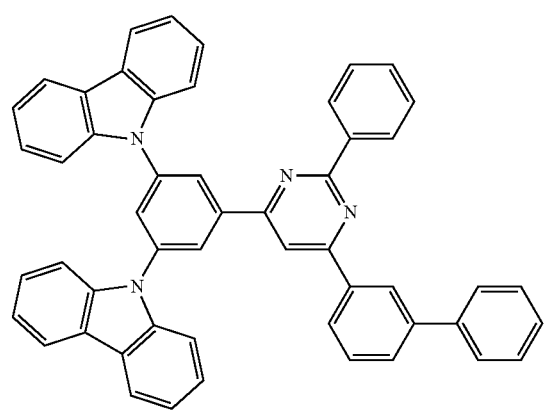
ET44
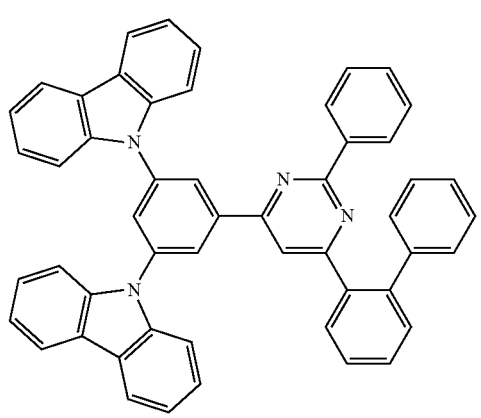
ET45
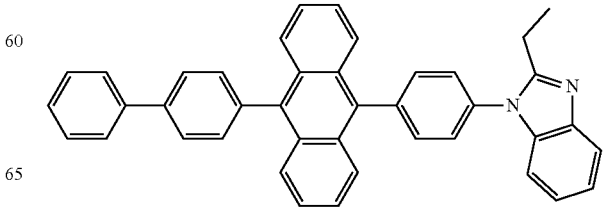

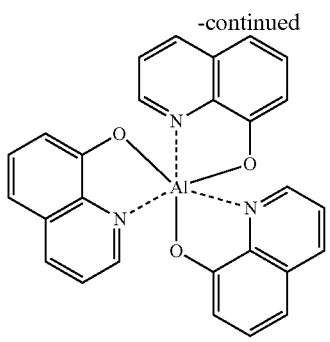

Alq₃

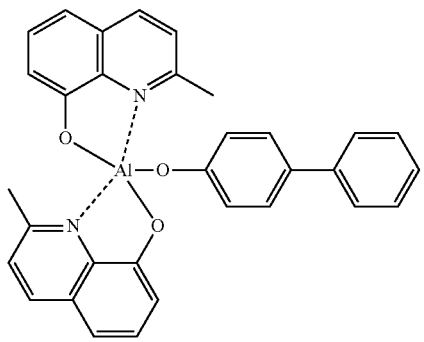

BAlq

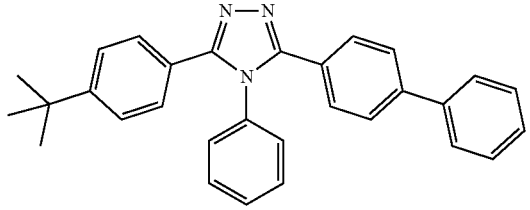

TAZ

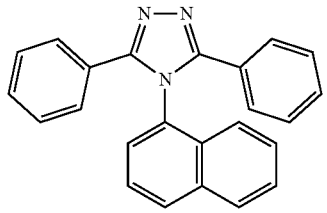

NTAZ

The thickness of the electron transport region may be from about 100 Å to about 5,000 Å, for example, about 160 Å to about 4,000 Å. When the electron transport region includes the hole blocking layer, the electron transport layer, or any combination thereof, the thickness of the hole blocking layer or electron transport layer may each independently be from about 20 Å to about 1,000 Å, for example, about 30 Å to about 300 Å, and the thickness of the electron transport layer may be from about 100 Å to about 1,000 Å, for example, about 150 Å to about 500 Å. When the thicknesses of the hole blocking layer and/or the electron transport layer are within these ranges, satisfactory electron transporting characteristics may be obtained without a substantial increase in driving voltage. The electron transport region (for example, the electron transport layer in the electron transport region) may further include, in addition to the materials described above, a metal-containing material.

The metal-containing material may include an alkali metal complex, an alkaline earth metal complex, or any combination thereof. The metal ion of an alkali metal complex may be a Li ion, a Na ion, a K ion, a Rb ion, or a Cs ion, and the metal ion of an alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (lithium quinolate, LiQ) or ET-D2:

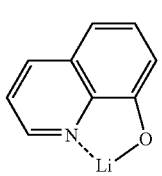

ET-D1

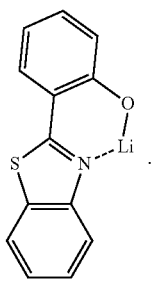

ET-D2

The electron transport region may include an electron injection layer that facilitates the injection of electrons from the second electrode 150. The electron injection layer may directly contact the second electrode 150. The electron injection layer may have: i) a single-layered structure consisting of a single layer consisting of a single material, ii) a single-layered structure consisting of a single layer consisting of a plurality of different materials, or iii) a multi-layered structure including a plurality of layers including different materials. The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof. The alkali metal-containing compound, the alkaline earth metal-containing compound, and the rare earth metal-containing compound may be oxides, halides (for example, fluorides, chlorides, bromides, or iodides), or tellurides of the alkali metal, the alkaline earth metal, and the rare earth metal, or any combination thereof.

The alkali metal-containing compound may include alkali metal oxides such as $Li_2O$, $Cs_2O$, or $K_2O$, and alkali metal halides such as LiF, NaF, CsF, KF, LiI, NaI, CsI, KI, or any combination thereof. The alkaline earth metal-containing compound may include an alkaline earth metal compound, such as BaO, SrO, CaO, $Ba_xSr_{1-x}O$ (x is a real number satisfying the condition of 0<x<1), $Ba_xCa_{1-x}O$ (x is a real number satisfying the condition of 0<x<1), and the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include a lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In one or more embodiments, the electron injection layer may consist of i) an alkali metal-containing compound (for example, an alkali metal halide), ii) a) an alkali metal-containing compound (for example, an alkali metal halide); and b) an alkali metal, an alkaline earth metal, a rare earth metal, or any combination thereof. In one or more embodiments, the electron injection layer may be a KI:Yb co-deposited layer, an RbI:Yb co-deposited layer, and the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

The thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

Second Electrode 150

The second electrode 150 may be located on the interlayer 130. In an embodiment, the second electrode 150 may be a cathode that is an electron injection electrode. In this embodiment, a material for forming the second electrode 150 may be a material having a low work function, for example, a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), an ITO, an IZO, or any combination thereof. The second electrode 150 may be a transmissive electrode, a semi-transmissive electrode, or a reflective electrode. The second electrode 150 may have a single-layered structure, or a multi-layered structure including two or more layers.

Capping Layer

A first capping layer may be located outside the first electrode 110, and/or a second capping layer may be located outside the second electrode 150. In detail, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer of the interlayer 130 of the light-emitting device 10 may be extracted toward the outside through the first electrode 110, which may be a semi-transmissive electrode or a transmissive electrode, and the first capping layer or light generated in an emission layer of the interlayer 130 of the light-emitting device 10 may be extracted toward the outside through the second electrode 150, which is a semi-transmissive electrode or a transmissive electrode, and the second capping layer.

Although not wanting to be bound by theory, the first capping layer and the second capping layer may increase external emission efficiency according to the principle of constructive interference. Accordingly, the light extraction efficiency of the light-emitting device 10 is increased, thus improving the luminescence efficiency of the light-emitting device 10.

Each of the first capping layer and second capping layer may include a material having a refractive index of about 1.6 or higher (at 589 nm). The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may be optionally substituted with a substituent including O, N, S, Se, Si, F, Cl, Br, I, or any combination thereof. In one or more embodiments, at least one of the first capping layer and the second capping layer may each independently include an amine group-containing compound.

In one or more embodiments, at least one of the first capping layer and the second capping layer may each independently include the compound represented by Formula 201, the compound represented by Formula 202, or any combination thereof. In one or more embodiments, at least one of the first capping layer and the second capping layer may each independently include one of Compounds HT28 to HT33, one of Compounds CP1 to CP6, β-N4,N4'-di(naphthalen-2-yl)-N4,N4'-diphenyl[1,1'-biphenyl]-4,4'-diamine (NPB), or any combination thereof:

CP1
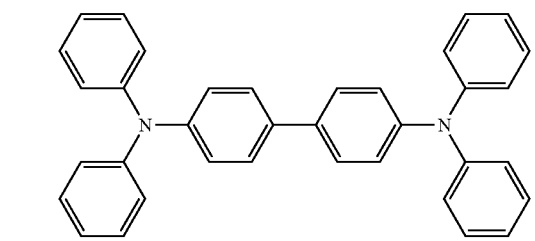

CP2
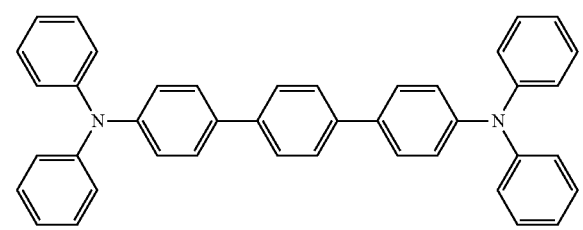

CP3

CP4
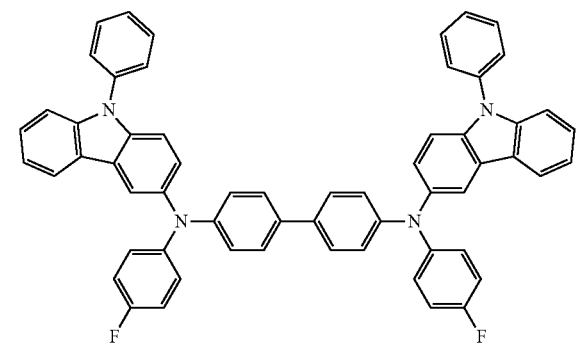

CP5
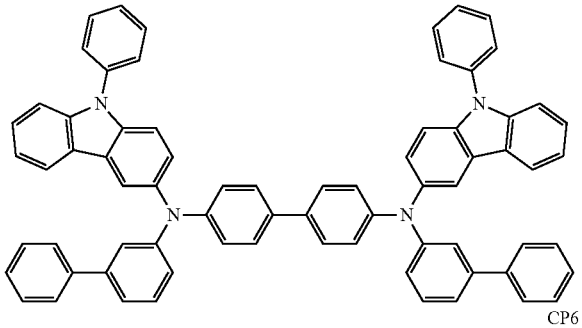

CP6
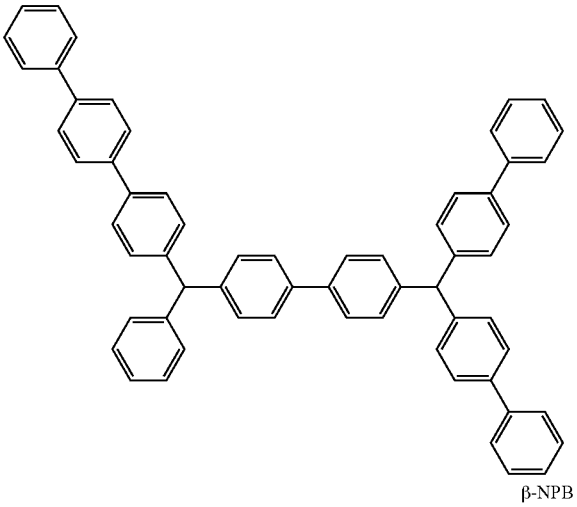

β-NPB

Electronic Apparatus

The light-emitting device 10 may be included in various electronic apparatuses. In one or more embodiments, the electronic apparatus including the light-emitting device 10 may be a light-emitting apparatus, an authentication apparatus, or the like.

The electronic apparatus (for example, light-emitting apparatus) may further include, in addition to the light-emitting device 10, i) a color filter, ii) a color conversion layer, or iii) a color filter and a color conversion layer. The color filter and/or the color conversion layer may be located in at least one traveling direction of light emitted from the light-emitting device 10. For example, the light emitted from the light-emitting device 10 may be blue light. The light-emitting device 10 may be the same as described above. In one or more embodiments, the color conversion layer may include quantum dots. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas. A pixel-defining film may be located among the subpixel areas to define each of the subpixel areas. The color filter may further include a plurality of color filter areas and light-shielding patterns located among the color filter areas, and the color conversion layer may include a plurality of color conversion areas and light-shielding patterns located among the color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. In one or more embodiments, the first color light may be red light, the second color light may be green light, and the third color light may be blue light. In one or more embodiments, the color filter areas (or the color conversion areas) may include quantum dots. In detail, the first area may include a red quantum dot, the second area may include a green quantum dot, and the third area may not include a quantum dot. The quantum dot is the same as described herein. The first area, the second area, and/or the third area may each include a scatterer.

In one or more embodiments, the light-emitting device 10 may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths. In detail, the first light may be blue light, the first first-color light may be red light, the second first-color light may be green light, and the third first-color light may be blue light.

The electronic apparatus may further include a thin-film transistor in addition to the light-emitting device 10 as described above. The thin-film transistor may include a source electrode, a drain electrode, and an activation layer, wherein any one of the source electrode and the drain electrode may be electrically connected to any one of the first electrode and the second electrode of the light-emitting device 10.

The thin-film transistor may further include a gate electrode, a gate insulating film, etc. The activation layer may include a crystalline silicon, an amorphous silicon, an organic semiconductor, an oxide semiconductor, or the like.

The electronic apparatus may further include a sealing portion for sealing the light-emitting device 10. The sealing portion and/or the color conversion layer may be placed between the color filter and the light-emitting device 10. The sealing portion allows light from the light-emitting device 10 to be extracted to the outside, while simultaneously preventing ambient air and moisture from penetrating into the light-emitting device 10. The sealing portion may be a sealing substrate including a transparent glass substrate or a plastic substrate. The sealing portion may be a thin-film encapsulation layer including at least one layer of an organic layer and/or an inorganic layer. When the sealing portion is a thin film encapsulation layer, the electronic apparatus may be flexible.

Various functional layers may be additionally located on the sealing portion, in addition to the color filter and/or the color conversion layer, according to the use of the electronic apparatus. The functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.). The authentication apparatus may further include, in addition to the light-emitting device 10, a biometric information collector.

The electronic apparatus may take the form of or be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
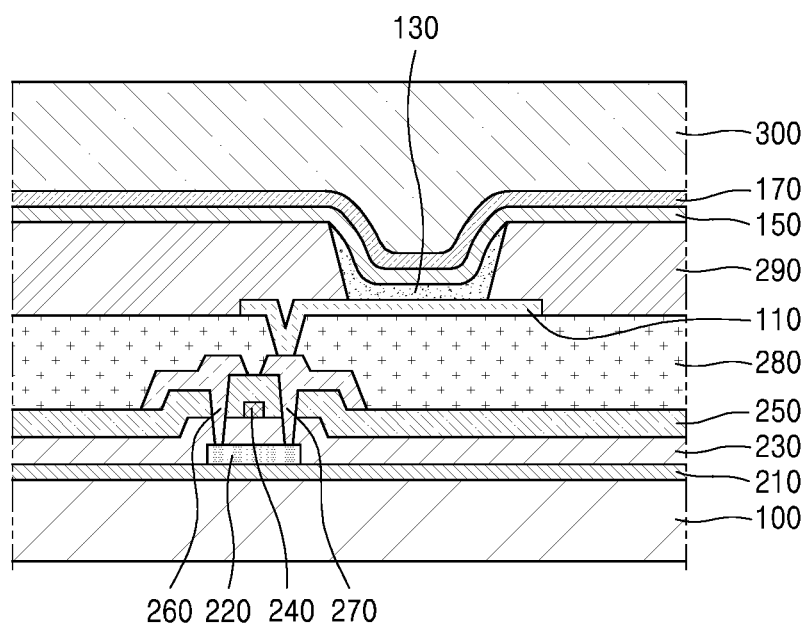
FIG. 2 is a schematic cross-sectional view of an embodiment of a light-emitting apparatus including a light-emitting device constructed according to the principles of the invention.
Figure 3:
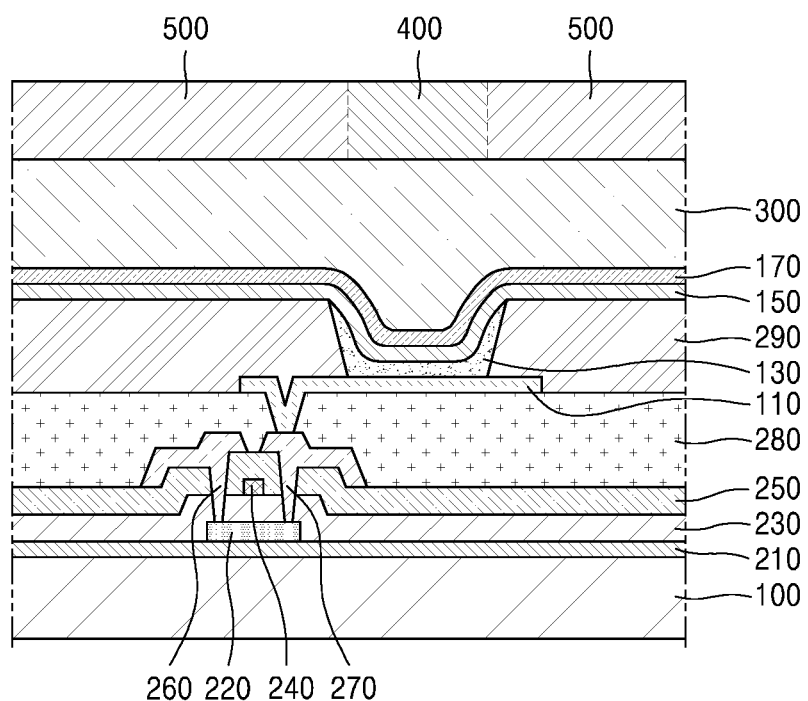
FIG. 3 is a schematic cross-sectional view of another embodiment of a light-emitting apparatus including a light-emitting device constructed according to the principles of the invention.

Descriptions of FIGS. 2 and 3

FIG. 2 is a cross-sectional view showing a light-emitting apparatus according to an embodiment of the present disclosure.

The light-emitting apparatus 180 of FIG. 2 includes a substrate 100, a thin-film transistor (TFT) 200, a light-emitting device 10, and an encapsulation portion 300 that seals the light-emitting device 10.

The substrate 100 may be a flexible substrate, a glass substrate, or a metal substrate. A buffer layer 210 may be formed on the substrate 100. The buffer layer 210 may prevent penetration of impurities through the substrate 100 and may provide a substantially flat surface on the substrate 100.

The TFT 200 may be located on the buffer layer 210. The TFT 200 may include an activation layer 220, a gate electrode 240, a source electrode 260, and a drain electrode 270. The activation layer 220 may include an inorganic semiconductor such as silicon or a polysilicon, an organic semiconductor, or an oxide semiconductor, and may include a source region, a drain region and a channel region.

A gate insulating film 230 for insulating the activation layer 220 from the gate electrode 240 may be located on the activation layer 220, and the gate electrode 240 may be located on the gate insulating film 230. An interlayer insulating film 250 may be located on the gate electrode 240. The interlayer insulating film 250 may be between the gate electrode 240 and the source electrode 260 and between the gate electrode 240 and the drain electrode 270 to provide insulation therebetween.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be in contact with the exposed portions of the source region and the drain region of the activation layer 220.

The TFT 200 is electrically connected to a light-emitting device 10 to drive the light-emitting device 10, and is covered by a passivation layer 280. The passivation layer 280 may include an inorganic insulating film, an organic insulating film, or any combination thereof. A light-emitting device 10 is provided on the passivation layer 280. The light-emitting device 10 may include a first electrode 110, an interlayer 130, and a second electrode 150.

The first electrode 110 may be formed on the passivation layer 280. The passivation layer 280 may not completely cover the drain electrode 270 and expose a portion of the drain electrode 270, and the first electrode 110 may be connected to the exposed portion of the drain electrode 270.

A pixel defining layer 290 including an insulating material may be located on the first electrode 110. The pixel defining layer 290 may expose a region of the first electrode 110, and an interlayer 130 may be formed in the exposed region of the first electrode 110. The pixel defining layer 290 may be a polyimide or a polyacrylic organic film. At least some layers of the interlayer 130 may extend beyond the upper portion of the pixel defining layer 290 to be located in the form of a common layer. The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device 10 to protect the light-emitting device 10 from moisture or oxygen. The encapsulation portion 300 may include: an inorganic film including a silicon nitride ($SiN_x$), a silicon oxide ($SiO_x$), an indium tin oxide, an indium zinc oxide, or any combination thereof; an organic film including a polyethylene terephthalate, a polyethylene naphthalate, a polycarbonate, a polyimide, a polyethylene sulfonate, a polyoxymethylene, a polyarylate, a hexamethyldisiloxane, an acrylic resin (for example, a polymethyl methacrylate, a polyacrylic acid, or the like), an epoxy-based resin (for example, an aliphatic glycidyl ether (AGE), or the like), or any combination thereof; or any combination of the inorganic film and the organic film.

FIG. 3 is a schematic cross-sectional view of another embodiment of a light-emitting apparatus including a light-emitting device constructed according to the principles of the invention.

The light-emitting apparatus 190 of FIG. 3 may be substantially identical to the light-emitting apparatus 180 of FIG. 2, except that a light-shielding pattern 500 and a functional region 400 are additionally located on the encapsulation portion 300. The functional region 400 may be a combination of i) a color filter area, ii) a color conversion area, or iii) a combination of the color filter area and the color conversion area. In one or more embodiments, the light-emitting device 10 included in the light-emitting apparatus 190 of FIG. 3 may be a tandem light-emitting device 10.

Manufacturing Method

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed. When layers constituting the hole transport region, the emission layer, and layers constituting the electron transport region are formed by spin coating, the spin coating may be performed at a coating speed of about 2,000 rpm to about 5,000 rpm and at a heat treatment temperature of about 80° C. to 200° C. by taking into account a material to be included in a layer to be formed and the structure of a layer to be formed.

Definition of Terms

As used herein, the term "energy level" may be expressed in "electron volt" and both energy level and electron volt may be, independently, abbreviated as "eV".

As used herein, the term "atom" may mean an element or its corresponding radical bonded to one or more other atoms.

The terms "hydrogen" and "deuterium" refer to their respective atoms and corresponding radicals with the deuterium radical abbreviated "-D", and the terms "—F, —Cl, —Br, and —I" are radicals of, respectively, fluorine, chlorine, bromine, and iodine.

As used herein, a substituent for a monovalent group, e.g., alkyl, may also be, independently, a substituent for a corresponding divalent group, e.g., alkylene.

The term "interlayer" as used herein refers to a single layer and/or all of a plurality of layers located between a first electrode and a second electrode of a light-emitting device.

As used herein, a quantum dot refers to a crystal of a semiconductor compound, and may include any material capable of emitting light of various emission wavelengths according to the size of the crystal.

The term "$C_3$-$C_{60}$ carbocyclic group" as used herein refers to a cyclic group consisting of carbon only as a ring-forming atom and having three to sixty carbon atoms, and the term "$C_1$-$C_{60}$ heterocyclic group" as used herein refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are fused with each other. For example, the $C_1$-$C_{60}$ heterocyclic group has 3 to 61 ring-forming atoms.

The "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

For example, the $C_3$-$C_{60}$ carbocyclic group may be i) a group T1 or ii) a fused cyclic group in which at least two groups T1 are fused, for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group.

The $C_1$-$C_{60}$ heterocyclic group may be i) a group T2, ii) a fused cyclic group in which at least two groups T2 are fused, or iii) a fused cyclic group in which at least one group T2 and at least one group T1 are fused, for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like.

The π electron-rich $C_3$-$C_{60}$ cyclic group may be i) a group T1, ii) a fused cyclic group in which at least two groups T1 are fused with each other, iii) a group T3, iv) a fused cyclic group in which at least two groups T3 are fused, or v) a fused cyclic group in which at least one group T3 and at least one group T1 are fused, for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, and the like.

The π electron-deficient nitrogen-containing $C_1$-$C_{60}$ cyclic group may be i) a group T4, ii) a fused cyclic group in which at least two groups T4 are fused with each other, iii) a fused cyclic group in which at least one group T4 and at least one group T1 are fused with each other, iv) a fused cyclic group in which at least one group T4 and at least one group T3 are fused with each other, or v) a fused cyclic group in which at least one group T4, at least one group T1, and at least one group T3 are fused with one another, for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.

The group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group.

The group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group.

The group T3 may be a furan group, a thiophene group, a 1H-pyrrole group, a silole group, or a borole group.

The group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as used herein refer to a group fused with any cyclic group, a monovalent group, or a polyvalent group (for example, a divalent group, a trivalent group, a tetravalent group, etc.), depending on the structure of a formula in connection with which the terms are used. In one or more embodiments, "a benzene group" may be a benzo group, a phenyl group, a phenylene group, or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ eterocycloalkyl group, a $C_3$-$C_{10}$ cycloalkenyl group, a $C_1$-$C_1$ heterocycloalkenyl group, a $C_6$-$C_{60}$ aryl group, a $C_1$-$C_{60}$ heteroaryl group, a monovalent non-aromatic fused polycyclic group, and a monovalent non-aromatic fused heteropolycyclic group, and examples of the divalent $C_3$-$C_{60}$ carbocyclic group and the monovalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic fused polycyclic group, and a substituted or unsubstituted divalent non-aromatic fused heteropolycyclic group.

The term "$C_1$-$C_{60}$ alkyl group" as used herein refers to a linear or branched aliphatic hydrocarbon monovalent group that has one to sixty carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an iso-nonyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having a structure corresponding to the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and examples thereof are an ethenyl group, a propenyl group, and a butenyl group. The term "$C_2$-$C_{60}$ alkenylene group" as used herein refers to a divalent group having a structure corresponding to the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having a structure corresponding to the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having a structure corresponding to the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof are a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having a structure corresponding to the $C_1$-$C_{10}$ heterocycloalkyl group.

The term $C_3$-$C_{10}$ cycloalkenyl group used herein refers to a monovalent cyclic group that has three to ten carbon atoms and at least one carbon-carbon double bond in the ring thereof and no aromaticity, and examples thereof are a cyclopentenyl group, a cyclohexenyl group, and a cycloheptenyl group. The term "$C_3$-$C_{10}$ cycloalkenylene group" as used herein refers to a divalent group having a structure corresponding to the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having a structure corresponding to the $C_1$-$C_{10}$ heterocycloalkenyl group.

The term "$C_6$-$C_{60}$ aryl group" as used herein refers to a monovalent group having a carbocyclic aromatic system having six to sixty carbon atoms, and the term "$C_6$-$C_{60}$ arylene group" as used herein refers to a divalent group having a carbocyclic aromatic system having six to sixty carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be fused with each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be fused with each other.

The term "monovalent non-aromatic fused polycyclic group" as used herein refers to a monovalent group (for example, having 8 to 60 carbon atoms) having two or more rings fused with each other, only carbon atoms as ring-forming atoms, and no aromaticity in its entire molecular structure. Examples of the monovalent non-aromatic fused polycyclic group are an indenyl group, a fluorenyl group, a spiro-bifluorenyl group, a benzofluorenyl group, an indenophenanthrenyl group, and an indeno anthracenyl group. The term "divalent non-aromatic fused polycyclic group" as used herein refers to a divalent group having a structure corresponding to a monovalent non-aromatic fused polycyclic group.

The term "monovalent non-aromatic fused heteropolycyclic group" as used herein refers to a monovalent group (for example, having 1 to 60 carbon atoms) having two or more rings fused with each other, at least one heteroatom other than carbon atoms, as a ring-forming atom, and no aromaticity in its entire molecular structure. Examples of the monovalent non-aromatic fused heteropolycyclic group are a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic fused heteropolycyclic group" as used herein refers to a divalent group having a structure corresponding to a monovalent non-aromatic fused heteropolycyclic group.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "$C_7$-$C_{60}$ aryl alkyl group" used herein refers to -$A_{104}A_{105}$ (where $A_{104}$ may be a $C_1$-$C_{54}$ alkylene group, and $A_{105}$ may be a $C_6$-$C_{59}$ aryl group), and the term $C_2$-$C_{60}$ heteroaryl alkyl group" used herein refers to -$A_{106}A_{107}$ (where $A_{106}$ may be a $C_1$-$C_{59}$ alkylene group, and $A_{107}$ may be a $C_1$-$C_{59}$ heteroaryl group).

The term "$R_{10a}$" as used herein refers to:
deuterium (-D), —F, —Cl, —Br, —I, a hydroxyl group, a cyano group, or a nitro group,
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof,
a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or
—$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

The variables $Q_1$ to $Q_3$, $Q_{11}$ to $Q_{13}$, $Q_{21}$ to $Q_{23}$, and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ arylalkyl group; or a $C_2$-$C_{60}$ heteroarylalkyl group.

The term "heteroatom" as used herein refers to any atom other than a carbon atom. Examples of the heteroatom are O, S, N, P, Si, B, Ge, Se, and any combination thereof.

The term "the third-row transition metal" used herein includes hafnium (Hf), tantalum (Ta), tungsten (W), rhenium (Re), osmium (Os), iridium (Ir), platinum (Pt), gold (Au), and the like.

As used herein, the term "Ph" refers to a phenyl group, the term "Me" refers to a methyl group, the term "Et" refers to an ethyl group, the term "ter-Bu" or "Bu$^t$" refers to a tert-butyl group, and the term "OMe" refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

The maximum number of carbon atoms in this substituent definition section is an example only. In an embodiment, the maximum carbon number of 60 in the $C_1$-$C_{60}$ alkyl group is an example, and the definition of the alkyl group equally applies to a $C_1$-$C_{20}$ alkyl group. The same also applies to other cases.

The symbols * and *' as used herein, unless defined otherwise, each refer to a binding site to a neighboring atom in a corresponding formula.

Hereinafter, a compound made according to the principles and embodiments and a light-emitting device including the compound made according to embodiments will be described in detail with reference to Examples.

EXAMPLES

Manufacture of Light-Emitting Device

Comparative Example 1

As an anode, a glass substrate with 15 Ωcm$^2$ (1,200 Å) ITO thereon, which was manufactured by Corning Inc., was cut to a size of 50 mm×50 mm×0.7 mm, and the glass substrate was sonicated by using isopropyl alcohol and pure water for 5 minutes each, and then ultraviolet (UV) light was irradiated for 30 minutes thereto and ozone was exposed thereto for cleaning. Then, the resultant glass substrate was loaded onto a vacuum deposition apparatus.

The compounds HT1 and p-dopant 1,4,5,8,9,11-hexaazatriphenylene-hexacarbonitrile (HAT-CN) at (5%) were deposited on the substrate to form a hole injection layer having a thickness of 150 Å. Subsequently, the compound HT1 was vacuum-deposited thereon to form a hole transport layer having a thickness of 200 Å.

On the hole transport layer, Compound 100 as a host and fluorescent dopant Compound 200 as a dopant were co-deposited to a weight ratio of 97:3 to form an emission layer having a thickness of 100 Å.

The compound 2,4,6-tris(3-phenylphenyl)-1,3,5-triazine (T2T) was vacuum-deposited on the emission layer to form a hole blocking layer having a thickness of 100 Å. TPM-TAZ and Liq were deposited on the hole blocking layer to a weight ratio of 5:5 to form an electron transport layer having a thickness of 300 Å.

Yb was vacuum-deposited on the electron transport layer to form a layer having a thickness of 10 Å, AgMg was vacuum-deposited thereon to form a cathode having a thickness of 100 Å, and CPL was deposited thereon to form a capping layer having a thickness of 700 Å, thereby manufacturing a light-emitting device.

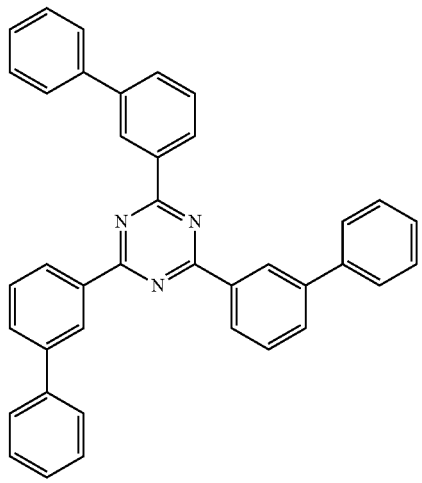

T2T

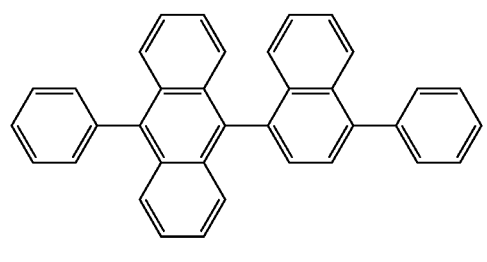

100

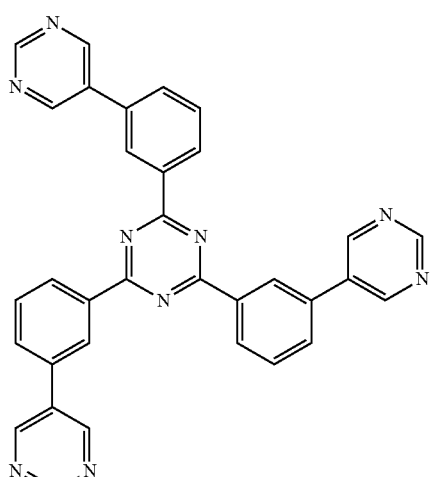

TPM-TAZ

200

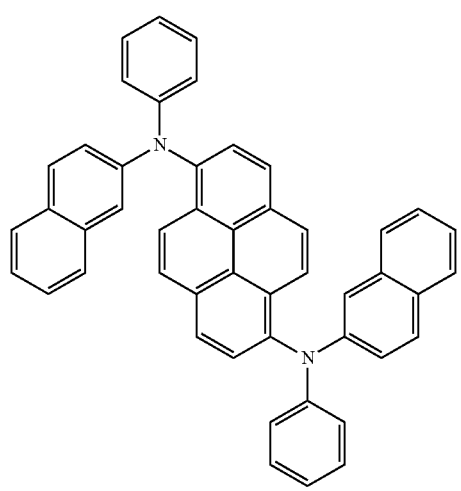

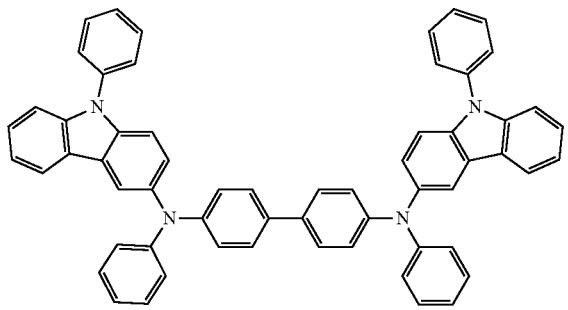

CPL

-continued

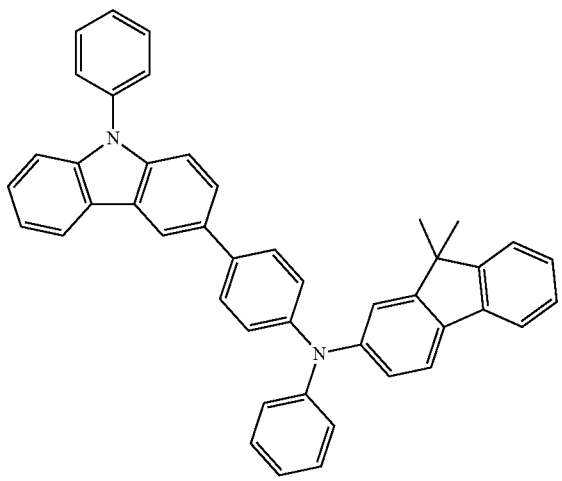

HT1

Comparative Example 2

Light-emitting devices were manufactured in the same manner as in Comparative Example 1, except that, as a hole injection layer, only $Cs_3Cu_2I_5$ was used instead of the compound HT1 and p-dopant HAT-CN (5%).

Example 1

Light-emitting devices were manufactured in the same manner as in Comparative Example 1, except that, as a hole injection layer, HT1 and $Cs_3Cu_2I_5$ (5%) were used.

The work function value of ITO was −5.9 eV, and the valence band energy level of $Cs_3Cu_2I_5$ was −6.0 eV.

The permittivity of $Cs_3Cu_2I_5$ was 32.5 F/m.

To evaluate luminescence characteristics of the light-emitting devices manufactured according to Comparative Examples 1 and 2 and Example 1, the voltage at the current density of 10 mA/cm², efficiency, and lifespan thereof were measured.

The efficiency, etc. of the light-emitting devices were measured using measurement device C9920-2-12 of Hamamatsu Photonics Inc.

The results are shown in Table 1 below.

TABLE 1

| | Driving voltage (V) @10 mA | Efficiency (Cd/A) | Color coordinates (B y) | Lifespan@400nit (~97%) | ΔV (@500 hr) |
|---|---|---|---|---|---|
| Comparative Example 1 | 11.3 | 22.1 | 0.125 | 450 hr | 1 V |
| Comparative Example 2 | 11.0 | 22.9 | 0.125 | 470 hr | 0.7 V |
| Example 1 | 10.5 | 24.5 | 0.125 | 550 hr | 0.2 V |

(ΔV indicates the change in voltage after 500 hours)

Table 1 shows that the light-emitting device according to Example 1 as described herein has better performance than that of the light-emitting devices of Comparative Examples 1 and 2. Specifically, the light-emitting device of Example 1, which includes a layer doped with a non-lead-based perovskite compound, shows significantly and unexpectedly improved efficiency and lifespan compared to the Comparative Examples 1 and 2.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light-emitting device comprising:
a first electrode;
a second electrode facing the first electrode; and
an interlayer located between the first electrode and the second electrode and including an emission layer, wherein
an energy level of a valence band of the non-lead-based perovskite compound is about −6.0 eV to about −6.3 eV,
the first electrode has a work function value of −5.9 eV to about −6.1 eV, and
the interlayer includes a layer doped with a non-lead-based perovskite compound.

2. The light-emitting device of claim 1, wherein the first electrode comprises an anode,
the second electrode comprises a cathode, and
the light-emitting device further includes a hole transport region between the first electrode and the emission layer and includes a hole injection layer, a hole transport layer, an electron blocking layer, or any combination thereof.

3. The light-emitting device of claim 2, wherein the hole transport region includes the layer doped with the non-lead-based perovskite compound.

4. The light-emitting device of claim 2, wherein at least one of the hole injection layer and hole transport layer includes the layer doped with the non-lead-based perovskite compound.

5. The light-emitting device of claim 1, wherein the first electrode comprises an anode,
the second electrode comprises a cathode, and
the light-emitting device further includes an electron transport region between the second electrode and the emission layer and includes a hole blocking layer, an electron transport layer, an electron injection layer, or any combination thereof.

6. The light-emitting device of claim 5, wherein the electron transport region comprises a metal-containing material.

7. The light-emitting device of claim 1, wherein a permittivity of the non-lead-based perovskite compound is about 30 F/m or more.

8. The light-emitting device of claim 1, wherein the first electrode comprises an indium tin oxide, an indium zinc oxide, a tin oxide, a zinc oxide, or any combination thereof.

9. The light-emitting device of claim 1, wherein the non-lead-based perovskite compound is of Formula 1:

$$A_a Z \qquad \text{Formula 1}$$

wherein in Formula 1, A is a cation of an alkali metal, Z is an anion, and
a is an integer of 1, 2, or 3.

10. The light-emitting device of claim 9, wherein
a is 3 and Z is $B_2X_5^{-3}$,
a is 2 and Z is $BX_3^{-2}$, or
a is 1 and Z is $B_2X_3^{-1}$, wherein
A is the cation of the alkali metal, B is Cu, Ag, or any combination thereof,
and X is F, Cl, Br, I, or any combination thereof.

11. The light-emitting device of claim 9, wherein
a is 3 and Z is $BX_5^{-3}$,
a is 2 and Z is $BX_4^{-2}$, or
a is 1 and Z is $B_2X_5^{-1}$, wherein
A is the cation of the alkali metal, B is Mn, Tl, Zn, Ni, Ce, Pr, Nd, Pm, Sm, Eu, Gd, Tb, Dy, Ho, Er, Tm, Yb, Lu, or any combination thereof, and X is F, Cl, Br, I, or any combination thereof.

12. The light-emitting device of claim 9, wherein
a is 3 and Z is $BX_6^{-3}$, or
a is 2 and Z is $BX_5^{-2}$, wherein
A is the cation of the alkali metal, B is In, Sb, Bi, Ce, Pr, Nd, Pm, Sm, Eu, Gd, Tb, Dy, Ho, Er, Tm, Yb, Lu, or any combination thereof, and X is F, Cl, Br, I, or any combination thereof.

13. The light-emitting device of claim 9, wherein the alkali metal is Li, Na, K, Rb, Cs, Fr, or any combination thereof.

14. The light-emitting device of claim 1, wherein the first electrode comprises an anode,
the second electrode comprises a cathode,
the interlayer includes a hole injection layer and a hole transport layer,
the hole injection layer includes the layer doped with the non-lead-based perovskite compound, and
the hole injection layer and the hole transport layer include a same compound.

15. The light-emitting device of claim 1, wherein the layer doped with the non-lead-based perovskite compound has a thickness of about 1 Å to about 10,000 Å.

16. The light-emitting device of claim 1, wherein, in the layer doped with the non-lead-based perovskite compound, the non-lead-based perovskite compound has a doping concentration of about 1 wt % to about 99 wt %.

17. An electronic apparatus comprising the light-emitting device of claim 1.

18. The electronic apparatus of claim 17, further comprising a thin-film transistor, wherein
the thin-film transistor includes a source electrode and a drain electrode, and
the first electrode of the light-emitting device is electrically connected to at least one of the source electrode and the drain electrode of the thin-film transistor.

19. The electronic apparatus of claim 17, further comprising a color filter, a color conversion layer, a touch screen layer, a polarizing layer, or any combination thereof.

* * * * *